United States Patent
Harris et al.

(10) Patent No.: US 11,862,774 B2
(45) Date of Patent: Jan. 2, 2024

(54) SYSTEMS AND METHODS FOR BATTERY STRUCTURE, INTERCONNECTS, SENSING, AND BALANCING

(71) Applicant: ROMEO SYSTEMS TECHNOLOGY, LLC, Cypress, CA (US)

(72) Inventors: W. Porter Harris, Pasadena, CA (US); Kenneth Kawanishi, Whittier, CA (US); W. Hunter Greene, Madison, GA (US); Robert Wesley Thibault, Santa Monica, CA (US); Arun Gunasekaran, Los Angeles, CA (US)

(73) Assignee: MULLEN AUTOMOTIVE, INC., Brea, CA (US)

( * ) Notice: Subject to any disclaimer, the term of this patent is extended or adjusted under 35 U.S.C. 154(b) by 0 days.

(21) Appl. No.: 17/966,641

(22) Filed: Oct. 14, 2022

(65) Prior Publication Data
US 2023/0033985 A1    Feb. 2, 2023

Related U.S. Application Data

(63) Continuation of application No. 16/925,589, filed on Jul. 10, 2020, now Pat. No. 11,509,022, which is a continuation of application No. 15/857,949, filed on Dec. 29, 2017, now Pat. No. 10,720,626.

(60) Provisional application No. 62/440,102, filed on Dec. 29, 2016.

(51) Int. Cl.
| | |
|---|---|
| *H01M 10/48* | (2006.01) |
| *H01M 50/583* | (2021.01) |
| *H01M 50/503* | (2021.01) |
| *H01M 50/502* | (2021.01) |
| *H01M 50/213* | (2021.01) |

(Continued)

(52) U.S. Cl.
CPC ....... *H01M 10/482* (2013.01); *H01M 10/486* (2013.01); *H01M 50/502* (2021.01); *H01M 50/503* (2021.01); *H01M 50/51* (2021.01); *H01M 50/516* (2021.01); *H01M 50/583* (2021.01); *H01M 50/213* (2021.01)

(58) Field of Classification Search
CPC .......................................... H01M 50/502–526
See application file for complete search history.

(56) References Cited

U.S. PATENT DOCUMENTS

| | | |
|---|---|---|
| 8,852,772 B2 | 10/2014 | McDonald |
| 9,147,875 B1 | 9/2015 | Coakley |
| 10,720,262 B2 | 7/2020 | Bains et al. |

(Continued)

FOREIGN PATENT DOCUMENTS

| | | |
|---|---|---|
| CN | 105990620 | 10/2016 |
| CN | 106169546 | 11/2016 |

(Continued)

OTHER PUBLICATIONS

PCT; International Search Report dated Apr. 27, 2018 in the International Application No. PCT/US2017/068960.

(Continued)

*Primary Examiner* — Jonathan Crepeau
(74) *Attorney, Agent, or Firm* — VAN COURT & ALDRIDGE LLP

(57) ABSTRACT

Exemplary systems and methods enable efficient and reliable positioning, assembly, retention, interconnection, and management of battery cells in battery packs, for example battery packs utilized in electric vehicles.

14 Claims, 66 Drawing Sheets

(51) Int. Cl.
*H01M 50/516* (2021.01)
*H01M 50/51* (2021.01)

(56) References Cited

U.S. PATENT DOCUMENTS

| | | | |
|---|---|---|---|
| 2006/0019155 | A1 | 1/2006 | Seman, Jr. |
| 2010/0075205 | A1 | 3/2010 | Kwag |
| 2011/0177387 | A1 | 7/2011 | Byun et al. |
| 2011/0223468 | A1 | 9/2011 | Ferber, Jr. |
| 2013/0130074 | A1 | 5/2013 | Timmons et al. |
| 2014/0212695 | A1 | 7/2014 | Lane |
| 2014/0255748 | A1 | 9/2014 | Jan |
| 2014/0335381 | A1 | 11/2014 | Krolak |
| 2015/0280295 | A1 | 10/2015 | Bhunia et al. |
| 2015/0325824 | A1 | 11/2015 | Hasegawa et al. |
| 2016/0073506 | A1 | 3/2016 | Coakley et al. |
| 2016/0315303 | A1 | 10/2016 | Eberhard |
| 2017/0005316 | A1 | 1/2017 | Faraday |
| 2017/0047574 | A1 | 2/2017 | Fees |
| 2017/0077487 | A1 | 3/2017 | Coakley et al. |
| 2017/0125773 | A1 | 5/2017 | Atieva |
| 2018/0145382 | A1 | 5/2018 | Harris et al. |
| 2018/0190960 | A1 | 7/2018 | Harris |
| 2018/0212222 | A1 | 7/2018 | Tesla |
| 2019/0280267 | A1 | 9/2019 | Bae et al. |

FOREIGN PATENT DOCUMENTS

| | | |
|---|---|---|
| CN | 110168769 | 8/2019 |
| EP | 3553845 | 10/2019 |
| JP | 2013525942 | 6/2014 |
| JP | 2015-053205 | 3/2015 |
| JP | 2015-099726 | 5/2015 |
| JP | 2015-144054 | 8/2015 |
| WO | 2018094187 | 5/2018 |
| WO | 2018126136 | 7/2018 |

OTHER PUBLICATIONS

PCT; Written Opinion of the International Searching Authority dated Apr. 27, 2018 in the International Application No. PCT/US2017/068960.
PCT; International Search Report dated May 9, 2018 in the International Application No. PCT/US2017/062253.
PCT; Written Opinion of the International Searching Authority dated May 9, 2018 in the International Application No. PCT/US2017/062253.
PCT; International Preliminary Report on Patentability dated Jul. 2, 2019 in the International Application No. PCT/US2017/068960.
PCT; International Preliminary Report on Patentability dated May 21, 2019 in the International Application No. PCT/US2017/062253.
USPTO; Non-Final Office Action in the U.S. Appl. No. 15/857,949 dated Feb. 13, 2020.
EP; Extended European Search Report in the European Application No. 17886018.5 dated Aug. 14, 2020.
CNIPA, CN Second Office Action dated Apr. 26, 2022 in Chinese Patent Application 201780081326.3.
JPO, Notice of Allowance dated May 31, 2022 in Japanese Patent Application No. 2019-535344.
JPO, Office Action dated Oct. 25, 2021 in Japanese Patent Application No. 2019-535344.
USPTO; Notice of Allowance in the U.S. Appl. No. 16/925,589 dated Aug. 3, 2022.
USPTO; Final Office Action in the U.S. Appl. No. 16/925,589 dated May 18, 2022.
USPTO; Non-Final Office Action in the U.S. Appl. No. 16/925,589 dated Sep. 13, 2021.
USPTO; Notice of Allowance in the U.S. Appl. No. 15/857,949 dated Mar. 16, 2020.
KIPO, Office Action in Korea Patent Application No. 10 2019 7021706 dated Oct. 6, 2022.
EPO, Examination Report dated Mar. 7, 2023 in EP Serial No. 17886018.5.

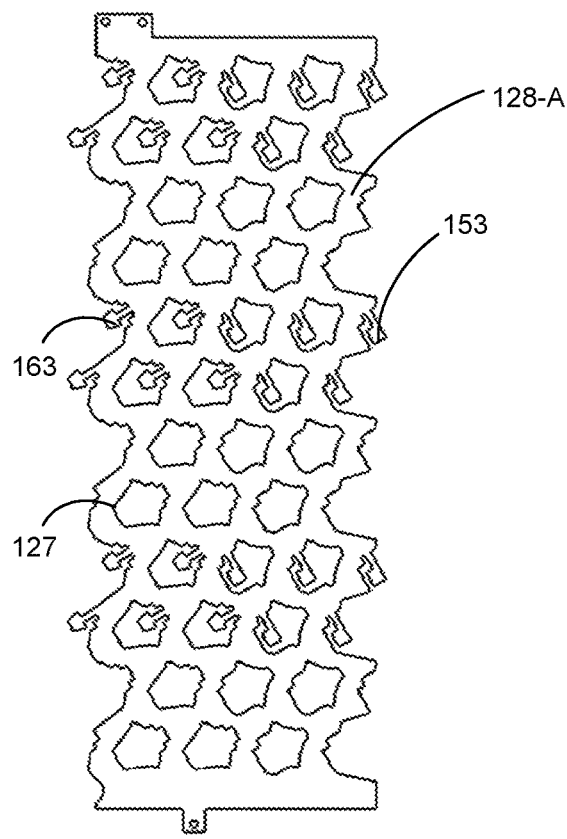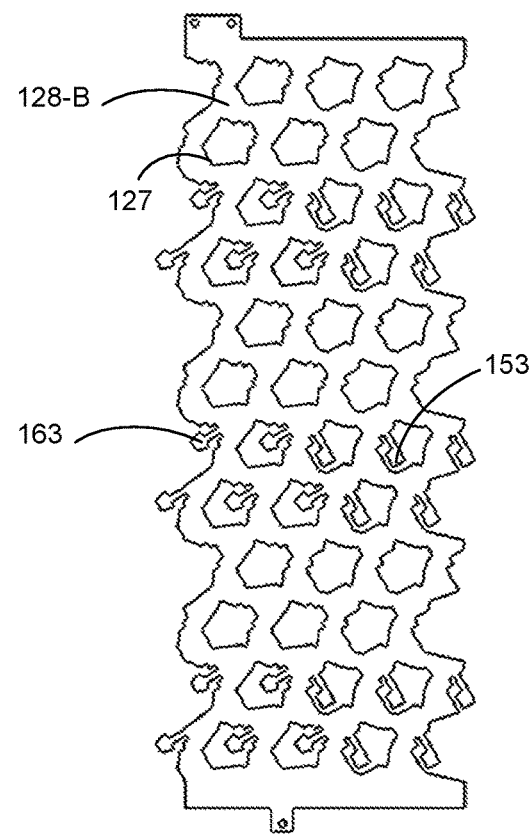
FIG. 13A
FIG. 13B

SYSTEMS AND METHODS FOR BATTERY STRUCTURE, INTERCONNECTS, SENSING, AND BALANCING

CROSS-REFERENCE TO RELATED APPLICATIONS

This application is a continuation of U.S. Ser. No. 16/925,589 filed on Jul. 10, 2020 and entitled "SYSTEMS AND METHODS FOR BATTERY STRUCTURE, INTERCONNECTS, SENSING, AND BALANCING." U.S. Ser. No. 16/925,589 claims priority to U.S. Ser. No. 15/857,949 filed on Dec. 29, 2017, now U.S. Pat. No. 10,720,626 entitled "SYSTEMS AND METHODS FOR BATTERY STRUCTURE, INTERCONNECTS, SENSING, AND BALANCING." U.S. Ser. No. 10/720,626 claims priority to, and the benefit of, U.S. Provisional Application Ser. No. 62/440,102 filed on Dec. 29, 2016, entitled "SYSTEMS AND METHODS FOR BATTERY STRUCTURE, INTERCONNECTS, SENSING, AND BALANCING". The entire contents of each of the foregoing application are hereby incorporated by reference for all purposes.

TECHNICAL FIELD

The present disclosure relates to battery interconnect systems and methods, and in particular to interconnect systems and methods for battery packs.

BACKGROUND

A battery pack contains a number of batteries (also referred to as cells). The cells are interconnected in parallel and/or series to achieve desired current and voltage performance for the battery pack. Often, a large number of cells are interconnected to obtain the desired power from the battery pack. Prior approaches to interconnecting the cells, particularly in vehicle applications, involve welding or soldering a first wire to the positive terminal and a second wire to the negative terminal of the cell. The other ends of these wires are connected to other wires or bus bars to combine the cells in parallel/series. However, these prior approaches are time consuming and subject to undesirable variability in manufacturing. Additionally, the use of wire harnesses for voltage sensing, temperature sensing, and cell balancing is often unreliable and a common point of failure. Accordingly, improved systems and methods for interconnecting cells of battery packs remain desirable.

SUMMARY

In an exemplary embodiment, an interconnect assembly for electrically connecting a plurality of cells of a battery pack comprises a first plate comprises a first window; a first tab associated with the first window, the first tab configured to connect the first plate to a first terminal of a cell of the plurality of cells of the battery pack; a second window; and a second plate parallel to and at least partially overlapping the first plate. The second plate comprises a third window aligned with the first window, wherein the first tab extends through the third window; a fourth window aligned with the second window; and a second tab associated with the fourth window, the second tab configured to connect the second plate to a second terminal of the cell. The first plate is physically separated from the second plate, the first plate is electrically connected to the second plate through at least one of the plurality of cells, the first terminal has a first polarity, and the second terminal has a second polarity.

In another exemplary embodiment, an electrical system comprises an interconnect assembly comprising a first plate and a second plate. The first plate comprises a first plate segment and a second plate segment, and the second plate comprises a third plate segment and a fourth plate segment. The electrical system further comprises a battery pack comprising a plurality of cells comprising a first group of cells, a second group of cells, and a third group of cells. The interconnect assembly is connected to a top portion of the plurality of cells, and each cell of the plurality of cells comprises a first terminal of a first polarity and a second terminal of a second polarity.

In yet another exemplary embodiment, an interconnect assembly for electrically connecting a plurality of cells of a battery pack, the plurality of cells comprising a first group of cells, a second group of cells, and a third group of cells, the interconnect assembly comprising a first plate and a second plate. The first plate forms a series connection between the first group of cells and the second group of cells. The second plate forms a series connection between the second group of cells and the third group of cells. The first plate and the second plate are electrically connected to the plurality of cells via tabs extending into windows in the respective plates.

The contents of this summary section are to be understood as a simplified introduction to the disclosure, and are not intended to be used to limit the scope of any claim.

BRIEF DESCRIPTION OF THE DRAWINGS

With reference to the following description, appended claims, and accompanying drawings:

FIG. 13A illustrates a conductive plate of an interconnect assembly making contact with cathodes of a first portion of a first parallel group of battery cells, and making contact with anodes of a first portion of a second parallel group of battery cells, in order to make a series connection therebetween, in accordance with an exemplary embodiment;

FIG. 13B illustrates a conductive plate of an interconnect assembly making contact with cathodes of a second portion of the first parallel group of battery cells seen in FIG. 13A, and making contact with anodes of a second portion of a second parallel group of battery cells seen in FIG. 13A, in order to make a series connection therebetween, in accordance with an exemplary embodiment;

FIG. 13C illustrates a conductive plate of an interconnect assembly making contact with cathodes of a first portion of a first parallel group of battery cells, and making contact with anodes of a first portion of a second parallel group of battery cells, in order to make a series connection therebetween, in accordance with an exemplary embodiment;

FIG. 13D illustrates a conductive plate of an interconnect assembly making contact with cathodes of a second portion of the first parallel group of battery cells seen in FIG. 13C, and making contact with anodes of a second portion of the second parallel group of battery cells seen in FIG. 13C, in order to make a series connection therebetween, in accordance with an exemplary embodiment;

DETAILED DESCRIPTION

Figure 1A:
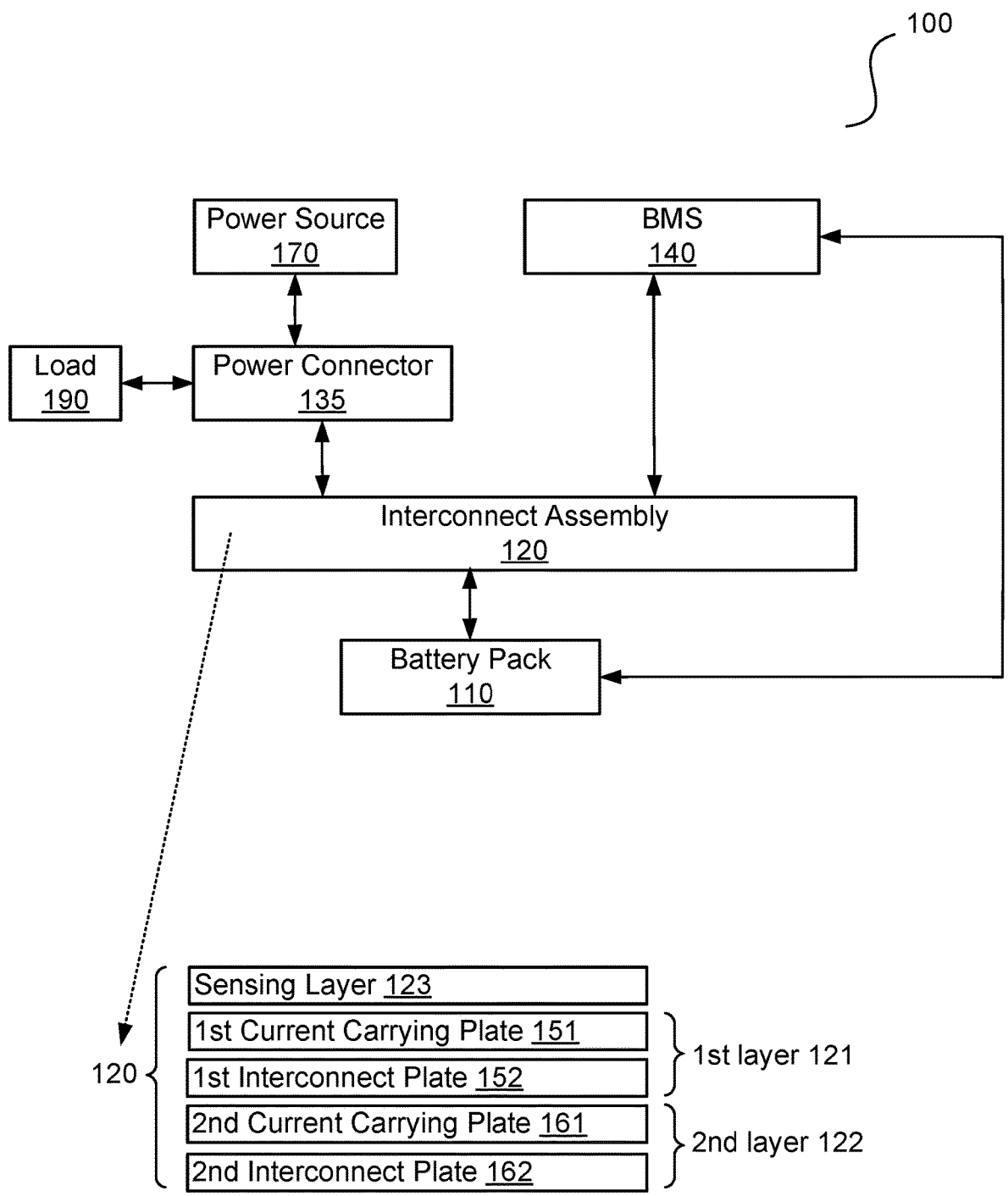
FIG. 1A illustrates an exemplary electrical system including an interconnect assembly and a battery pack, in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for battery pack construction, configuration, and use, as well as conventional techniques for wiring, interconnecting, operation, measurement, optimization, and/or control of battery cells, may not be described in detail herein. Furthermore, the connecting lines shown in various figures contained herein are intended to represent exemplary functional relationships, electrical connections/relationships, and/or physical couplings between various elements. It should be noted that many alternative or additional functional relationships or physical connections may be present in a practical system or related methods of use, for example an interconnect assembly for a battery pack for an electric vehicle.

Various shortcomings of prior battery interconnect systems can be addressed by utilizing battery packs, interconnect components, and related components configured in accordance with principles of the present disclosure. For example, prior interconnect systems typically involve connecting metal strips or wires to each cell. This approach is time consuming in manufacturing, and can introduce an unacceptable level of variability in the manufacturing process. Moreover, prior connection systems typically make use of wire harnesses for voltage and temperature measurement as well as cell balancing; manufacturing and assembly of such harnesses often introduces a higher failure rate, lowering overall reliability and longevity of the system.

In contrast, exemplary systems and methods disclosed herein enable improved battery cell interconnection in a battery pack by use of an interconnect assembly. The interconnect assembly may have a plurality of conductive layers, for example a first interconnect layer and a second interconnect layer oriented in parallel with the first interconnect layer. The two interconnect layers may be electrically isolated from each other at various points (for example, via one or more insulating layers), and electrically coupled to one another at various points, and may be overmolded to form a package. The interconnect layers may comprise a plurality of segments, which may be configured in an at least partially overlapping manner (for example, in a manner similar to a "running bond" style of overlapping bricks). The interconnect assembly is placed over a plurality of cells and tabs of the interconnect assembly are connected, respectively, to the positive and negative terminals of each cell. In some exemplary embodiments, the interconnect assembly is described as an overmolded package. In other exemplary embodiments, the interconnect assembly is described as a stack of current carrying plates (configured without overmolding).

Additionally, exemplary systems and methods disclosed herein hold and correctly locate battery cells in place (both prior to collection and thereafter) at the same end as the electrical connections on the cell. Moreover, the interconnect assembly, in an example embodiment, comprises a trace for sensing various conditions associated with the battery pack (e.g., thermal, voltage, and/or current sensing), and reporting sensed information to a battery management system. Moreover, the tabs may be configured to function as fuses to protect the cell and/or battery pack as a whole. Yet further, the interconnect assembly can provide electrical connections suitable for parallel cell balancing.

An interconnect system in accordance with principles of the present disclosure may be configured with any suitable components, structures, and/or elements in order to provide desired dimensional, mechanical, electrical, chemical, and/or thermal properties.

A "battery pack" as used herein describes a set of any number of battery cells, interconnected in series or parallel or a combination of series and parallel, to provide energy storage and/or electric power to a system as a single integrated unit. An example of a battery pack would be an electric vehicle lithium-ion battery pack, which can consist of thousands of cylindrical lithium ion battery cells.

A "battery cell" (or "cell") as used herein describes an electrochemical cell that is capable of generating electrical energy from a chemical reaction. Some battery cells can be rechargeable by introducing a current through the cell. Battery cells come in different types, such as lead-acid, nickel cadmium, nickel hydrogen, nickel metal hydride, lithium ion, or sodium nickel chloride (a.k.a. "zebra"), based on the chemical reaction used to generate the electric current. Because battery cells produce electricity based on a chemical reaction, the temperature of the cell can influence the efficiency at which the electricity is produced. Battery cells can also be fuel cells, such as hydrogen-oxide proton exchange membrane cells, phosphoric acid cells, or solid acid cells. Principles of the present disclosure may desirably be applied to a wide variety of battery cell types, and are not limited to a particular battery cell chemistry, size, or configuration.

Each battery cell may comprise a positive terminal and a negative terminal. In an example embodiment, the positive and negative terminals are located in close proximity to each other. For example, the positive terminal and negative terminal may be located on the same end (i.e., an end proximal to an interconnect assembly) of a battery cell. In one example embodiment, the positive pole (positive electrode or positive terminal) may be located at the top center of a cylindrical battery cell, and the negative pole (negative electrode or negative terminal) may be located on the top outside edge of the cell (also known as the "shoulder" of the cell) or outside "can" of the cell. Moreover, any suitable arrangement of the positive and negative terminals at or near the proximal end of the battery cell is contemplated in this disclosure.

Figure 1B:
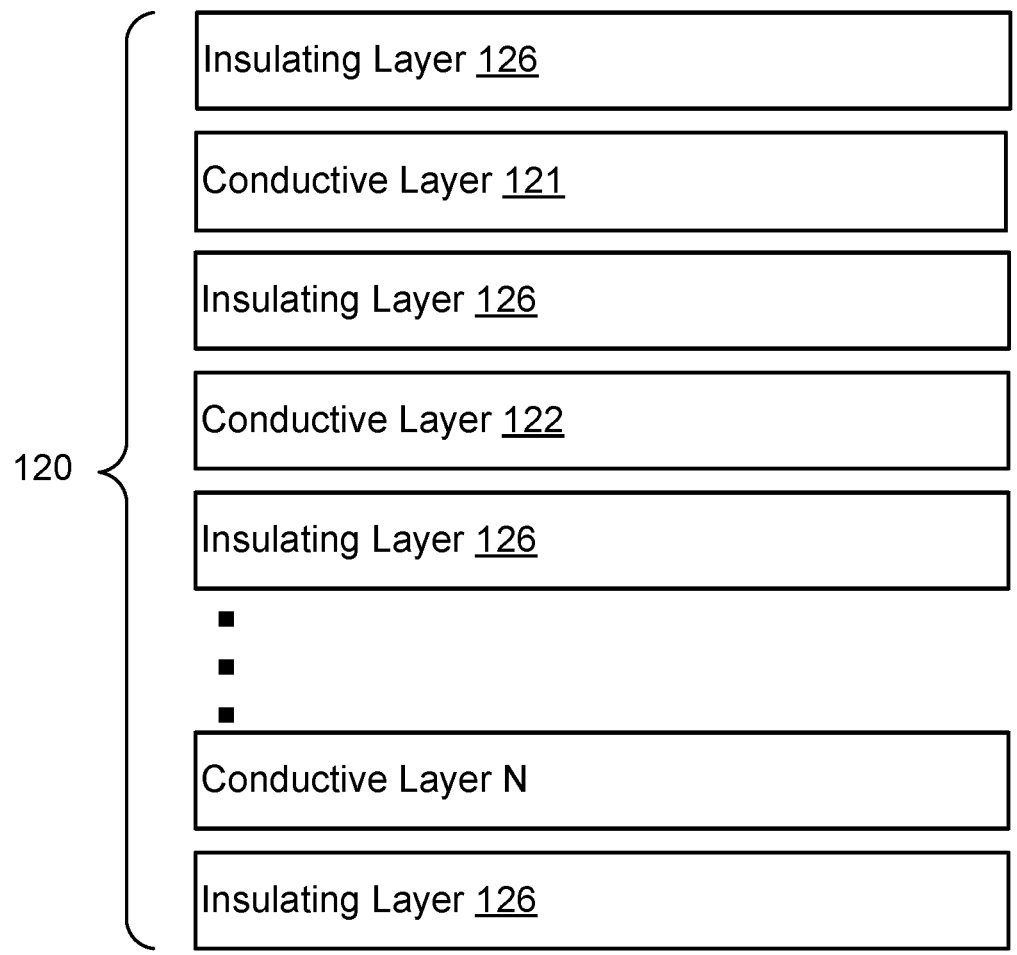
FIG. 1B illustrates components of an interconnect assembly in accordance with an exemplary embodiment.

With reference now to FIG. 1, in various example embodiments, an electrical system 100 comprises a battery pack 110 and an interconnect assembly 120. Interconnect assembly 120 may be located primarily on one side of, and is electrically coupled to, battery pack 110. In some exemplary embodiments, interconnect assembly 120 may also be configured to structurally support and/or retain the cells of battery pack 110 in-place, relative to interconnect assembly 120 and/or relative to one another.

Electrical system 100 may further comprise and/or be coupled to a load 190. Load 190 may, for example, be an electric motor or other electric components in a vehicle. Moreover, load 190 can be any suitable electric component. Interconnect assembly 120 may be selectively electrically coupled to load 190 via a power connector 135 that is configured to pass power from battery pack 110 to load 190 (or vice versa). Moreover, it will be appreciated that, in various exemplary embodiments, in electrical system 100, any suitable number of battery packs 110 and corresponding interconnect assemblies 120 may be utilized in serial and/or parallel arrangements, for example in order to achieve a desired level of energy storage, continuous current supplied at a particular voltage, and/or the like. Accordingly, electrical system 100 may be configured with various bus bars, terminals, and/or the like, configured to route electrical power from and/or to one or more battery packs 110 via corresponding interconnect assemblies 120.

Electrical system 100 may further comprise and/or be coupled to a power source 170. Power source 170 may comprise, for example, a plug-in charger for a vehicle, a fuel cell, or any other suitable source of power. In an example embodiment, power source 170 is connected to interconnect assembly 120 and/or load 190 via power connector 135. Interconnect assembly 120 may further be configured to pass power from power source 170 to the cells in battery pack 110. It is noted that in various embodiments, an electric motor may be used as a brake and thus may generate power to charge the cells of battery pack 110. The foregoing are only example configurations, and interconnect assembly 120 may be electrically connected to loads and/or sources of power in any suitable manner and using any suitable switching, connecting, and control devices.

Electrical system 100 may further comprise (and/or be coupled to) a battery management system ("BMS") 140. Interconnect assembly 120 may be in signal communication with BMS 140. BMS 140 may be configured to control, manage, monitor, and/or otherwise govern operation and behavior of battery pack 110, such as controlling the charging, discharging, balancing, and so forth for the cells in battery pack 110. Moreover, BMS 140 may control any suitable aspects of the charging, storing, and discharging of battery pack 110 and the use of power in electrical system 100. BMS 140 may be integrated with interconnect assembly 120; alternatively, BMS 140 may be coupled to interconnect assembly 120 via a connector cable or other suitable electrical connection.

In an example embodiment, interconnect assembly 120 comprises a first layer 121 and a second layer 122. In other example embodiments, interconnect assembly 120 further comprises an optional sensing layer 123. In accordance with various example embodiments, first layer 121, second layer 122, and/or sensing layer 123 (described in more detail below) are primarily located in planes that are parallel to each other and at least partially over-lapping perpendicular to each other. As described in further detail herein, first layer 121 and second layer 122 are connected to the terminals of various cells of battery pack 110. Thus, the first layer 121 and second layer 122 are configured to be electrically connected to terminals of cells of battery pack 110 and to conduct current from and to these cells.

In an example embodiment, first layer 121 may comprise a first current carrying plate 151 and a first interconnect plate 152. First current carrying plate 151 is oriented parallel to, and at least partially overlapping first interconnect plate 152. First current carrying plate 151 is electrically connected to first interconnect plate 152. For example, these two plates 151, 152 may be connected along at least a portion of their overlapping surfaces. In one example embodiment, the overlap is coincident such that the two plates 151, 152 touch along their overlapping, facing surfaces, and are thus electrically connected along the bulk of their overlapping, facing surfaces. First current carrying plate 151 and first interconnect plate 152 may be coupled together via any suitable method, for example cladding, welding, soldering, and/or the like. Similarly, second layer 122 may comprise a second current carrying plate 161 and a second interconnect plate 162 that are oriented and in electrical contact as described with respect to first layer 121.

In an example embodiment, first and second current carrying plates 151, 161, are generally thicker than first and second interconnect plates 152, 162, respectively. For example, first and second current carrying plates 151, 161, may be thick enough to carry a maximum desired current associated with operation of battery pack 110 without excessive resistive losses, overheating, or constraining the power input or output of the cells comprising battery pack 110. However, it will be appreciated that first and second current carrying plates 151, 161, may also be thinner than (or configured with a similar thickness to) first and second interconnect plates 152, 162. Moreover, in some embodiments, one or more of first and second current carrying plates 151, 161, or first and second interconnect plates 152, 162 are formed of multiple layers of material. Additionally, in some exemplary embodiments, first current carrying plate 151 and first interconnect plate 152 may comprise a single, monolithic plate; a similar structure may be utilized for second current carrying plate 161 and second interconnect plate 162. It will be appreciated that other example embodiments, as described in additional detail below, may be configured absent "thinner" interconnect plates, but instead comprise one or more current carrying plates having thin tabs.

In some exemplary embodiments, first and second current carrying plates 151, 161, are configured with a thickness of between about 0.3 millimeters (mm) and about 2.0 mm. Moreover, any suitable thicknesses may be used for the current carrying plates 151, 161, to carry a desired amount of current without generating excess heat. Moreover, first and second interconnect plates 152, 162, may be configured with a thickness of between about 0.05 (mm) and about 0.3 mm. Moreover, any suitable thicknesses may be used, for example in order to provide a desired current carrying capacity, ease of interconnection, to facilitate connection of the tabs to the cell (e.g., laser welding, spot welding, wire bonding, use of conductive adhesives) and/or the like.

In an example embodiment, first and second interconnect plates 152, 162, may be configured to be thin enough to enable typical electrical connections (i.e., between the battery cells of battery pack 110 and the first and second interconnect plates 152, 162). For example, first and second interconnect plates 152, 162 may be thin enough to enable electrical connections made by brazing, cladding, soldering, spot welding, ultrasonic welding, laser welding, wire bonding, use of conductive adhesives, and/or the like. In an example embodiment, first current carrying plate 151 is thicker than first interconnect plate 152. Similarly, in this exemplary embodiment, second current carrying plate 161 is thicker than the second interconnect plate 162. In other exemplary embodiments, plate thicknesses may vary as noted above.

In various exemplary embodiments, and as discussed further below in connection with FIGS. 10D, and 11A-11B, first interconnect plate 152 may be integrally formed with first current carrying plate 151. In other exemplary embodiments, first interconnect plate 152 is formed apart from first current carrying plate 151 and then coupled thereto. First current carrying plate 151 and/or first interconnect plate 152 may comprise any suitable electrically conductive material, for example copper, aluminum, nickel, and/or the like, or combinations and/or alloys thereof. In some exemplary embodiments, first current carrying plate 151 comprises aluminum, and first interconnect plate 152 comprises nickel. In this manner, first interconnect plate 152 may comprise a material configured to facilitate electrical connections with cells in battery pack 110, while first current carrying plate 151 comprises a material configured to facilitate bulk transmission of electrical current with minimal losses. Similar approaches may be utilized for plates 161, 162.

Moreover, in an example embodiment, the thickness of the first and second current carrying plates 151, 161 is not dependent on the thickness limitations associated with connecting the interconnect layers to the cells of battery pack 110, whereas if the first layer 121 were not made of two layers (i.e., plates 151, 152, for example), and instead of just one layer, this may not be true. Stated another way, the first and second layers 121, 122 are configured so that the total current capacity for each of these layers is not dependent on the thickness (and/or current-carrying capacity) of the tabs, which is associated with method of connecting the tabs to the battery terminals. In addition, in an example embodiment, the first layer 121 and second layer 122 each comprise two layers of selected thickness to reduce or eliminate any need for cooling due to heat generated in the first and/or second layers 121, 122 due to resistive heating effects in these layers.

Moreover, electrical system 100 may comprise any other suitable components configured to support, guide, modify, and/or otherwise manage and/or control operation of electrical system 100 and/or components thereof. Interconnect assembly 120 may be utilized to make a solid electrical contact with the cells of battery pack 110, to provide flexibility in combining the cells in various parallel/series configurations, to hold the battery cells in place, to sense characteristics of battery pack 110, and/or the like.

Figure 2A:
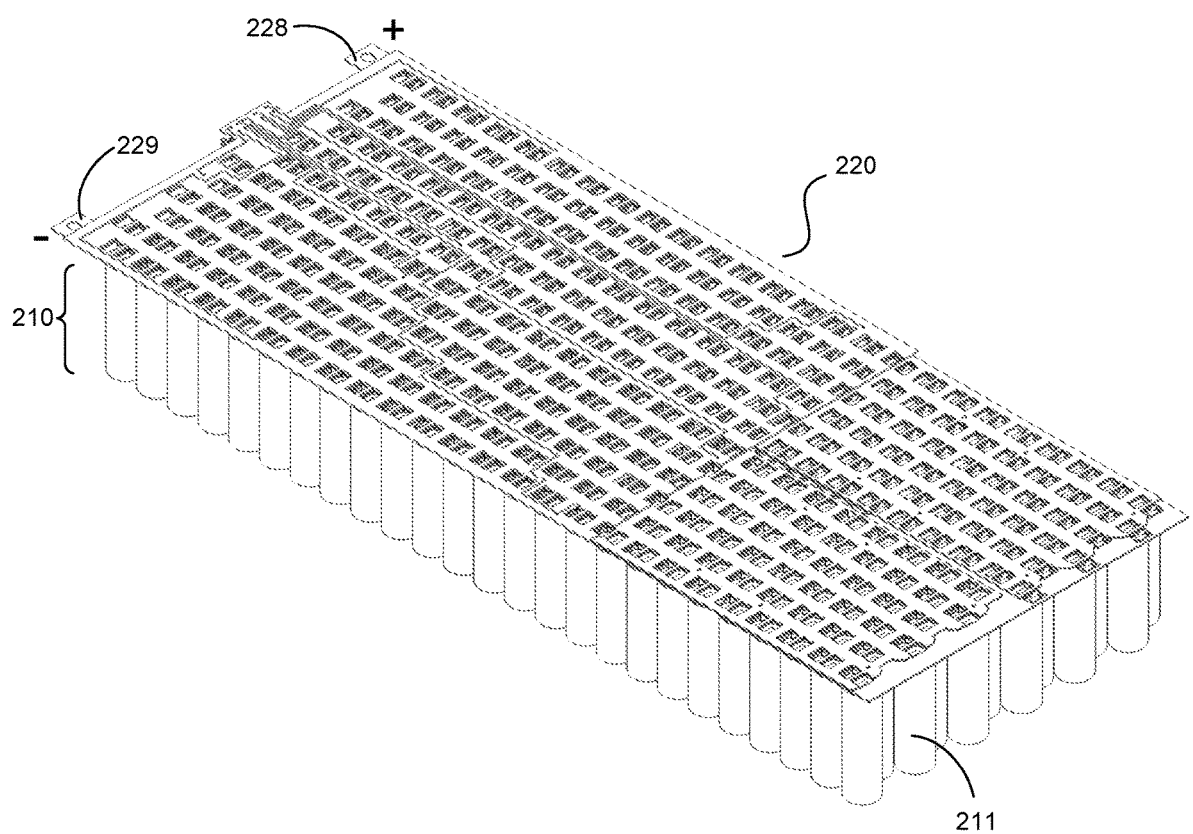
FIG. 2A illustrates an isometric view of an interconnect assembly (with overmolding not shown) and battery pack, in accordance with an exemplary embodiment.

FIG. 2A illustrates an isometric view of an interconnect assembly 220 (with the overmolding not shown) and battery pack 210. Battery pack 210 comprises a plurality of cells 211. For example, the illustrated battery pack 210 comprises 300 cells 211, though battery pack 210 may comprise any suitable number of cells 211. In an example embodiment, each cell 211 is a cylindrical cell with terminals located at the proximal end of cell 211 (i.e., the end proximate interconnect assembly 220). Cell 211 can be any other suitable shape, as desired.

Interconnect assembly 220 may further comprise a positive tab 228 and a negative tab 229. These power tabs electrically connect interconnect assembly 220 to the power connector 135, the load 190, and/or the power source 170.

Figure 2B:
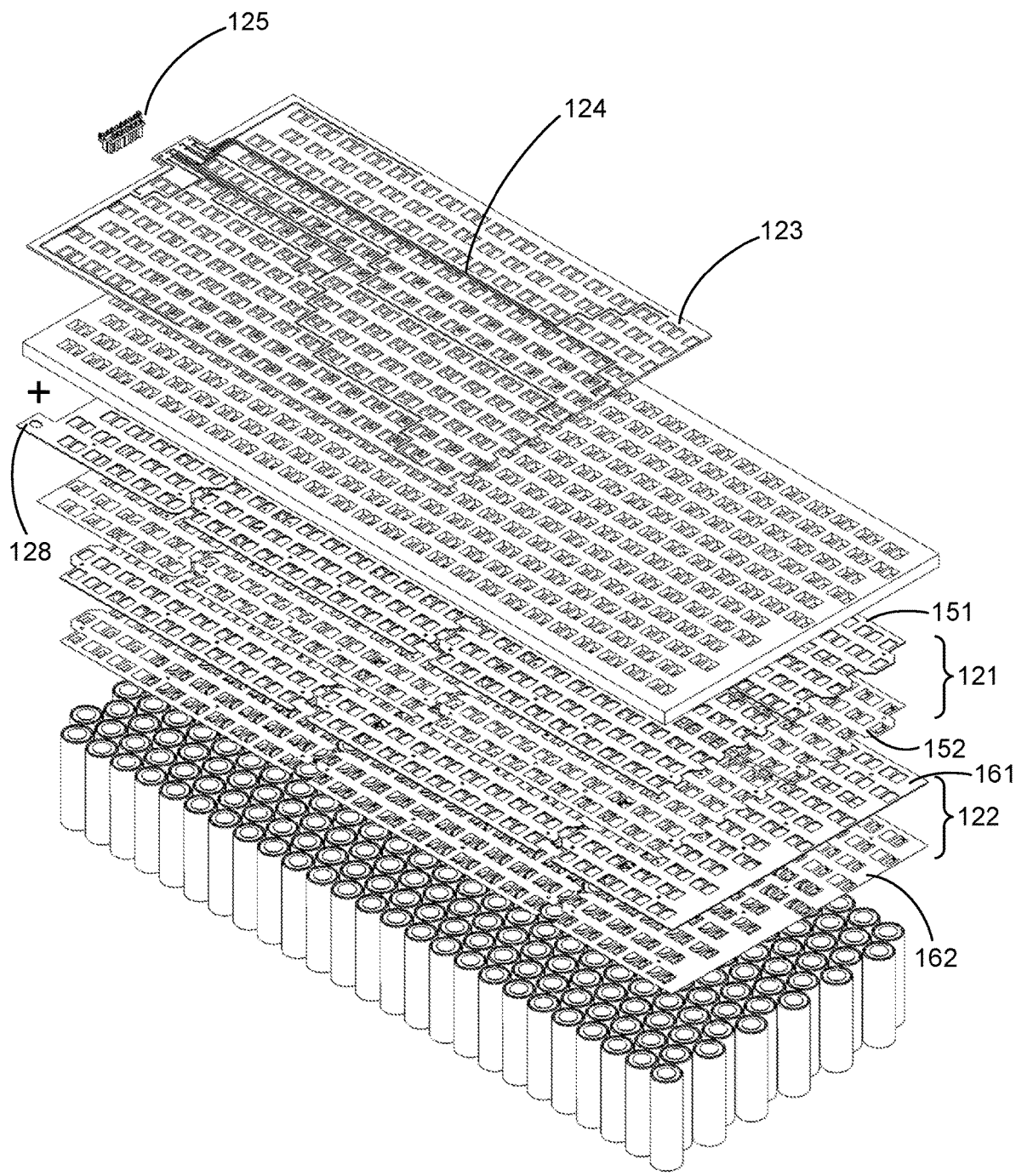
FIG. 2B illustrates an isometric exploded view of the contents of FIG. 2A, in accordance with an exemplary embodiment.

FIG. 2B illustrates an isometric exploded view of an exemplary interconnect assembly 220 and battery pack 210. In this exploded view, first layer 121 is illustrated as an 'upper layer' having an 'upper thick' first current carrying plate 151 and an 'upper thin' first interconnect plate 152. Similarly, second layer 122 is illustrated as a 'lower layer' having a 'lower thick' second current carrying plate 161 and a 'lower thin' second interconnect plate 162.

As stated above, interconnect assembly 220 may further comprise a sensing layer 123. In an example embodiment, sensing layer 123 comprises a lead frame. In another example embodiment, sensing layer 123 comprises a printed circuit board. In another example embodiment, sensing layer 123 comprises a flexible printed circuit board. Moreover, sensing layer 123 may comprise any structure suitable for running signal wires or traces 124 in at least partially a substantially planar manner to various locations on interconnect assembly 220. Sensing layer 123 may comprise sensors, and/or be configured to connect to sensors for communicating sensed information (e.g., data) from sensors sensing current, voltage, temperature, and/or other useful parameters associated with the battery and/or operation of the same. Sensing layer 123 may, for example, carry signal from thermistors located near one or more cells 211 to a communications connector 125. Similarly, sensing layer 123 may provide connections to first layer 121 and second layer 122 at various locations, for example to allow for measuring the voltage of a group (or groups) of parallel cells 211 in battery pack 210, cell 211 balancing, and/or the like. The communications connector 125 may be configured to facilitate communication with BMS 140 and/or other components of electrical system 100. Sensing layer 123 may be disposed generally parallel to first layer 121 and second layer 122. Moreover, sensing layer 123 (or portions thereof) may be located above, between, and/or below first layer 121 and second layer 122.

Figure 2C:
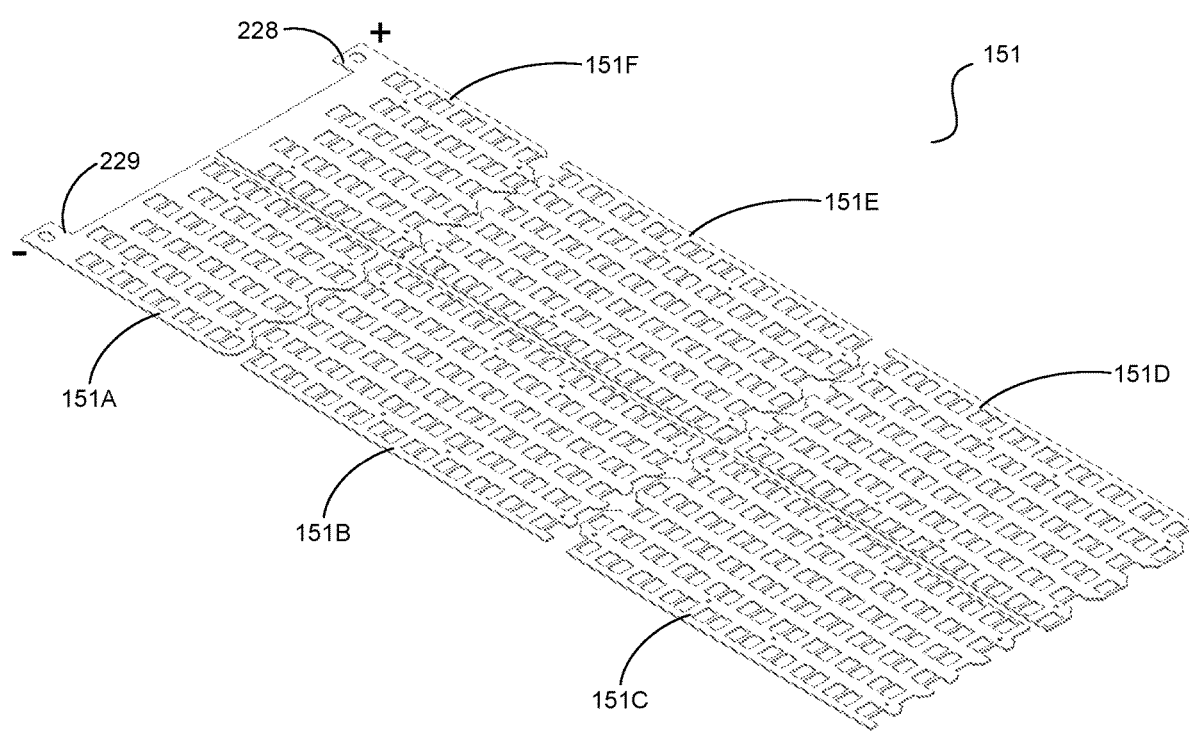
FIG. 2C illustrates an isometric view of a first current carrying plate in accordance with an exemplary embodiment.

FIGS. 2C, 2D, 2E, and 2F respectively illustrate an isometric view of the first current carrying plate 151, first interconnect plate 152, second current carrying plate 161, and second interconnect plate 162. In FIG. 2C, first current carrying plate 151 comprises more than one current carrying plate segment. First current carrying plate 151 may comprise any suitable number of current carrying plate segments. For example, first current carrying plate 151 may comprise six current carrying plate segments 151A, 151B, 151C, 151D, 151E, 151F. First current carrying plate 151 segments may be structurally separate components of first current carrying plate 151. As described in greater detail herein, first current carrying plate 151 segments may be electrically connected in series, parallel, and/or interwoven with segments of second current carrying plate 161. In an example embodiment, current carrying plate segment 151A has a negative connection point 229 and current carrying plate segment 151F has a positive connection point 228. These connection points may be configured as tabs or other structures suitable for connecting interconnect assembly 120 to other electrical components of electrical system 100. When interconnect assembly 120 is coupled to battery pack 110, first current carrying plate segment 151A has the greatest negative potential, and current carrying plate segment 151F has the greatest positive potential. First current carrying plate 151 is configured to be in electrical communication with first interconnect plate 152, for transmitting power between cells 211 and the connection points 228/229. First current carrying plate 151 comprises a plurality of windows. The windows may be free of obstruction permitting, through the windows, access to objects below the windows of the first current carrying plate 151.

Figure 2D:
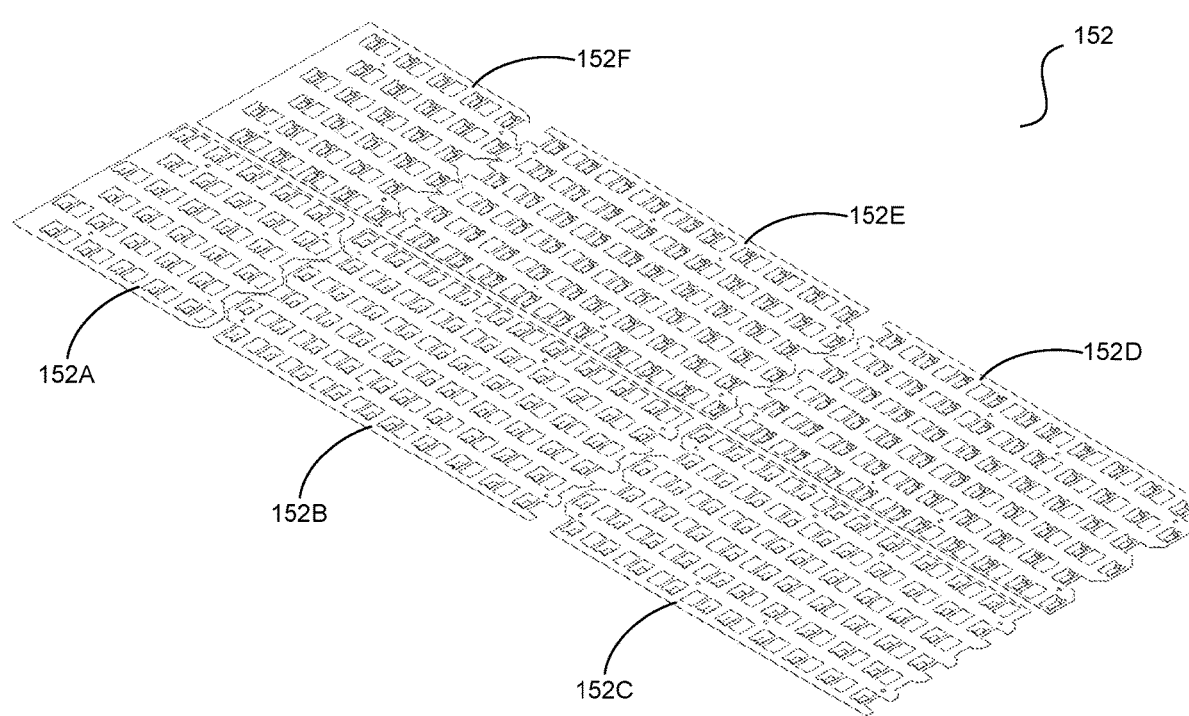
FIG. 2D illustrates an isometric view of a first interconnect plate in accordance with an exemplary embodiment.

In FIG. 2D, first interconnect plate 152 comprises more than one interconnect plate segment. First interconnect plate 152 may comprise any suitable number of interconnect plate segments. For example, first interconnect plate 152 may comprise six interconnect plate segments 152A, 152B, 152C, 152D, 152E, 152F. The interconnect plate segments may be structurally separate components of first interconnect plate 152. First interconnect plate 152 segments may be electrically connected to corresponding current carrying plate segments of first current carrying plate 151. First interconnect plate 152 further comprises tabs that are bent, angled, and/or oriented to form leads suitable for connecting to either the positive or negative terminal of cells 211. First interconnect plate 152 comprises a plurality of windows. A first subset of those windows may be free of obstruction permitting access to objects below the windows of the first interconnect plate 152 through the windows. A second subset of those windows may comprise the tabs. In an example embodiment, the plurality of windows comprise pairs of windows, where each pair corresponds to a cell 211. The selection of which window of the pair of windows comprises the tab will determine whether the tab is connected to the positive terminal or the negative terminal of the cell 211. In an example embodiment, for any one of the first interconnect plate 152 segments, all of the tabs contact the same polarity terminal of cell 211. However, in other example embodiments, a single interconnect plate 152 segment may have a first group of tabs in contact with negative terminals and a second group of tabs in contact with positive terminals of cells 211. In other exemplary embodiments, the plurality of windows include a single window per cell 211; in these exemplary embodiments, each window includes both a portion free of obstruction permitting access to objects below the window, as well as a tab or tabs for connecting to a cell 211.

Figure 2E:
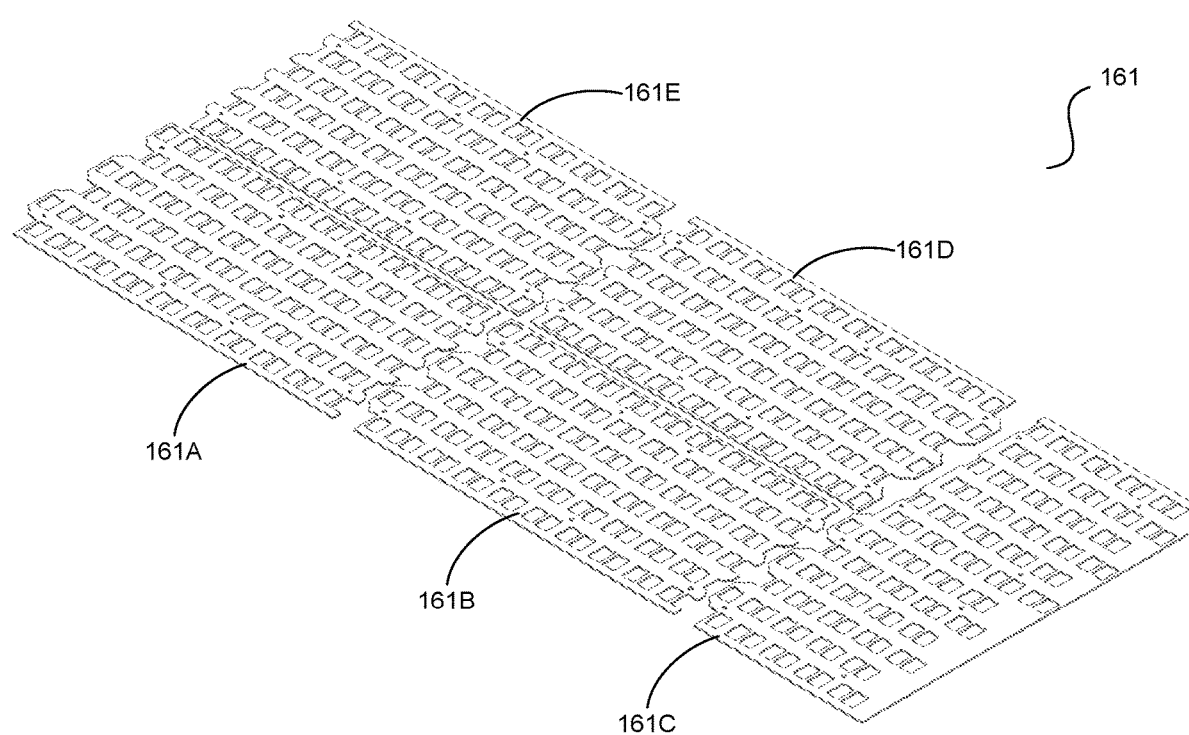
FIG. 2E illustrates an isometric view of a second current carrying plate in accordance with an exemplary embodiment.

With reference now to FIG. 2E, in various exemplary embodiments second current carrying plate 161 comprises more than one current carrying plate segment. Second current carrying plate 161 may comprise any suitable number of current carrying plate segments. For example, second current carrying plate 161 may comprise five current carrying plate segments 161A, 161B, 161C, 161D, 161E. The current carrying plate segments may be structurally separate components of second current carrying plate 161. As described in greater detail herein, the current carrying plate segments comprising second current carrying plate 161 may be electrically connected in series, parallel, interleaved with, and/or combinations of the same, with the current carrying plate segments comprising first current carrying plate 151.

Second current carrying plate 161 is configured to be in electrical communication with second interconnect plate 162, for transmitting power between the cells and the second current carrying plate 161. The second current carrying plate 161 comprises a plurality of windows. The windows may be free of obstruction permitting access to objects below the windows of the second current carrying plate 161 through the windows, and permitting the tabs from the first interconnect plate 152 to pass through the second current carrying plate 161 to contact cells 211. It is noted that in some instances, the current carrying plate segments of the second layer 122 overlap exactly with the current carrying plate segments of the first layer 121. However, in other embodiments, a plate segment from the first layer 121 overlaps two or more plate segments from the second layer 122, or vice versa. For example, current carrying plate segment 161A overlaps portions of 151A and 151B, current carrying plate segment 161B overlaps portions of 151B and 151C, current carrying plate segment 161C overlaps portions of 151C and 151D, current carrying plate segment 161D overlaps portions of 151D and 151E, and current carrying plate segment 161E overlaps portions of 151E and 151F.

Figure 2F:
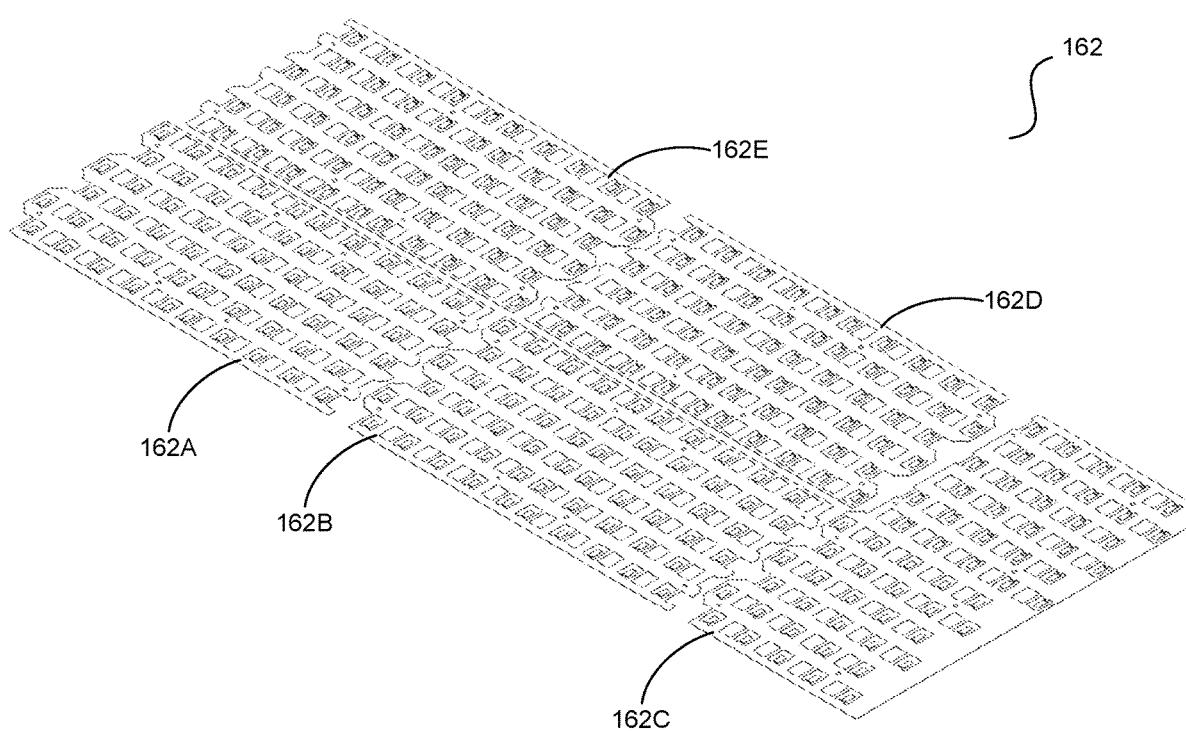
FIG. 2F illustrates an isometric view of a second interconnect plate in accordance with an exemplary embodiment.

With reference now to FIG. 2F, second interconnect plate 162 comprises more than one interconnect plate segment. Second interconnect plate 162 may comprise any suitable number of interconnect plate segments. For example, second interconnect plate 162 may comprise five interconnect plate segments 162A, 162B, 162C, 162D, 162E. The interconnect plate segments may be structurally separate components of second interconnect plate 162. The interconnect plate segments may be electrically connected to corresponding current carrying plate segments of second current carrying plate 161. The second interconnect plate 162 further comprises tabs that are bent to form leads suitable for connecting to either the positive or negative terminal of cell 211. The second interconnect plate 162 comprises a plurality of windows. A first subset of those windows may be free of obstruction permitting access to objects below the windows of the second interconnect plate 162 through the windows. A second subset of those windows may comprise the tabs. In an example embodiment, the plurality of windows comprise pairs of windows, where each pair corresponds to a cell 211. The selection of which window of the pair of windows comprises the tab will determine whether the tab is connected to the positive terminal or the negative terminal of the cell 211. In an example embodiment, for any one of the interconnect plate segments, all of the tabs contact the same polarity terminal of cell 211. However, in other example embodiments, a single interconnect plate segment may have a first group of tabs in contact with negative terminals and a second group of tabs in contact with positive terminals of cell 211. Moreover, for each pair of windows in first interconnect plate 152, there is an opposite pair of windows in second interconnect plate 162, such that each pair only has one window with a tab, the tabs locations are opposite each other to not interfere with each other, and one of the two plates is connected by such tab to the positive terminal of a cell and the other of the two plates is connected by its tab to the negative terminal. With momentary reference to FIG. 3H, it will be appreciated that, while windows are discussed hereinabove as being in "pairs", configurations where a single window covers the area of a "pair" of windows may likewise be utilized; moreover, combinations of paired windows and single windows may also be utilized.

In an example embodiment, there are two power connections to interconnect assembly 120, a positive connection and a negative connection. The two connections can both be located on a first end of the interconnect assembly, for example as shown in FIGS. 2C and 4B. In other embodiments, a positive connection is located on one end and a negative connection is located on the other end, for example in interconnect assembly 120 as shown in FIG. 4C (individual layers of which are shown in FIGS. 4D, 4E, 4F, and 4G). In an example embodiment, the positive and negative connections can both be on the first current carrying plate 151 or the second current carrying plate 161. However, in other embodiments, the positive connection can be on one of the two current carrying layers and the negative connection can be on the other. Moreover, additional power and/or voltage sensing connections may be provided within interconnect assembly 120, for example connections configured to allow monitoring, charging, discharging, and so forth for a subset of cells 211 in battery back 110.

Within one 'stack' of windows, the windows in the first and second layers 121, 122 may all be approximately the same size, though variation may be possible if the tabs can pass through and access to make the connections. The open windows in the lower layers are configured to permit the tab from the upper thin layer to extend through the lower layers to the battery below the lower layer. The open windows are configured to permit access from above, through the upper layer and the lower layer to connect/couple the tabs in the upper thin layer and lower thin layer to the respective cell terminals.

Figure 6:
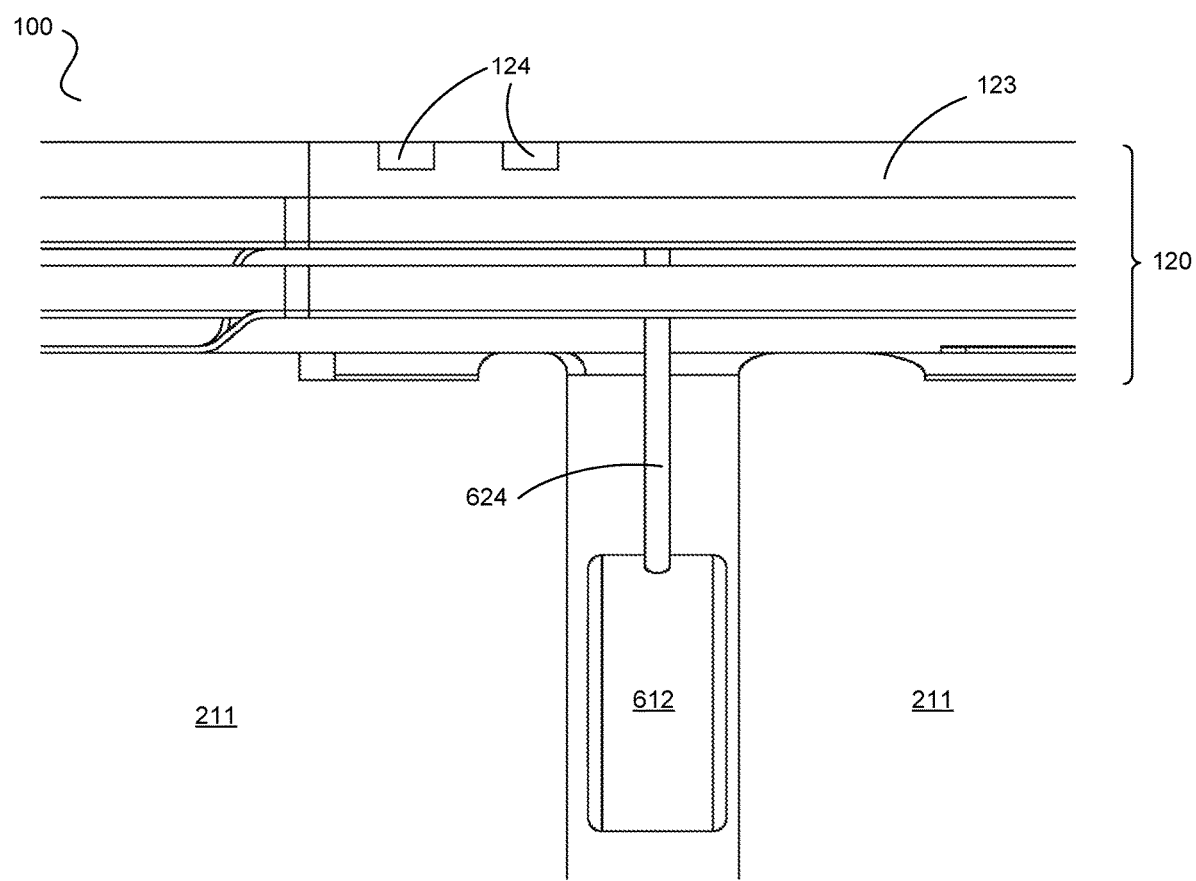
FIG. 6 illustrates a cut-away side view of a portion of an interconnect assembly and battery pack, with a thermistor located between two adjacent battery cells in accordance with various exemplary embodiments.

With reference now to FIG. 6, in connection with various exemplary embodiments, FIG. 6 illustrates a cut-away side view of a portion of interconnect assembly 120 and battery pack 110, with a thermistor 612 located between two adjacent cells 211. In an example embodiment, interconnect assembly 120 comprises sensing layer 123 and trace 124 located generally above the first and second layers 121, 122. A thermistor 612 is located in proximity to a first cell 211 of battery pack 110. In an example embodiment, the thermistor 612 is connected to the trace 124 through a thermistor lead 624. In an example embodiment, the thermistor lead 624 passes through a via to connect with trace 124, however, any suitable routing or method (such as rivets, pins, tabs that can be soldered or welded in place, etc.) may be used to connect thermistor 612 with trace 124. In another example embodiment, thermistor 612 is embedded, or partially embedded in an overmold (discussed further herein). In this example embodiment, the thermistor 612 is integral with the interconnect assembly 120. Interconnect assembly 120 may comprise any suitable number of thermistor(s) 612. In this example embodiment, placing interconnect assembly 120 over battery pack 110 simultaneously accurately positions the thermistor(s) 612 to sense the temperatures of the cells 211. Thus, this device and method of assembly avoids separate manual processes for attaching sensors to or near battery cells.

Figure 3A:
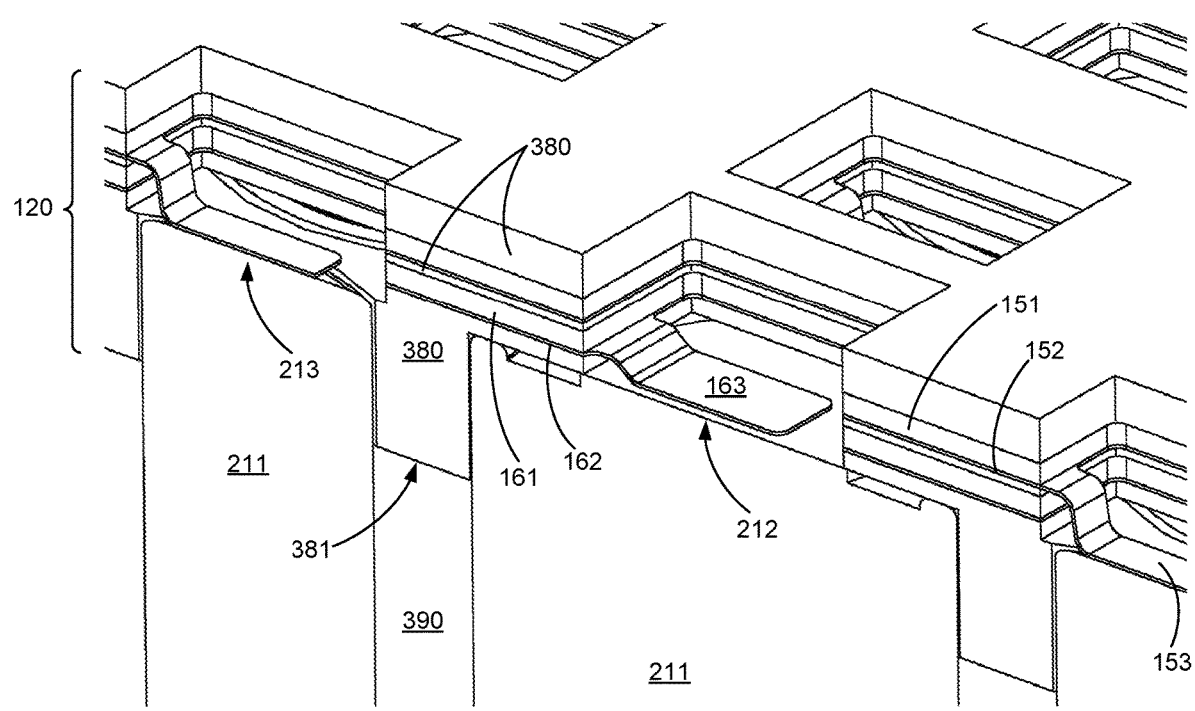
FIGS. 3A and 3B illustrate cross-sectional, partial, isometric views of an interconnect assembly and battery pack, showing a positive tab connected to a battery cell, in accordance with exemplary embodiments.

With reference now to FIG. 3A, in accordance with various example embodiments, interconnect assembly 120 further comprises an overmold material. The overmold material can comprise a plastic, injection molded plastic, a ceramic material, a polymer, and/or the like. In various embodiments, the polymer may comprise a liquid crystal polymer (LCP), polyphenylene pulfide (PPS), polyether ether ketone (PEEK), a thermoplastic polymer, a thermoset polymer, and/or the like. Thus, the overmold material may comprise any suitable material for casting, injection molding, or otherwise overmolding the leadframe(s) as described herein. Furthermore, overmold material 380 may comprise any material that can electrically and/or thermally insulate first layer 121, second layer 122 and/or sensing layer 123 from each other, that can provide structural support for the components (e.g., 121, 122, 123, and so forth) of interconnect assembly 120, and/or that can structurally hold and position cells 211 of battery pack 110.

Figure 3B:
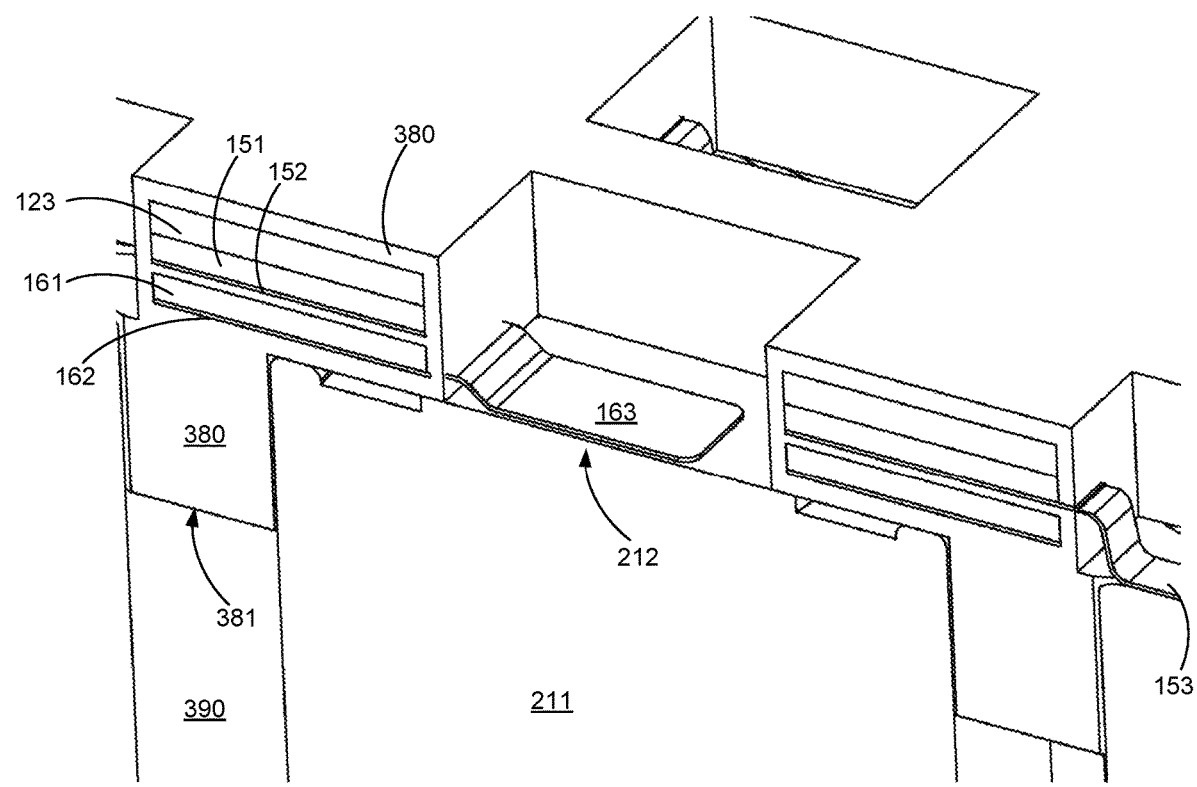

FIGS. 3A and 3B illustrate cross-sectional, partial, isometric views of the interconnect assembly 120 and the battery pack 110, with a close up of the positive tab 163, in accordance with exemplary embodiments. In an example embodiment, the overmold material 380 covers the top surface of the interconnect assembly 120, is located between the first layer 121 and second layer 122, and/or is located under the second layer 122, with windows and/or apertures in the overmold material 380 that are aligned with the windows in the first layer 121, second layer 122, and/or sensing layer 123. The interconnect assembly 120 may further comprise (and/or be coupled to) retaining structure 381. In an example embodiment, retaining structure 381 is located below the second layer 122. Stated another way, retaining structure 381 is located on the side of second layer 122 opposite the first layer 121. In an example embodiment, retaining structure 381 is made of the overmold material 380. Moreover, retaining structure 381 may comprise any suitable electrically insulating material suitable for holding and/or supporting cells 211 in a desired position. The retaining structure 381 may be configured as a ring like structure, as circles in an otherwise continuous structure, or the like. In other embodiments, the retaining structure 381 may comprise posts (not shown). The retaining structure 381 may be configured to contact the cells 211, for example on the side and/or top of the cell 211, or near the top of the cell 211. The contact can be continuous or discontinuous. The contact may prevent or restrain relative movement of the top portion of the cells 211 relative to each other and/or relative to interconnect assembly 120. The contact may further assist with alignment of the tabs 153, 163 to the cells 211. The contact may further create a seal around the top of cell 211 to prevent gases or fluids from being communicated between a space 390 between the cells 211 and the environment on the other side of interconnect assembly 120. Moreover, the retaining structure 381 may comprise any suitable structure for holding cells 211 in place. Additionally, in these exemplary embodiments, interconnect assembly 120 may function to at least partially retain, secure, and/or align battery cells 211 with respect to one another, reducing and/or eliminating the need for other cell 211 retention and/or alignment components.

In an example embodiment, a positive tab 163 extends from second interconnect plate 162 and is aligned with the top center 212 of cell 211, which is generally the positive terminal in a typical cylindrical battery. Similarly, a negative tab 153 extends from the first interconnect plate 152 and is aligned with the top edge 213 of cell 211, which is generally the negative terminal in a typical cylindrical battery. The tabs are each bent, curved, and/or angled to reach down through the window to the proximal end of the cell 211.

FIG. 3B illustrates that overmold material 380 surrounds layers 121, 122 and insulates the layers, including on the inside of the windows. It will be appreciated that, while FIGS. 3A and 3B show windows configured in pairs, with momentary reference to FIG. 3H, single-window configurations may also be utilized.

Figure 3C:
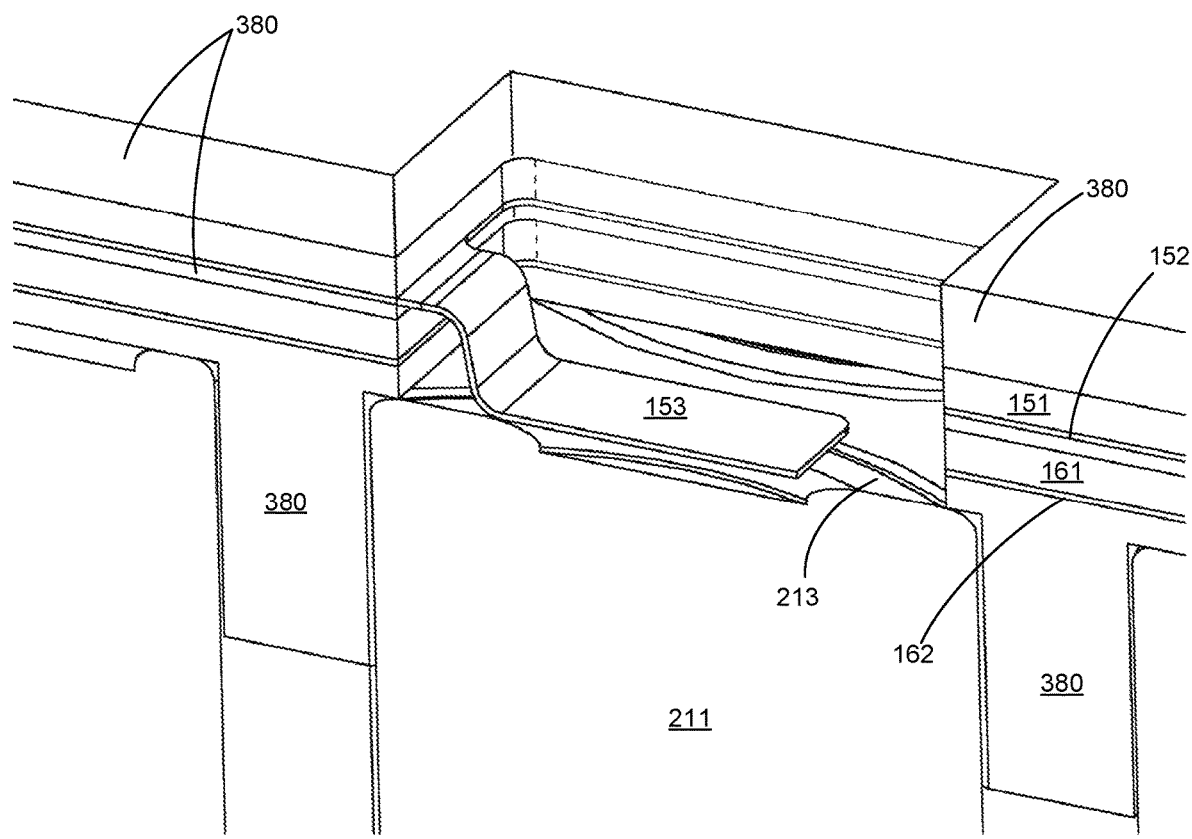
FIGS. 3C and 3D illustrate cross-sectional, partial, isometric views of an interconnect assembly and battery pack, showing a negative tab connected to a battery cell, in accordance with exemplary embodiments.
Figure 3D:
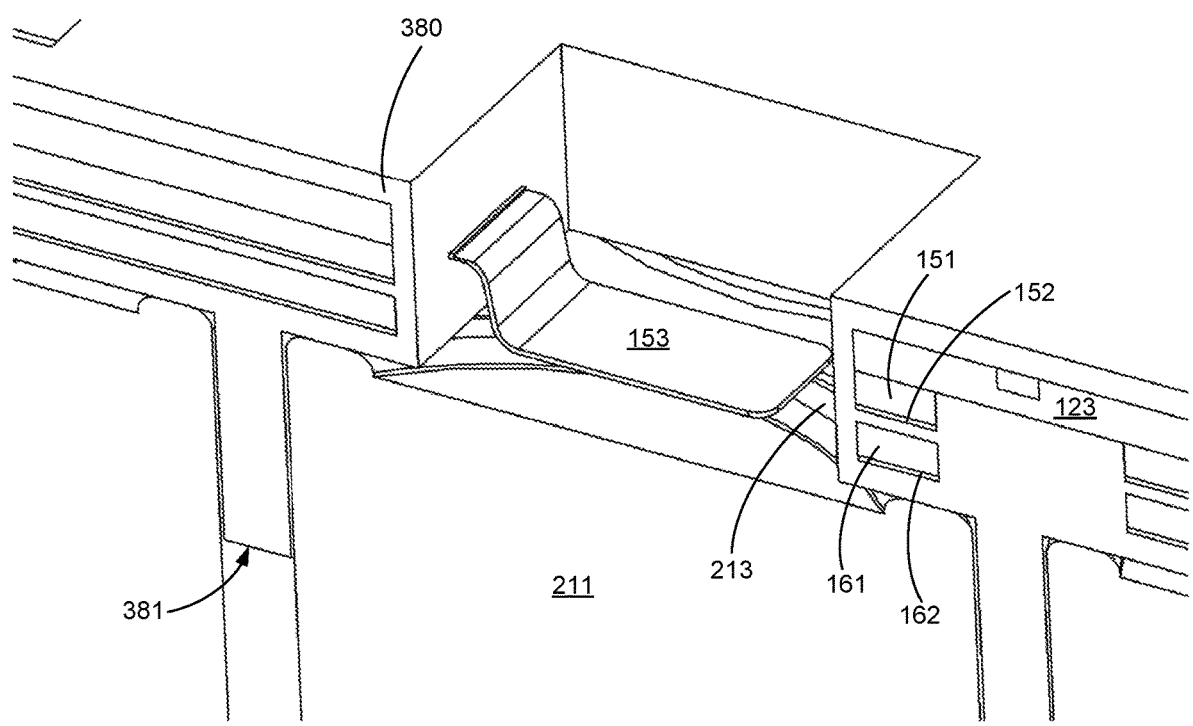

FIGS. 3C and 3D illustrate a cross-sectional, partial, isometric views of the interconnect assembly 120 and the battery pack 110 with a close up of a negative tab 153, in accordance with exemplary embodiments.

With momentary reference to FIGS. 3A through 3I, it will be appreciated that a negative tab 153 and positive tab 163 may be coupled to a corresponding cell 211 via any suitable method and/or materials, for example welding (laser, ultrasonic, etc.) brazing, soldering, and/or the like.

Figure 3E:
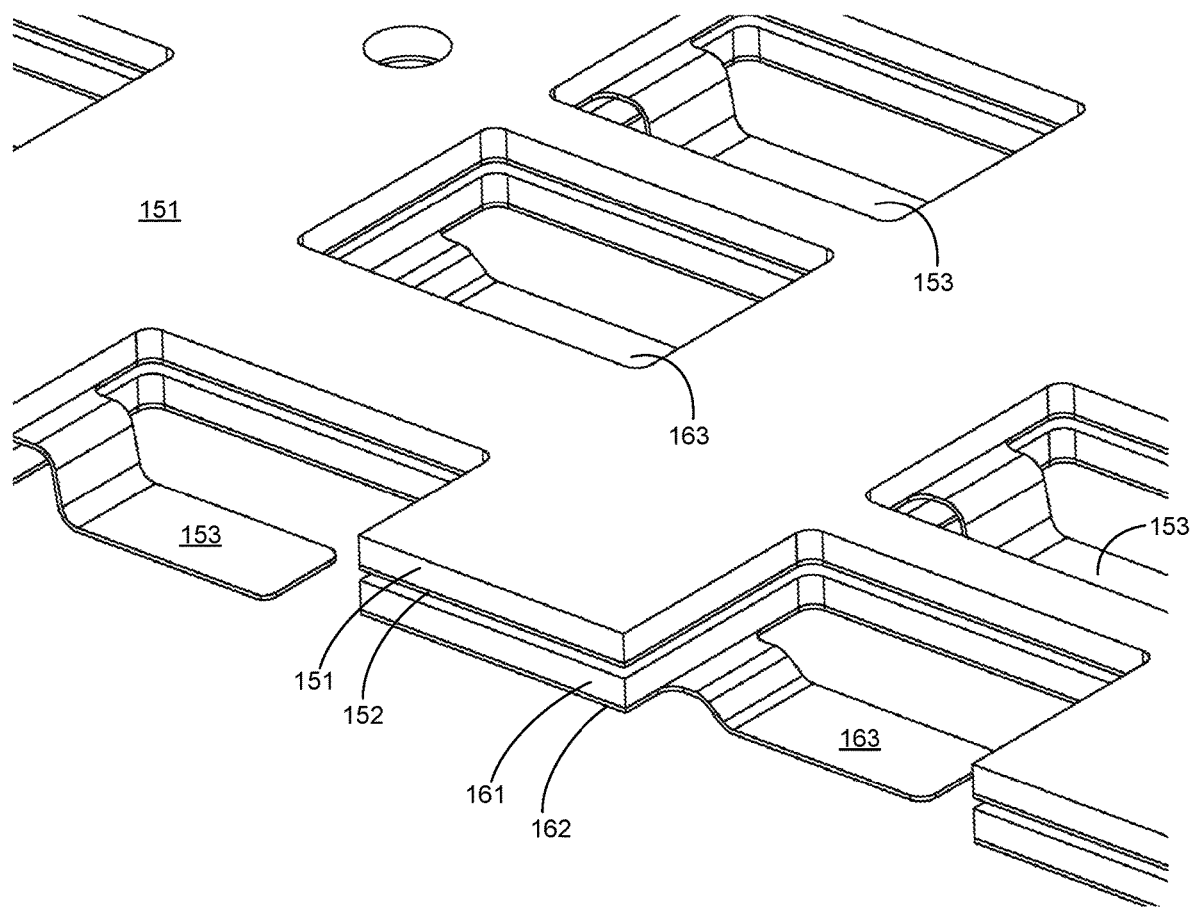
FIG. 3E illustrates a cross-sectional, partial, isometric view of an interconnect assembly showing an alternating pattern of positive and negative tabs, in accordance with exemplary embodiments.

FIG. 3E illustrates a cross-sectional, partial, isometric view of interconnect assembly 120 showing a repeating pattern of positive and negative tabs 153, 163, in accordance with exemplary embodiments. Positive tab 163 is located proximate negative tab 153. For example, the window associated with positive tab 163 may be side by side with the window associated with negative tab 153. In one example embodiment, first layer 121 is connected to the positive terminal of cell 211 and second layer 122 is connected to the negative terminal of cell 211. However, in another example embodiment, first layer 121 is connected to the negative terminal of cell 211 and second layer 122 is connected to the positive terminal of cell 211. Moreover, in an example embodiment, all of the connections to cells for a particular plate segment are the same, such that a plate segment may be considered a "positive" plate segment or a "negative" plate segment. However, in various exemplary embodiments, some of the connections to cells 211 on a particular plate segment are positive and other connections are negative. For example, with momentary reference to FIG. 4A, in various exemplary embodiments a plate segment is configured with a positive connection to a selected number of cells 211, and a negative connection to an identical number of other cells 211. In this manner, cells 211 are configured to function as electrical routing paths between plate segments.

Figure 3F:
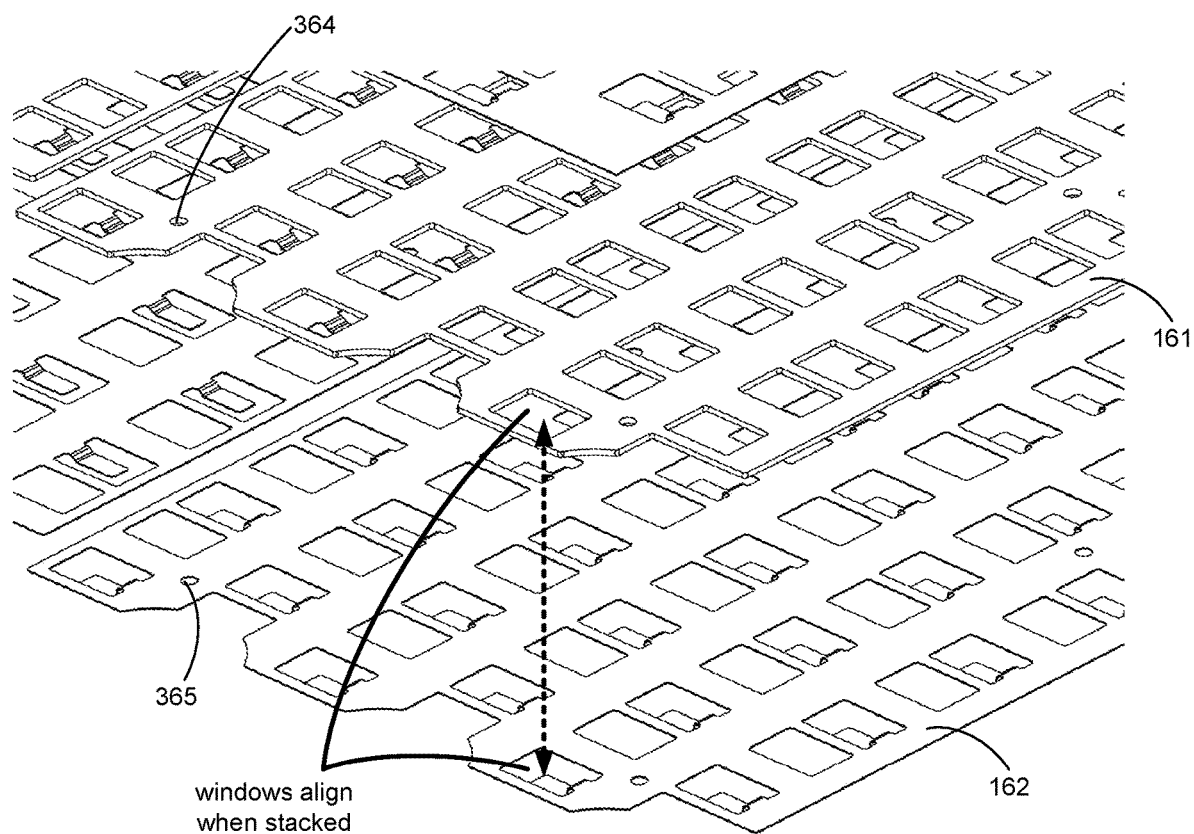
FIG. 3F illustrates an exploded, partial, isometric view of a current carrying plate aligned with an interconnect plate, in accordance with an exemplary embodiment.

FIG. 3F illustrates an exploded, partial, isometric view of a second current carrying plate 162 aligned with a second interconnect plate 161. Alignment holes 364, 365 (disposed in plates 161, 162, respectively) permit alignment and coupling of these and other components of interconnect assembly 120.

Figure 3G:
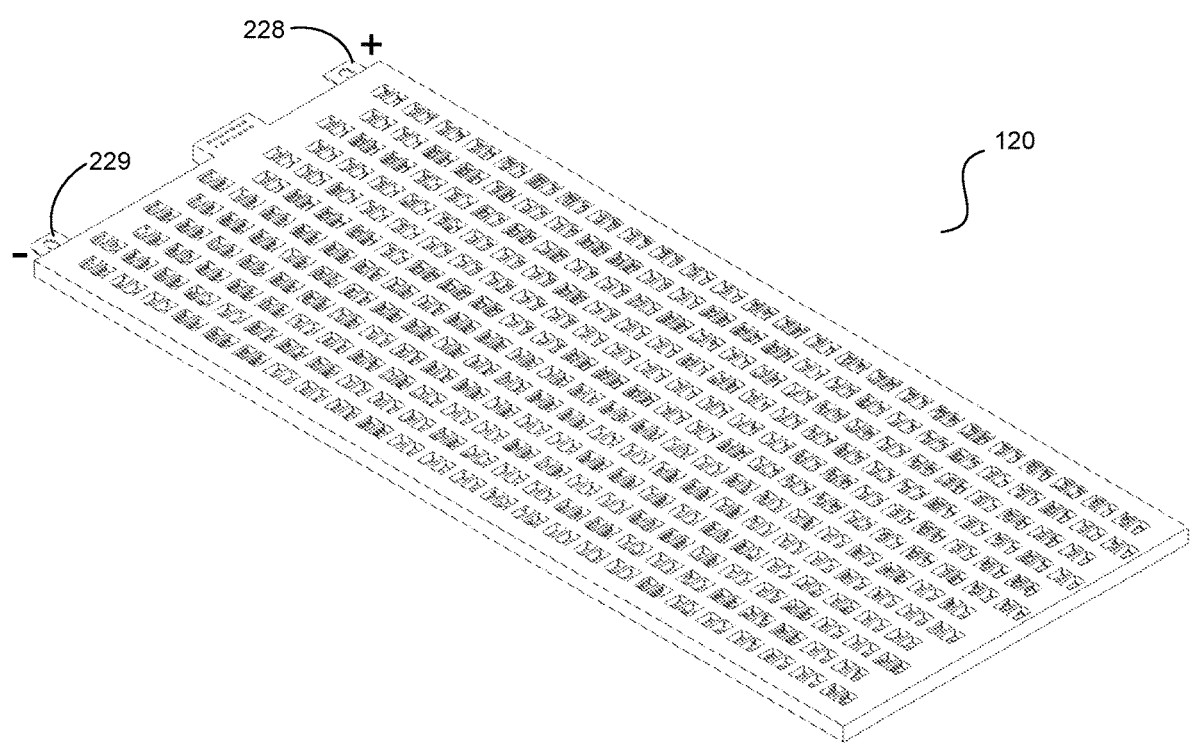
FIG. 3G illustrates an isometric view of the interconnect assembly of FIG. 2A with overmolding shown, in accordance with exemplary embodiments.

FIG. 3G illustrates a partial top view of interconnect assembly 120, in accordance with exemplary embodiments. In this example embodiment, interconnect assembly 120 has been overmolded. Thus, interconnect assembly 120 forms a package that is convenient for mounting to battery pack 110.

Figure 3H:
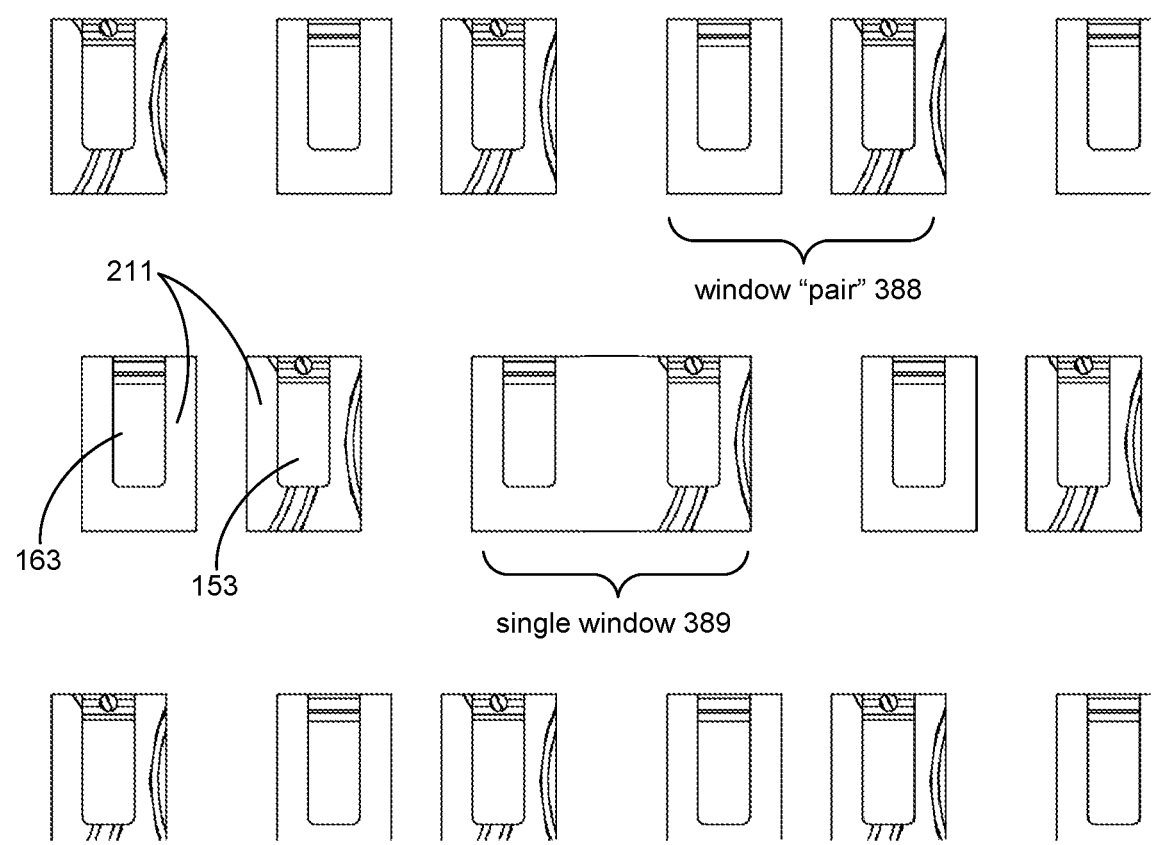
FIG. 3H illustrates a partial top view of an interconnect assembly, with battery cells partially visible through portions of the interconnect assembly, in accordance with exemplary embodiments.

FIG. 3H illustrates a partial top view of the interconnect assembly 120 with cells 211 partially visible through windows and/or apertures in interconnect assembly 120, in accordance with exemplary embodiments. In this view, the positive tab 163 and negative tab 153 and portions of the top of cells 211 are visible through windows in the overmold material and first and second layers. In an example embodiment, interconnect assembly 120 comprises an array of pairs of windows 388, with each pair 388 comprising a positive window and a negative window. Associated with the positive window is a positive tab 163 connected (or for connecting) to the positive terminal at the proximal end of the cell 211 near the center of the battery. Associated with the negative window is a negative tab 153 connected (or for connecting) to the negative terminal at the proximal end of the cell 211 near the edge of the battery. Each window has sufficient size to facilitate electrically connecting the corresponding tab(s) to the cell 211. As discussed elsewhere, in place of pairs 388, a single common window 389 may be utilized, as desired.

Figure 3I:
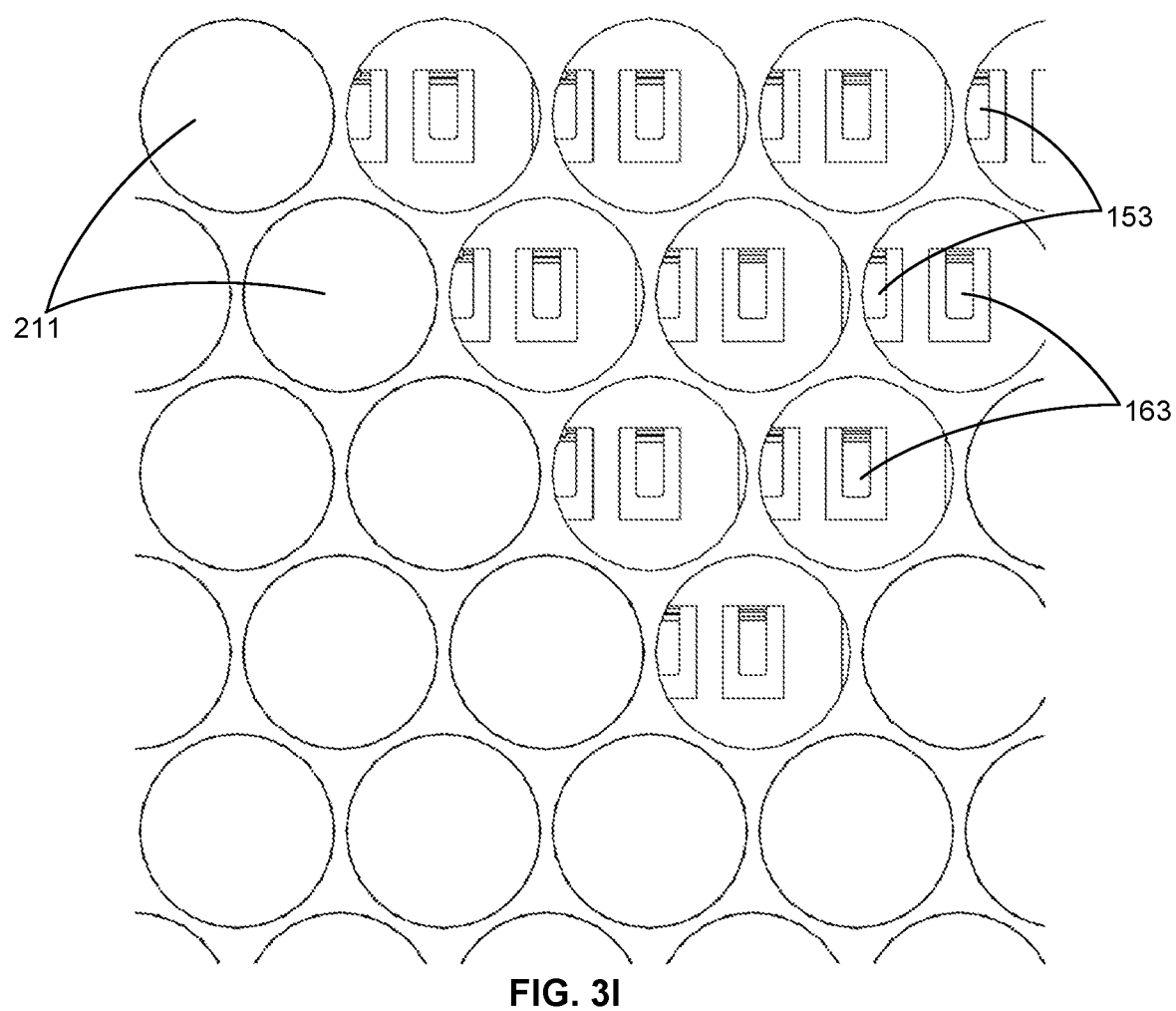
FIG. 3I illustrates a partial bottom view of an interconnect assembly, with some battery cells shown in place and other battery cells omitted in order to show negative and positive tabs, in accordance with exemplary embodiments.

FIG. 3I illustrates a partial bottom view of interconnect assembly 120, in accordance with exemplary embodiments. The illustration shows certain cells 211 removed, so the corresponding positive tab 163 and negative tab 153, and associated windows, are visible through the overmold material 380. In this example embodiment, the retaining structure 381 is in the shape of a plane of overmold material 380 configured with circular holes therethrough.

The interconnect assembly 120 is configured with a plurality of apertures to accept portions of a plurality of cells 211 therein. The interconnect assembly 120 facilitates close packing of the plurality of cells 211. The cells 211 may be disposed less than 1 mm from one another. A cell 211 in the plurality of battery cells has a first end and a second end distal from the first end, the first end and second end having a length therebetween.

Figure 4A:
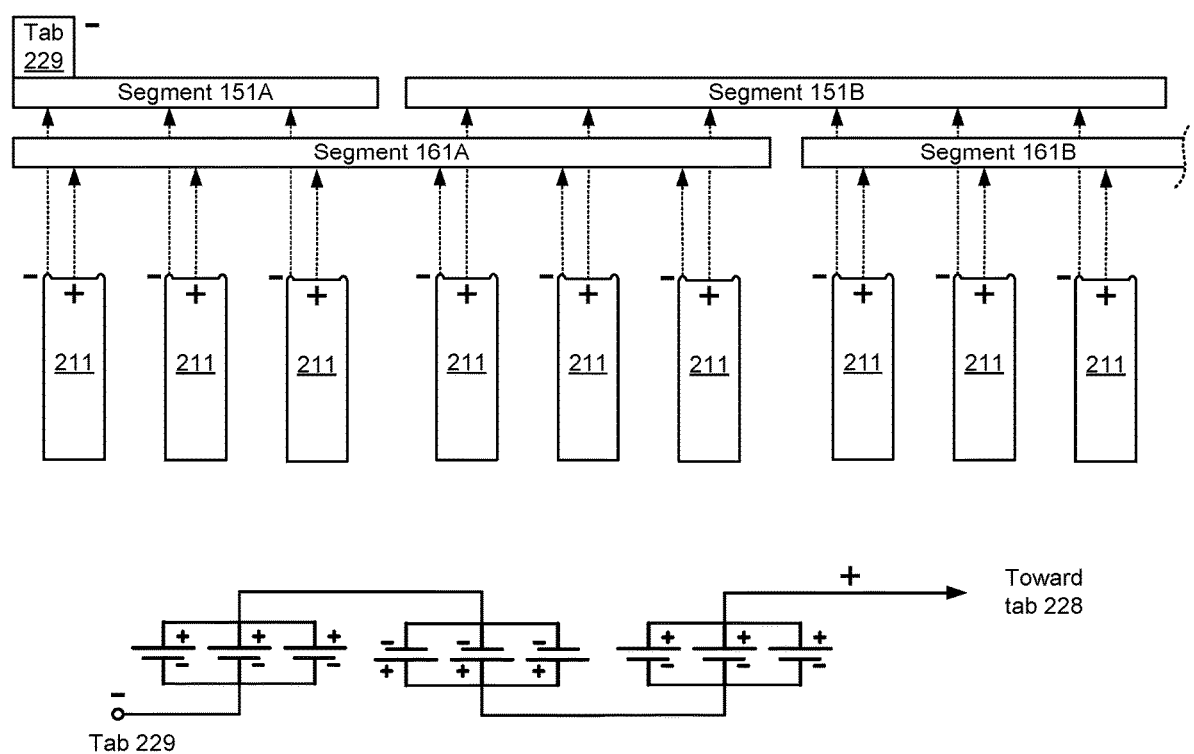
FIG. 4A illustrates electrical connections and paths in an interconnect assembly in accordance with various exemplary embodiments.
Figure 4B:
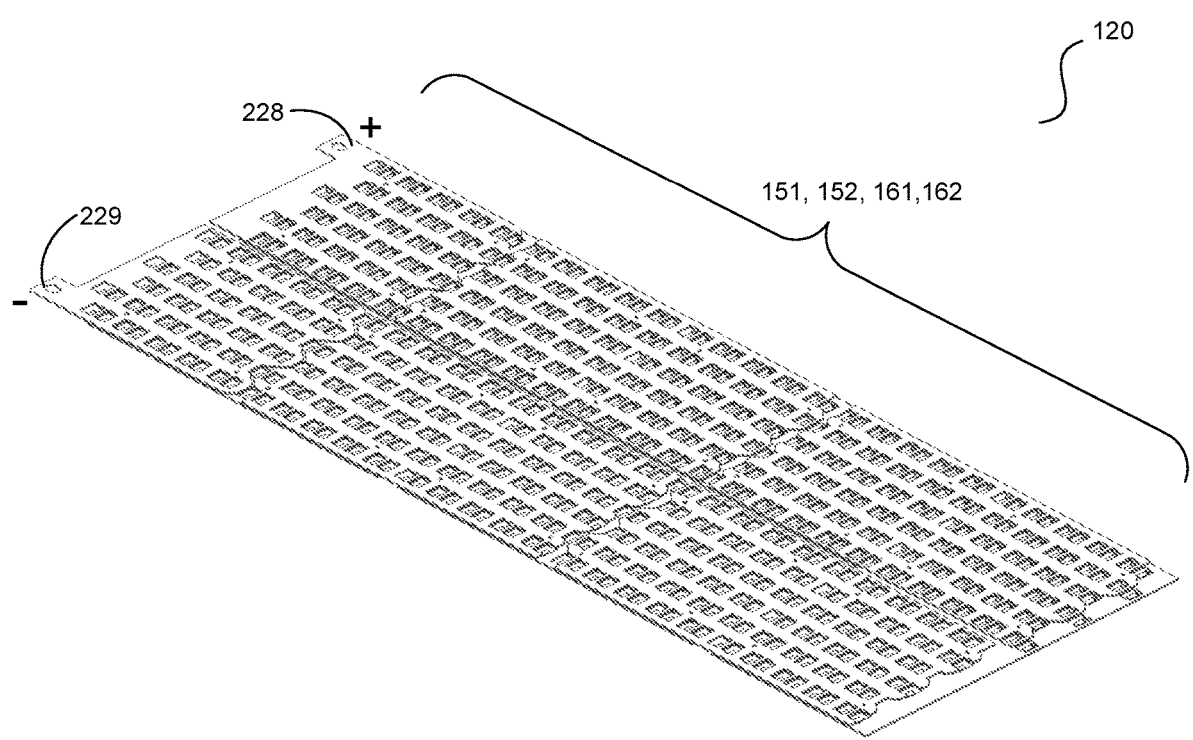
FIG. 4B illustrates plate components of an interconnect assembly having positive and negative terminals on a common end of the interconnect assembly in accordance with various exemplary embodiments.
Figure 4C:
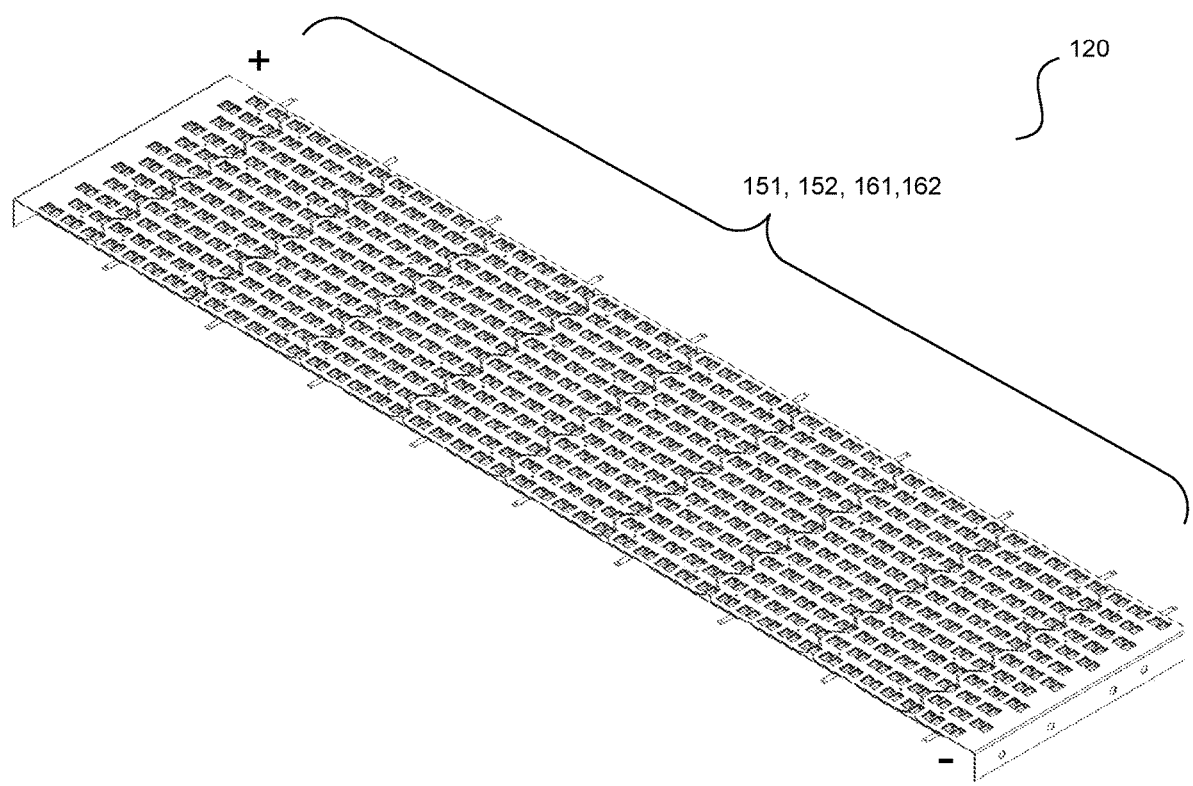
FIG. 4C illustrates plate components of an interconnect assembly having positive and negative terminals on opposing ends of the interconnect assembly in accordance with various exemplary embodiments.
Figure 4D:
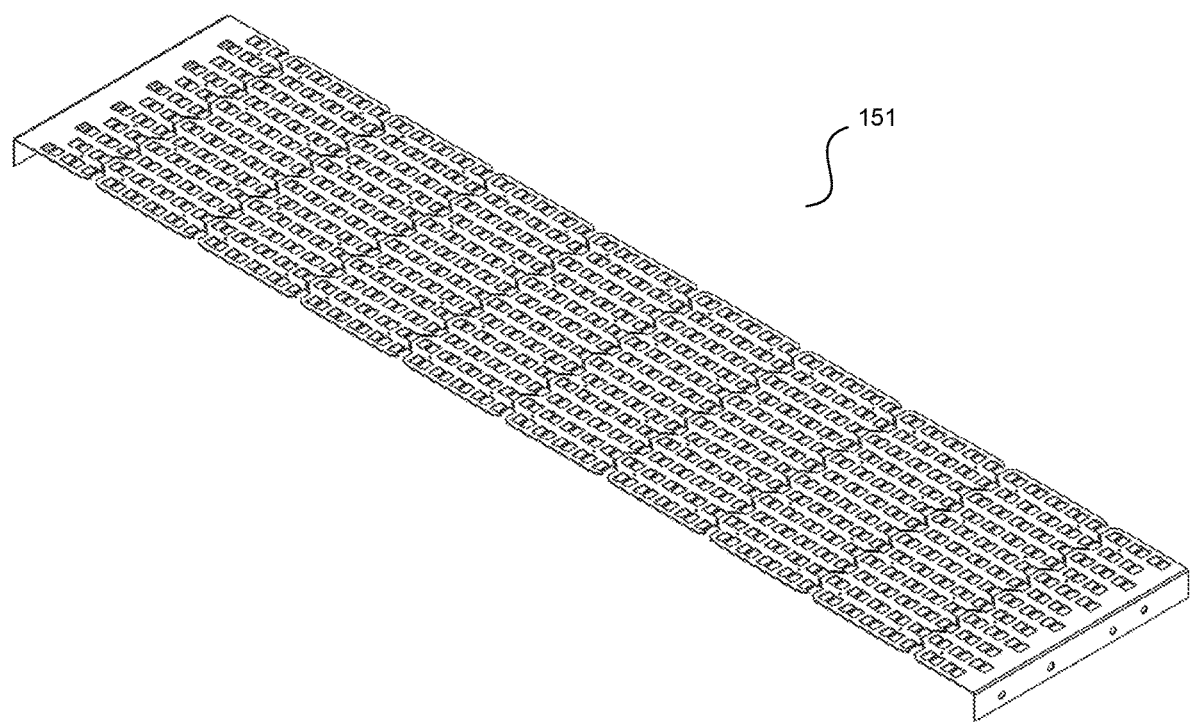
FIG. 4D illustrates a first current carrying plate of the interconnect assembly of FIG. 4C in accordance with various exemplary embodiments.
Figure 4E:
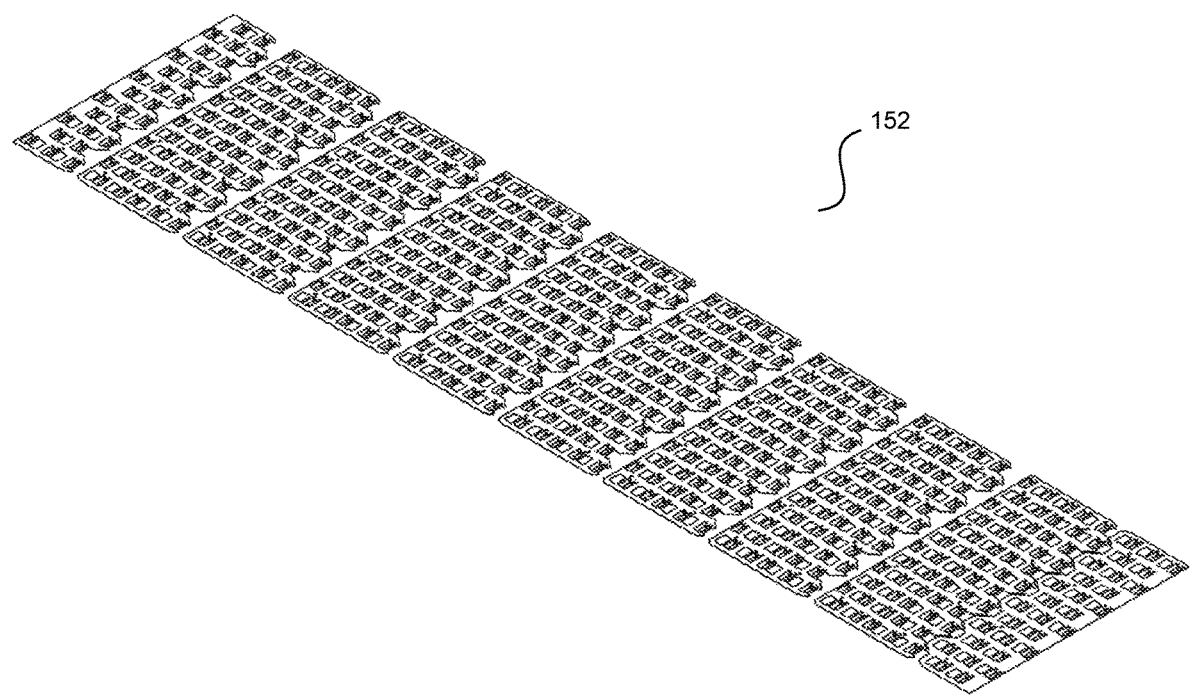
FIG. 4E illustrates a first interconnect plate of the interconnect assembly of FIG. 4C in accordance with various exemplary embodiments.
Figure 4F:
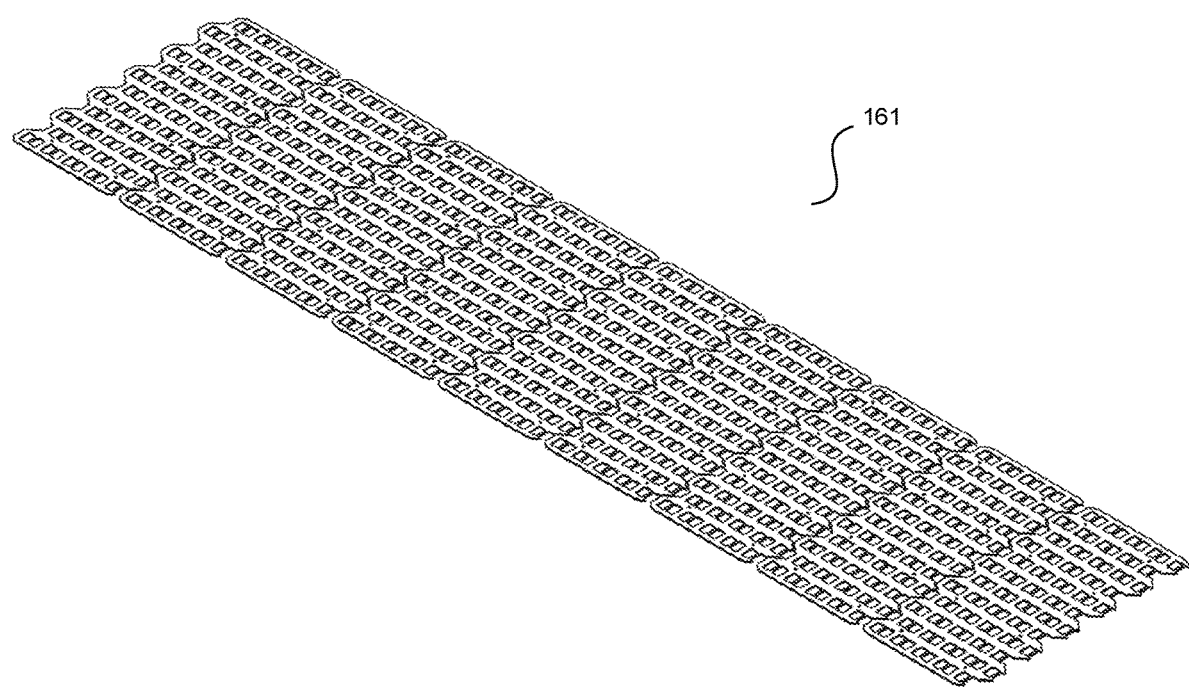
FIG. 4F illustrates a second current carrying plate of the interconnect assembly of FIG. 4C in accordance with various exemplary embodiments.
Figure 4G:
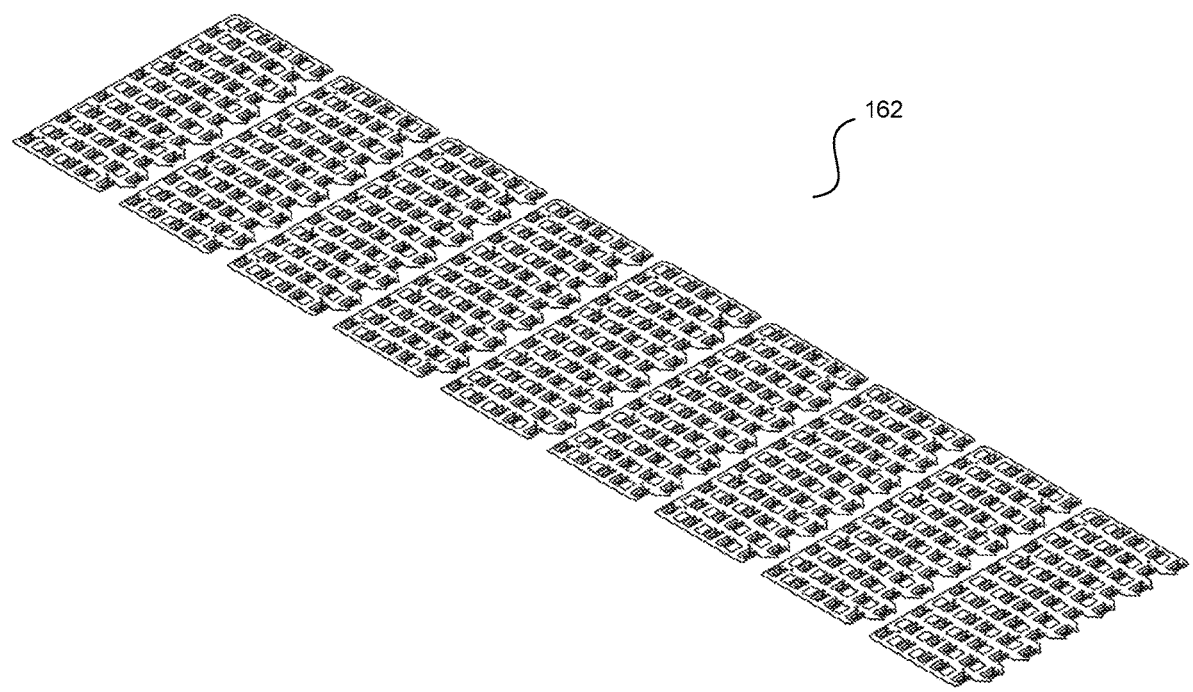
FIG. 4G illustrates a second interconnect plate of the interconnect assembly of FIG. 4C in accordance with various exemplary embodiments.

With reference now to FIG. 4A, in various exemplary embodiments, interconnect assembly 120 is configured to create a desired combination of parallel and series arrangements for cells 211 in battery pack 110. For example, a combination of interconnect assembly 120 and battery pack 110 may result in a "10s, 30p" arrangement (a serial arrangement of 10 groups, each group comprising 30 cells 211 in parallel). Moreover, any suitable arrangement may be implemented, for example "5s, 60p", "20s, 20p", "10s, 40p", and/or the like, as desired, in order to achieve desired current and voltage levels in electrical system 100.

For example, with momentary reference to FIGS. 2C through 2F and 4B, in one exemplary embodiment, when an exemplary battery pack 110 comprising 300 cells 211 is coupled to interconnect assembly 120, an electrical path traverses the following components in order: negative terminal 229→151A→161A→151B→161B→151C→161C→151D→161D→151E→161E→151F→positive terminal 228, in order to form a "10s, 30p" arrangement. However, any suitable routing and/or wiring path may be utilized, as desired. Moreover, it will be appreciated that interconnect assembly 120 may be sized and/or scaled to any appropriate voltage, current, and/or size, for example by use of a suitable number of segments in first current carrying plate 151 and second current carrying plate 161.

In certain exemplary embodiments interconnect assembly 120 also serves as a lid to a vapor chamber within which cells 211 are at least partially located and/or disposed. In this example embodiment, interconnect assembly 120 is configured with various seals, retaining mechanisms, sealants, potting materials, and/or the like, so that interconnect assembly 120 may receive a portion of multiple cells 211 while preventing and/or reducing leakage and/or evaporation of a working fluid from within a vapor chamber. For example, in one exemplary embodiment interconnect assembly 120 comprises a rigid primary material overmolded with an elastomer, in order to provide a compressible seal at the interface where each cell 211 is inserted into interconnect assembly 120. In other exemplary embodiments, o-rings or other mechanical sealing approaches may be utilized. Moreover, a suitable potting material may be utilized in order to seal the joints between cells 211 and interconnect assembly 120. For example, in various exemplary embodiments the joints between cells 211 and interconnect assembly 120 may be sealed via a flexible or semi-flexible potting material, adhesive, sealant, epoxy, or hot melt; the sealing material may be silicone, urethane, polyurethane, polyester, or polyamide based and/or may comprise any other suitable sealing and/or adhesive materials or compounds.

In some exemplary embodiments, retaining structure 381 has any suitable shape, for example, a ring structure, with contiguous surface contact or intermittent surface contact with cells 211. Moreover, shapes other than circular can be used, especially if cells 211 are not cylindrical (for example, rectangular cells). Contact rings can be formed from straight wall segments, or be smoothly circular with no corners.

In various exemplary embodiments, retaining structure 381 is configured as a plurality of post-like structures. Posts are formed from retaining structure 381 in a three-sided post shape. Posts can include indents or other shapes to fit securely to the shape of cells 211. However, any suitable shape for posts may be utilized. In an example embodiment, the post is made of the overmold material 380. Moreover, any suitable number of posts may be utilized as retaining structure 381. For example, each cell 211 may be in contact with at least one post, or at least two posts, or at least three posts, or at least four posts. In some exemplary embodiments, the posts are configured with a length of about 5 mm. Additionally, certain posts (and/or all posts) may extend from an inner surface of interconnect assembly 120 all the way to a corresponding inner surface on the opposite side near the distal end of cell 211. The posts may be sized and/or configured to fit entirely into spaces that exist between cells 211 when cells 211 are packed as close as geometrically possible. The posts may extend from interconnect assembly 120 in a direction generally parallel to the cylindrical axis of the cells 211, or along the length of a particular cell 211.

In an exemplary embodiment, a method for interconnecting a battery pack comprising a plurality of cells comprises placing the interconnect assembly over the cells, and connecting the tabs of the interconnect assembly to the terminals of the cells. In some embodiments, a retaining structure is coupled to the cells in order to align them prior to coupling the interconnect assembly. The interconnect assembly may be located and/or positioned with respect to the retaining structure in order to align for proper connection with the cells.

Figure 5A:
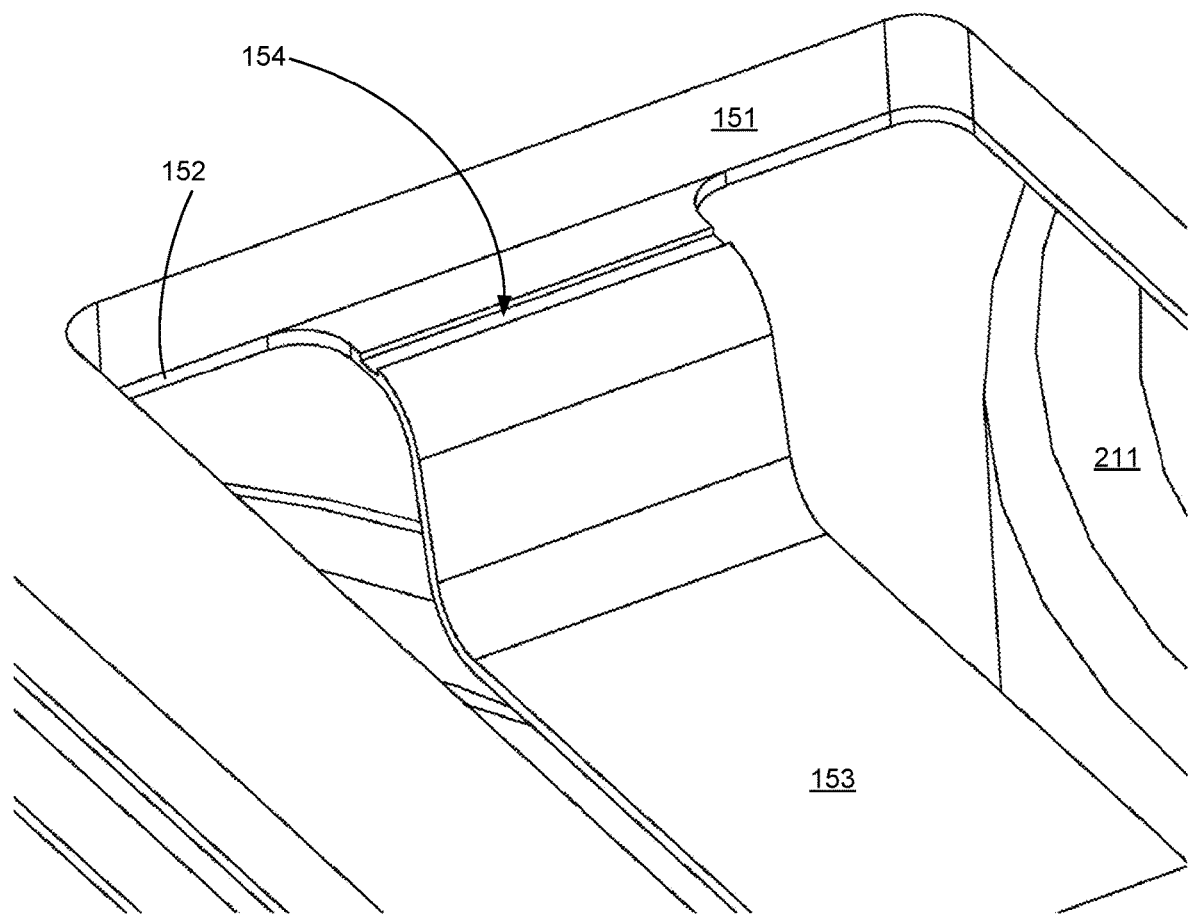
FIGS. 5A and 5B illustrate various fuse designs for tabs, in accordance with exemplary embodiments.
Figure 5B:
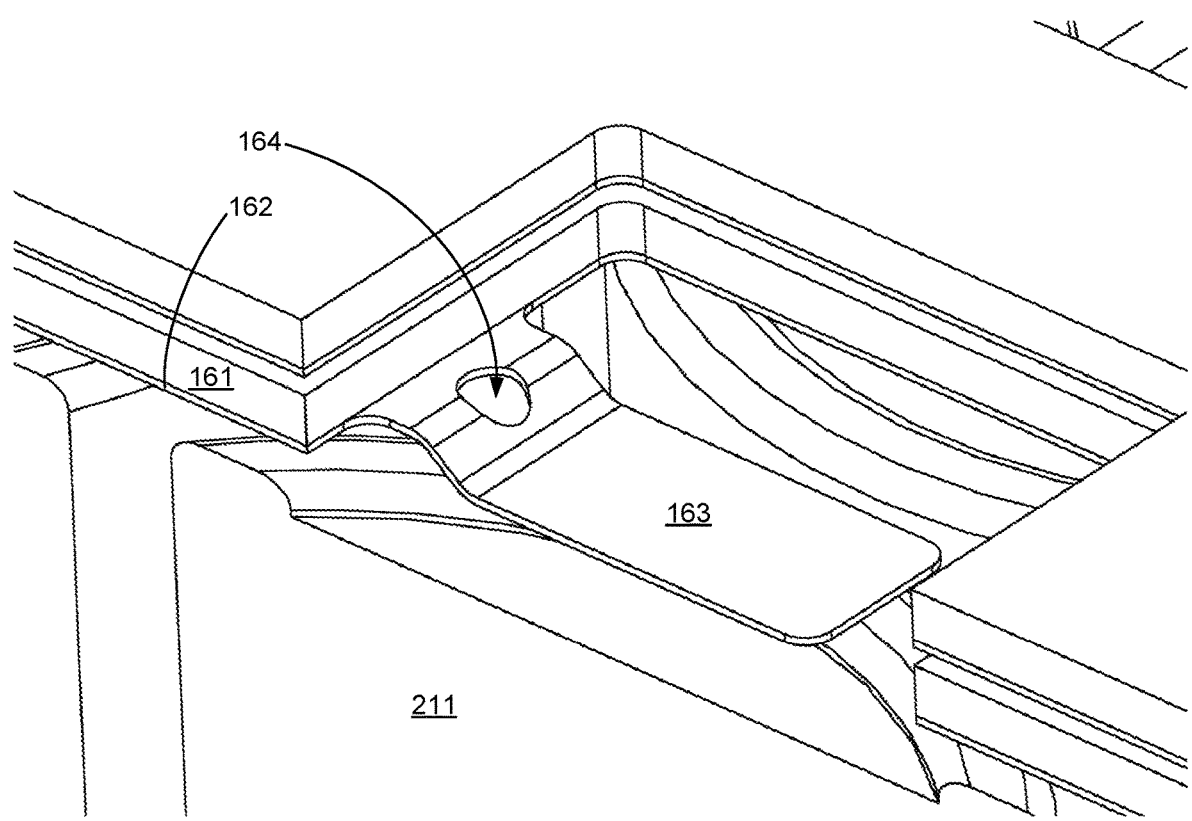

FIGS. 5A and 5B illustrate various fuse designs for tabs, in accordance with example embodiments. In a first example embodiment, a tab 163 is configured with a hole 164 in the tab. In another example embodiment, a tab 153 has a narrow neck 154 (for example, a trench-like structure) in the tab. The hole 164 or the narrow neck 154 in the tab may be located anywhere that an open on the tab would isolate the connected cell 211 from the other cells and the rest of the electrical circuit of interconnect assembly 120. For example, the hole 164 or neck 154 may be located between the point of connection to the cell 211 and the main body of the interconnect plate 152, 162.

The hole 164 has a diameter, and the narrow neck 154 has a portion that is narrower than the rest of the tab. The dimensions of the diameter or thickness are designed such that the tab functions as a fuse by reducing the total cross sectional area to the point that a particular amperage for a long enough time will melt or vaporize the tab at that location. Thus, if there is a short or other high amperage situation with respect to that cell 211, it will be fused out of the circuit and protect the rest of battery pack 110 and electrical system 100. It will be appreciated that other suitable structures and methods may be used to create a fuse in the tabs.

Figure 7A:
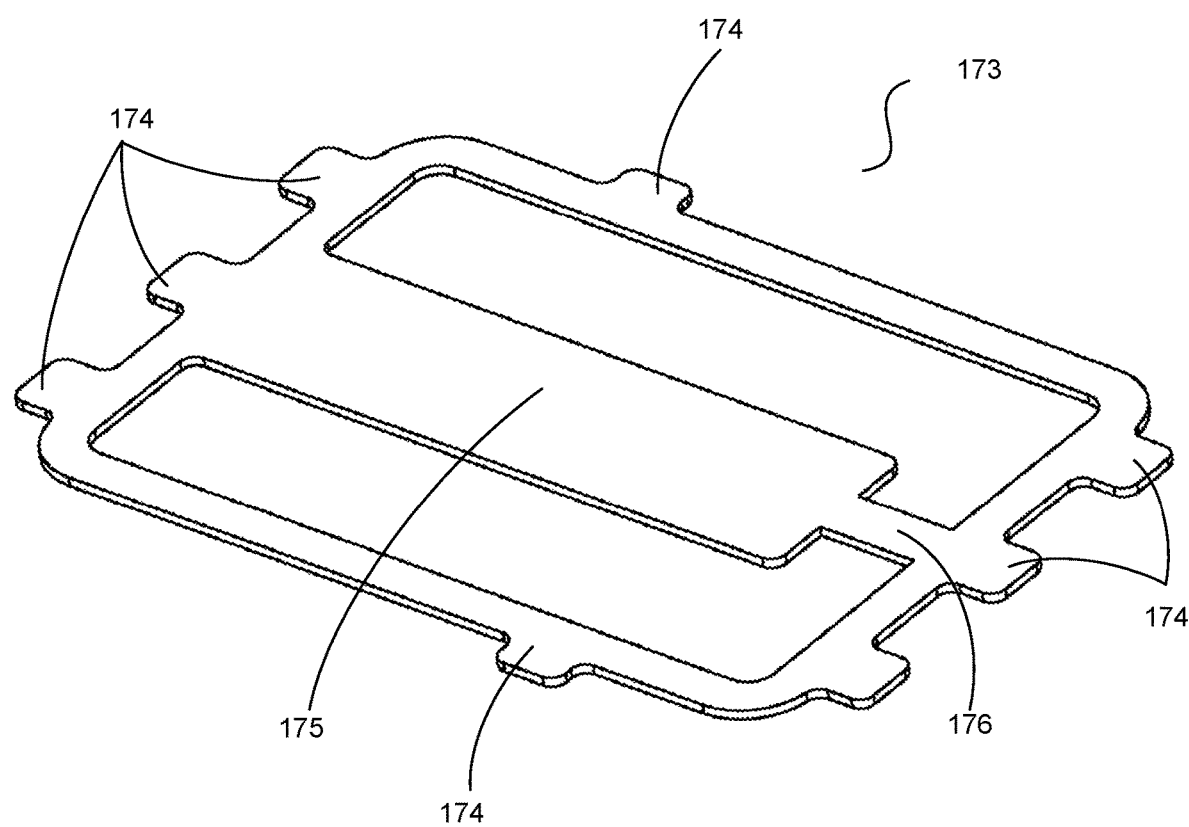
FIG. 7A illustrates a cell coupling tab for an interconnect assembly in accordance with various exemplary embodiments.
Figure 7B:
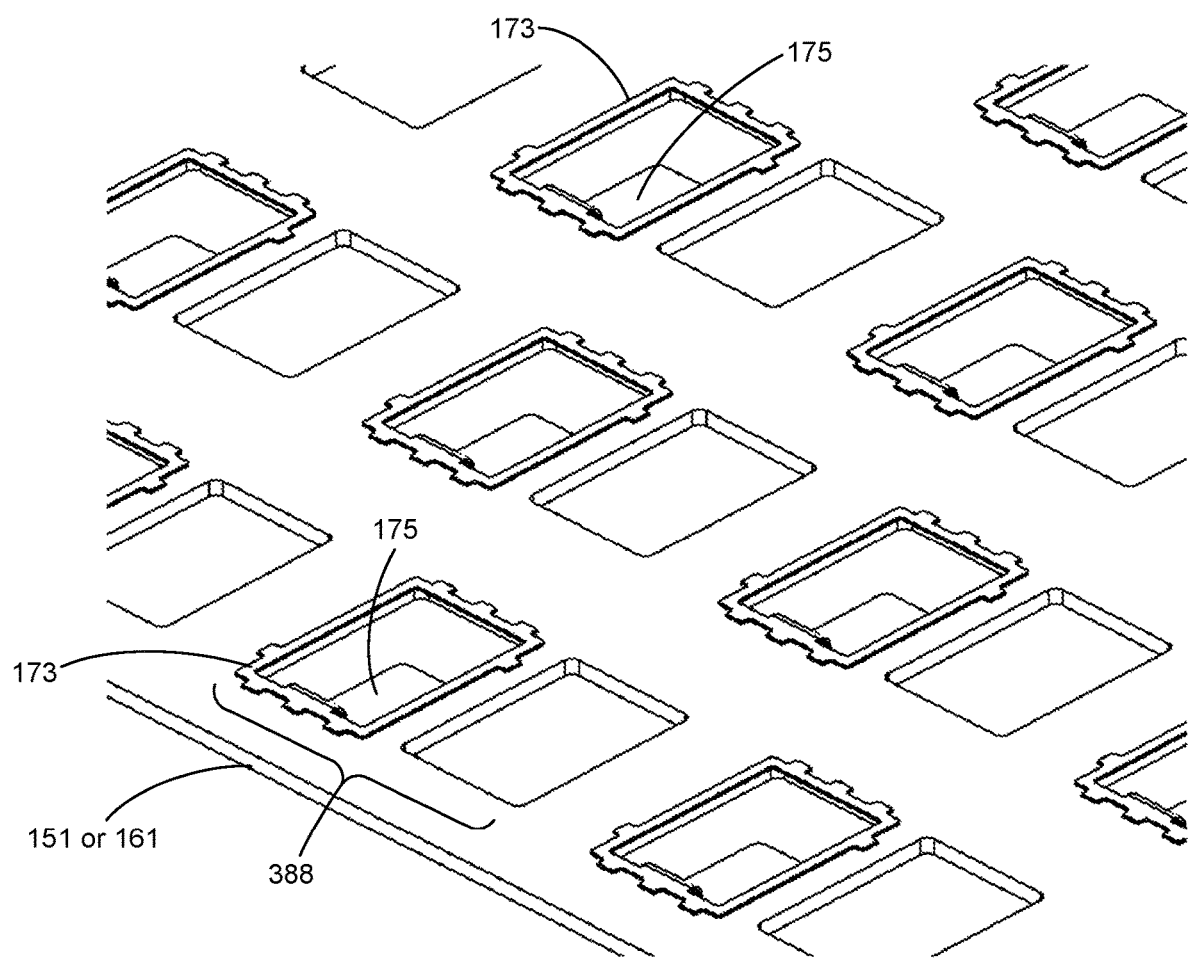
FIG. 7B illustrates the cell coupling tab of FIG. 7A coupled to a current carrying plate of an interconnect assembly in accordance with various exemplary embodiments.
Figure 7C:
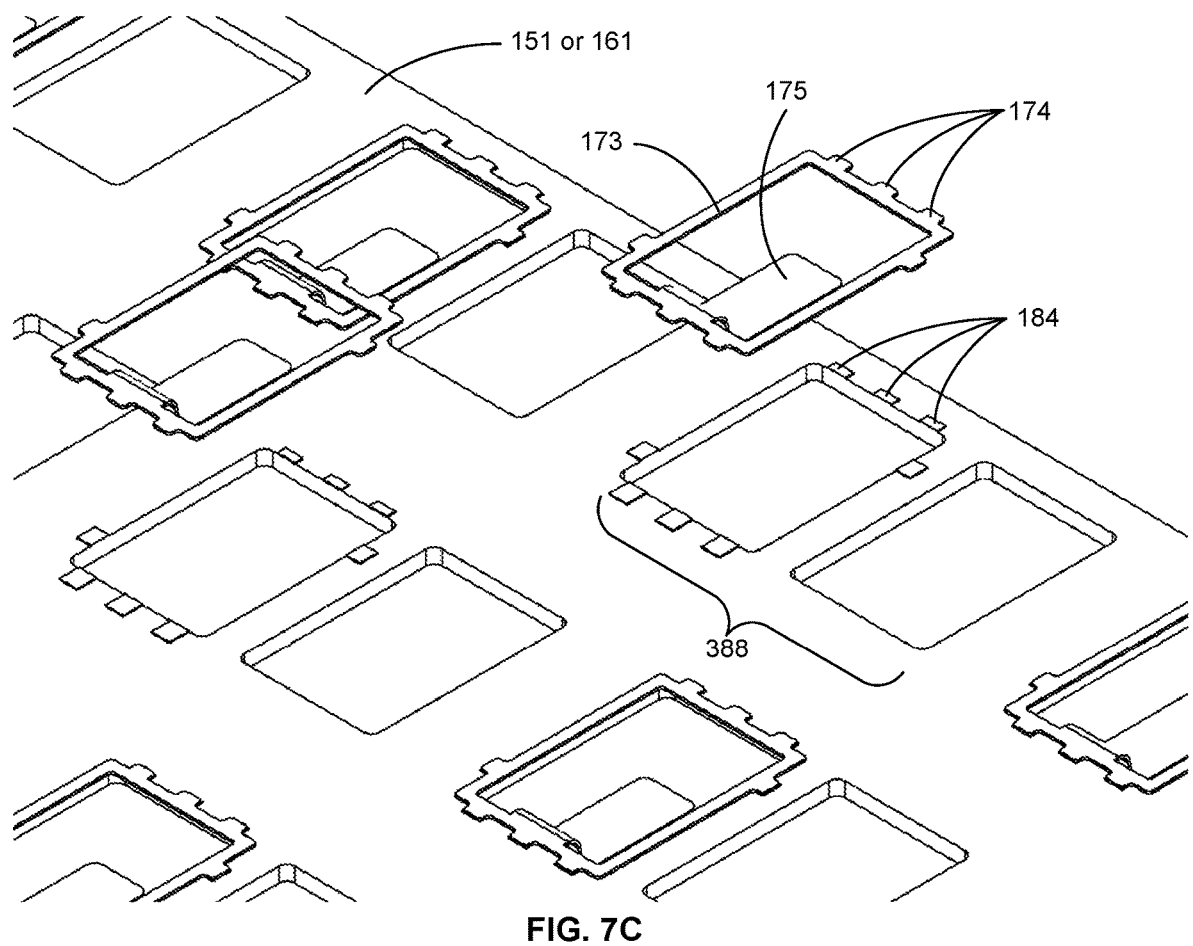
FIG. 7C illustrates placement and coupling of the cell coupling tab of FIG. 7A to a current carrying plate of an interconnect assembly in accordance with various exemplary embodiments.

With reference now to FIGS. 7A, 7B, and 7C, in various exemplary embodiments, portions of interconnect assembly 120 may be configured to be compatible with and/or optimized for creation via "pick and place" component assembly systems, for example surface mount technology placement robots commonly utilized in the electronics assembly industry. For example, a portion of layer 121 and/or layer 122 may comprise a set of tab assemblies 173. Each tab assembly 173 is configured with a plurality of plate connection points 174, which may comprise flanges, extensions, and/or the like. Moreover, tab assembly 173 is configured with a cell tab 175. Cell tab 175 is configured to couple to a cell 211 (for example, to form a negative tab 153 or a positive tab 163). Tab assembly 173 may also be configured with a frangible link 176, which may be severed as desired, for example when cell tab 175 is bent, pressed, and/or otherwise brought into contact with a cell 211, when tab assembly 173 is placed into contact with a first current carrying plate 151 (or second current carrying plate 161), or the like.

In various exemplary embodiments, a plurality of tab assemblies 173 may be coupled to a current carrying plate (for example first current carrying plate 151), in lieu of (and/or to serve a similar purpose to) an interconnect plate (for example, first interconnect plate 152). For example, a tab assembly 173 may be placed in a window of a window pair 388 in order to facilitate a connection with a corresponding cell 211. Moreover, any suitable number of tab assemblies 173 may be coupled to a particular current carrying plate in any suitable configuration, as desired, in order to facilitate interconnection with a desired number and configuration of cells 211.

With reference now to FIG. 7C, in various exemplary embodiments a first or second current carrying plate 151, 161 may be configured with a series of solder pads 184. Solder pads 184 are configured to corresponding to plate connection points 174 on tab assemblies 173. Solder pads 184 may be formed via any suitable process, for example stencil printing in connection with a mask. Once solder pads 184 are formed, tab assemblies 173 are picked and placed into contact with solder pads 184. The resulting assembly is then heated to reflow the solder and thereby couple tab assemblies 173 to first and/or second current carrying plate 151, 161.

Figure 8A:
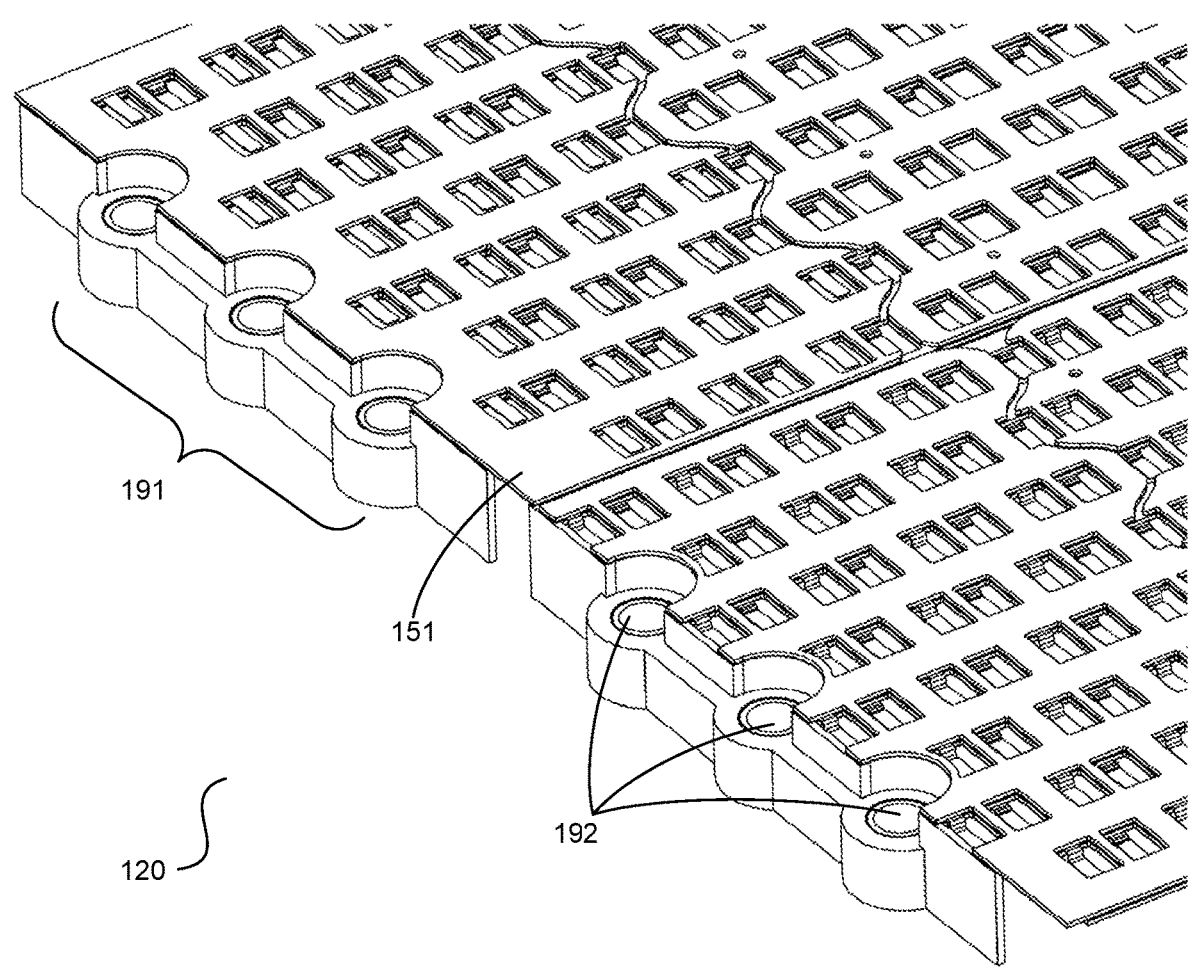
FIGS. 8A and 8B illustrate an interconnect assembly coupled to a socket bus bar in accordance with various exemplary embodiments.
Figure 8B:
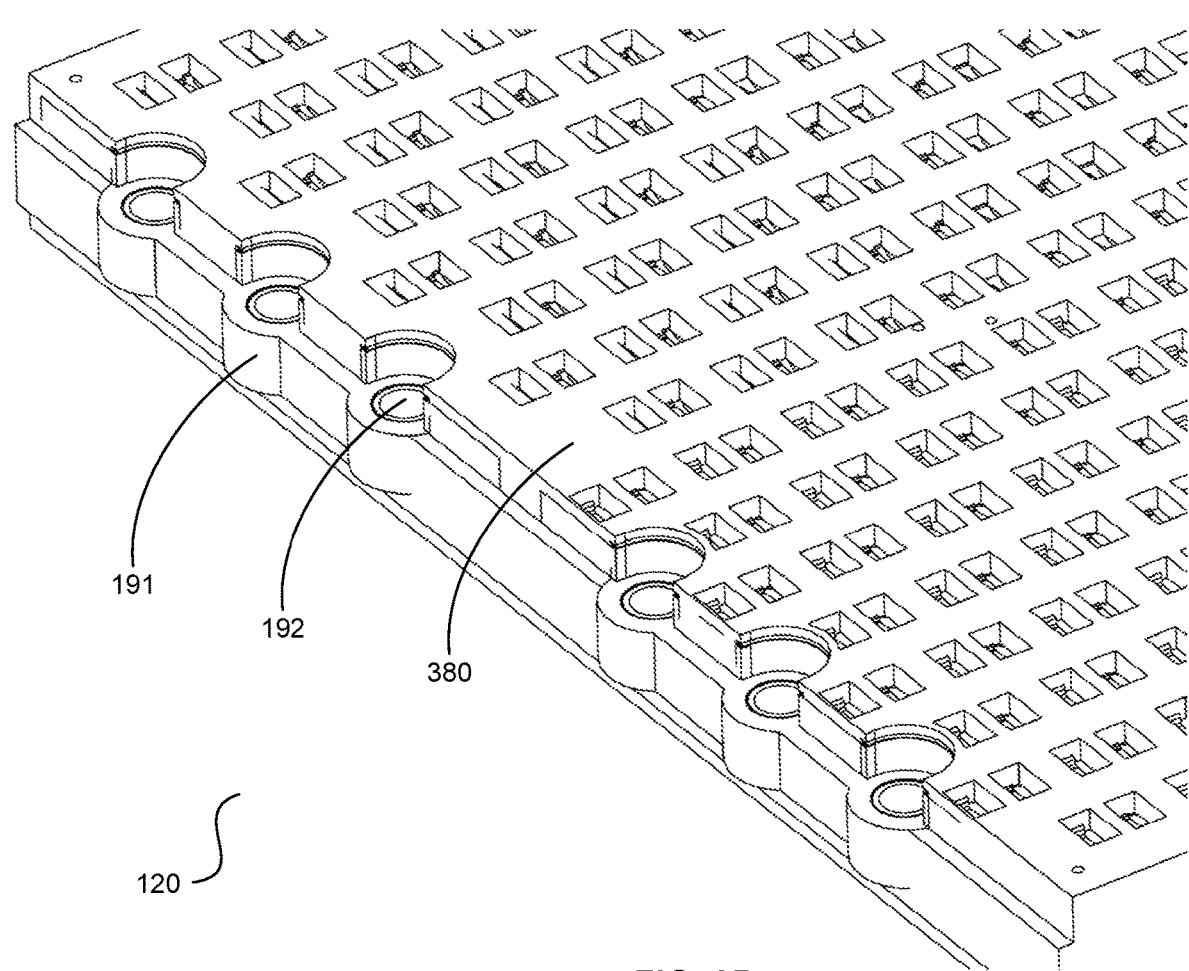

Turning now to FIGS. 8A and 8B, in various exemplary embodiments interconnect assembly 120 comprises (and/or is configured to couple to) one or more socket bus bars 191. For example, a first socket bus bar 191 may function as (and/or take the place of) a positive tab 228, and a second socket bus bar 191 may function as (and/or take the place of) a negative tab 229. However, socket bus bars 191 may be located in any suitable location within interconnect assembly 120. Socket bus bar 191 comprises a material configured to effectively conduct electrical current, and is configured with one or more holes 192. Holes 192 are configured to act as receptacles for electrical connections, for example as "female" connector portions corresponding to "male" connector portions (e.g., "banana" style connectors and/or the like). In this manner, interconnect assembly 120 may be electrically connected to other components of electrical system 100 (and/or to external components) without the use of fasteners, enabling "plug and play" operation.

Figure 9:
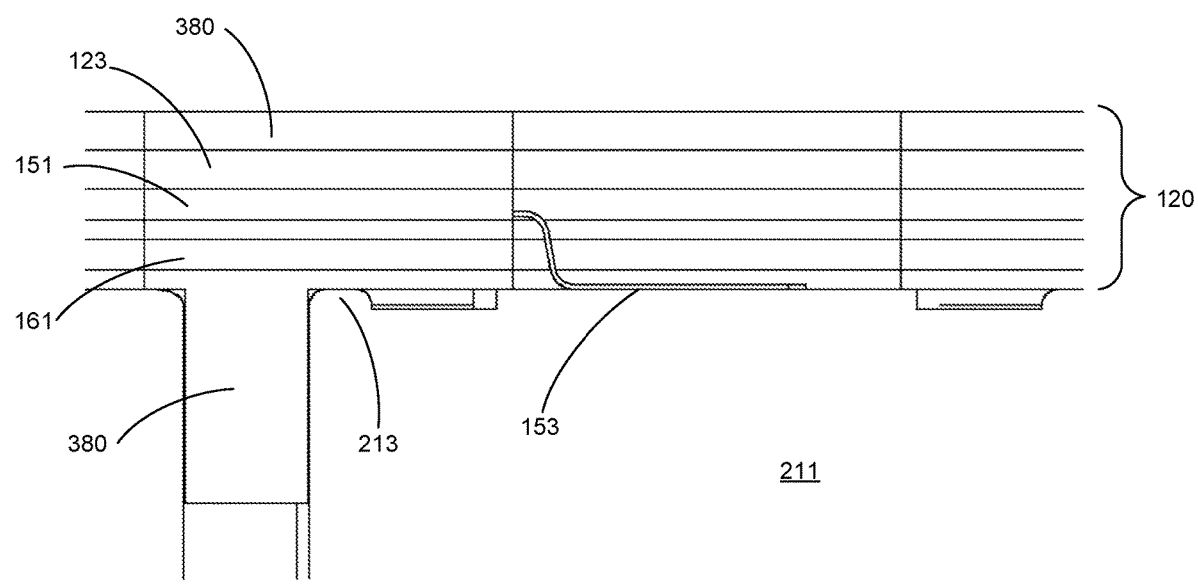
FIG. 9 illustrates a side cutaway view of an interconnect assembly configured in accordance with principles of printed circuit board (PCB) manufacturing in accordance with various exemplary embodiments.

With reference now to FIG. 9, in various exemplary embodiments portions of interconnect assembly 120, for example first layer 121 and/or second layer 122, may be implemented via a printed circuit board (PCB) assembly and/or components or materials thereof. For example, in an interconnect assembly 120, a first current carrying layer 151 may comprise a metal layer of a metal-backed and/or metal-core PCB. Stated another way, in interconnect assembly 120, metal PCB layers that, in other applications, were typically utilized for structural and/or thermal purposes (rather than electrical connections), may be utilized to carry current between cells 211. Other PCB layers, for example FR-4 glass reinforced epoxy material, may be used to form portions of first layer 121 and/or second layer 122 and/or selectively insulate them from one another.

In this exemplary interconnect assembly 120, second current carrying layer 161 may comprise a different metal layer of the same PCB incorporating first current carrying layer 151; alternatively, second current carrying layer 161 may comprise a metal layer of a second PCB. Moreover, sensing layer 123 may be embodied in the traces of the various PCBs. First layer 121 and/or second layer 122 may be coupled together, coated with overmold material 380, coupled to a series of tab assemblies 173, and/or the like, as suitable, in order to form interconnect assembly 120.

With reference now to FIGS. 10A through 17F, in various exemplary embodiments, an interconnect assembly 120 may be configured with various conductive plates 128 to form conductive layers 121, 122; conductive plates 128 may be sized and configured such that a conductive plate 128 may serve a similar function to (and/or be utilized in lieu of) both a current carrying plate 151 and an interconnect plate 152 as seen in other exemplary embodiments above. Stated another way, in some exemplary embodiments interconnect assembly 120, rather than being configured with some plates whose primary function is connection with cells 211 and other plates whose primary function is to pass current between cells 211, is instead configured with plates that serve to provide connective functions and current carrying functions simultaneously.

Moreover, interconnect assembly 120 may be configured with conductive plates 128 forming one or more conductive layers 121, 122 in a manner which distributes, splits, allocates, or otherwise at least partially divides current from cells 211 within battery pack 110 among the conductive plates 128, thus reducing heating and/or resistive losses associated with a particular conductive plate 128 and/or permitting the use of lower cost and/or higher resistivity materials. Additionally, interconnect assembly 120 may be configured with features which facilitate automated handling and/or processing of portions thereof, for example automated stamping, stacking, welding, and/or other coupling, linking, or joining of conductive plates 128. Moreover, interconnect assembly 120 may be configured with various insulating layers and/or other components such that overmolding of interconnect assembly 120 may be optional, thus reducing the volume and/or weight of interconnect assembly 120. Additionally, interconnect assembly 120 may be configured to "float" atop a corresponding battery pack 110 (in other words, interconnect assembly 120 may be coupled to battery pack 110 only at the anodes and cathodes of cells 211 within battery pack 110, rather than also being coupled to mechanical portions of battery pack 110 or an enclosure thereof); in this manner, interconnect assembly 120 may be made more vibration and/or shock resistant, thus improving the longevity of electrical connections between interconnect assembly 120 and cells 211. Furthermore, in various embodiments, voltage may be sensed directly from the conductive layers without a separate sensing layer. However, in other embodiments, a discrete sensing layer can be utilized.

Figure 10A:
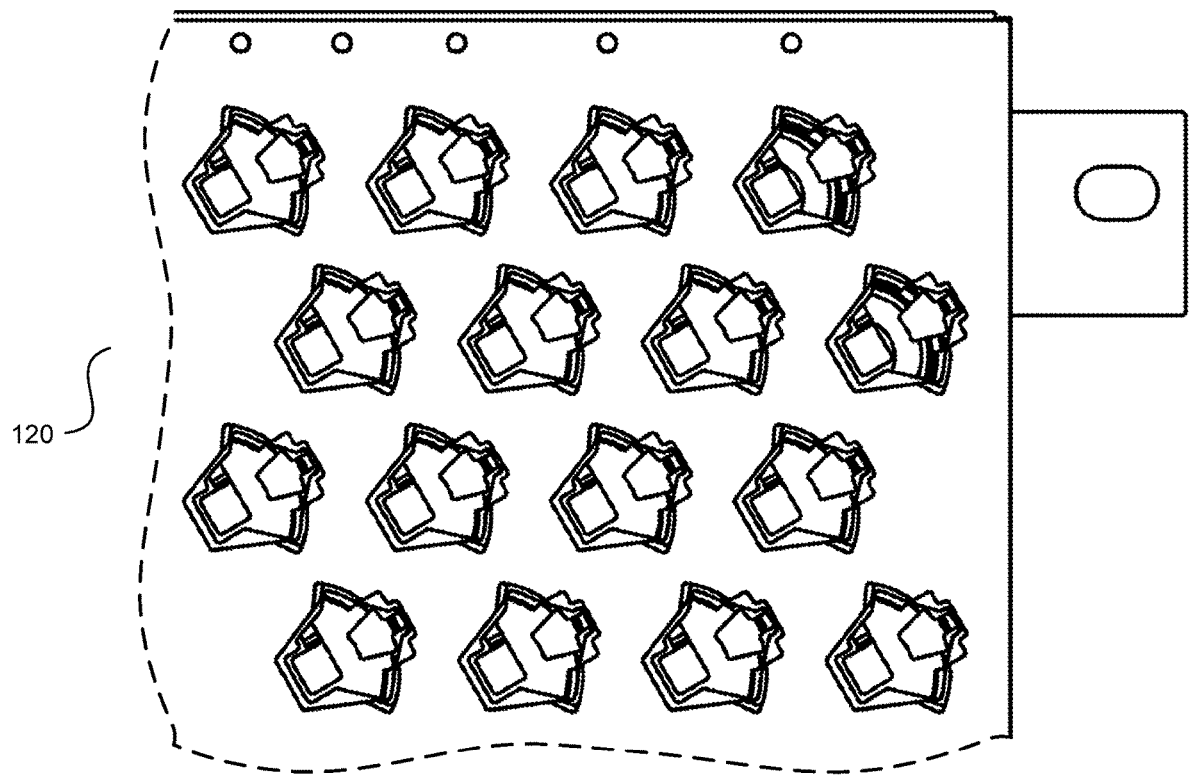
FIG. 10A illustrates a top view of portion of an interconnect assembly in accordance with various exemplary embodiments.
Figure 10B:
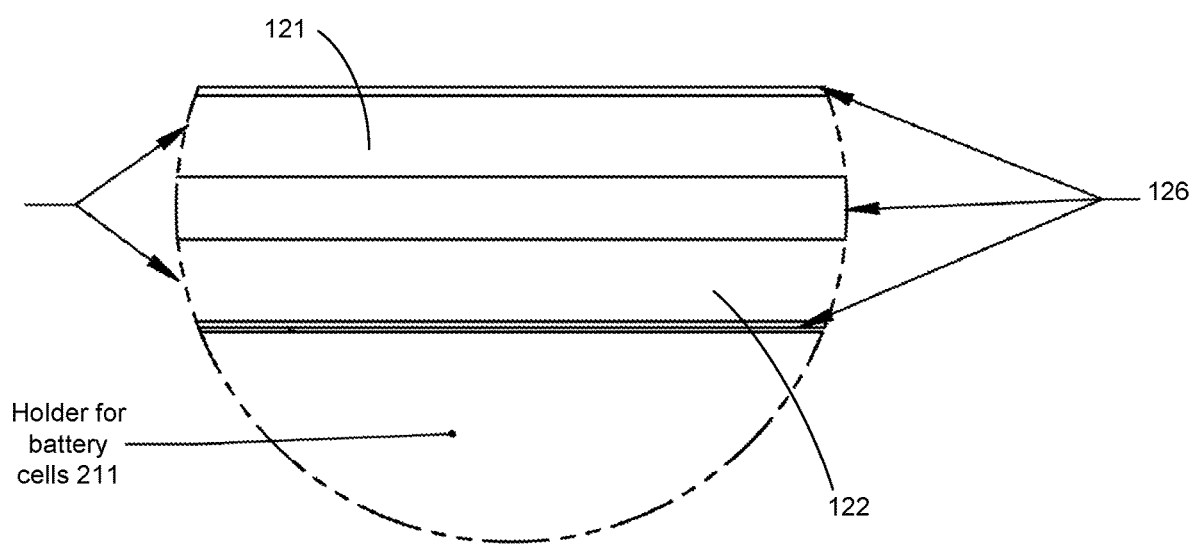
FIG. 10B illustrates a cut-away side view showing layers of an interconnect assembly in accordance with various exemplary embodiments.

With reference now to FIGS. 10A and 10B, in various exemplary embodiments an interconnect assembly 120 comprises a number of conductive layers, for example a first conductive layer 121 and a second conductive layer 122. Moreover, any suitable number of conductive layers may be utilized, for example three conductive layers, four conductive layers, and so forth. In these exemplary embodiments, interconnect assembly 120 and/or layers thereof are not configured with a "thin" layer (i.e., interconnect plate 152)

and a "thick layer" (i.e., current carrying plate 151), as described in connection with various prior example embodiments, but rather with components that provide connective and current carrying capabilities simultaneously. An insulating layer 126 may be disposed between conductive layer 121 and conductive layer 122. Additionally, an insulating layer 126 may be disposed atop conductive layer 121 and/or below conductive layer 122 (or vice versa); stated generally, an insulating layer or layers 126 may be disposed at any location in interconnect assembly 120 wherein electrical insulating properties are desired. The various insulating layers 126 are shaped, positioned, and/or otherwise configured to reduce and/or prevent undesired electrical connections and/or shorts in interconnect assembly 120. In various exemplary embodiments, insulating layer 126 comprises a dielectric material such as plastic, polypropylene, polyimide, polycarbonate, glass-reinforced epoxy laminate (e.g., FR-4), and any other electrically insulating material. Insulating layer 126 may comprise a single layer structure; alternatively, insulating layer 126 may comprise multiple layers of a common material or differing materials.

Figure 10C:
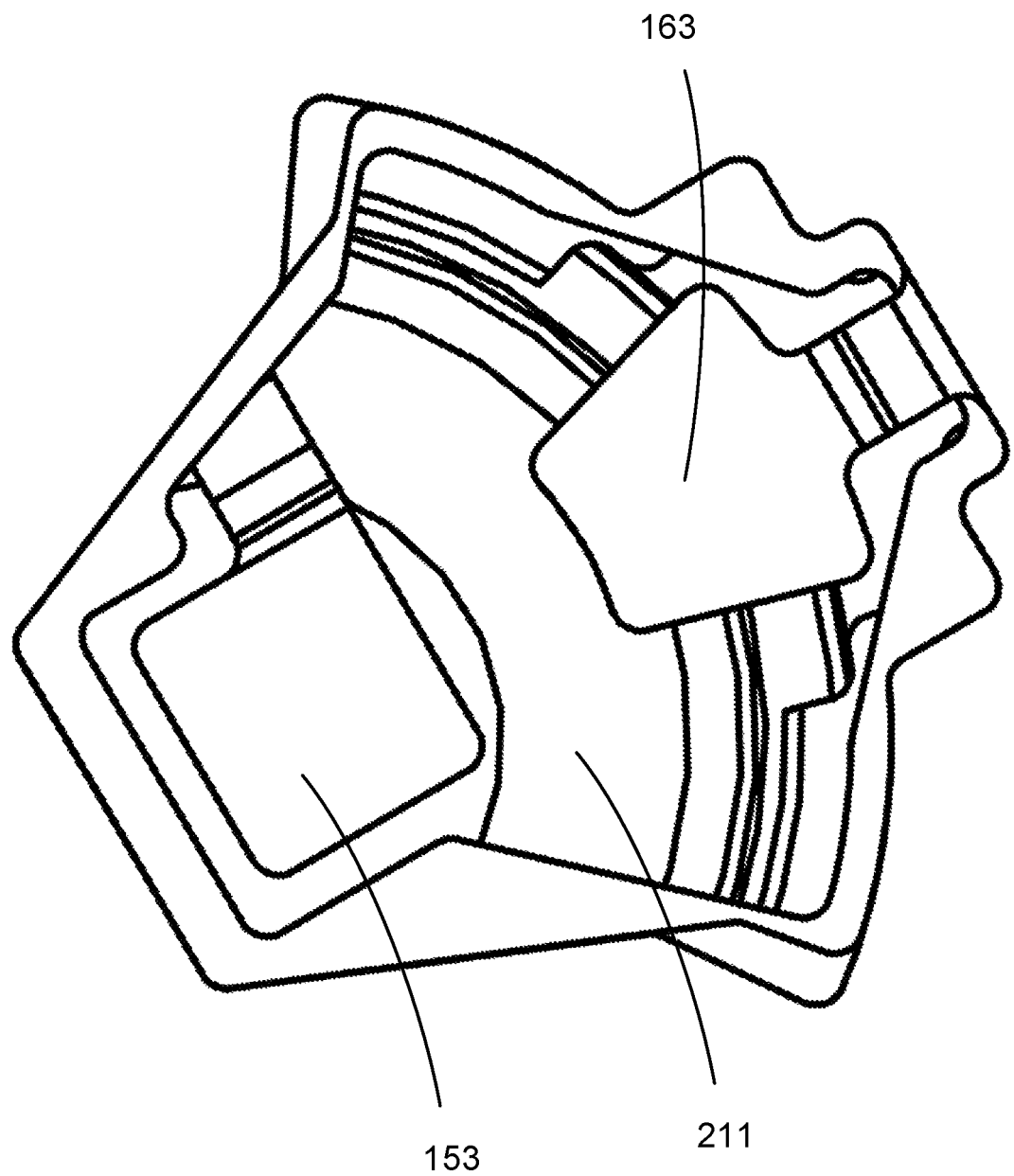
FIG. 10C illustrates a view of a portion of an interconnect assembly, showing tabs coupled to a battery cell in accordance with various exemplary embodiments.
Figure 10D:
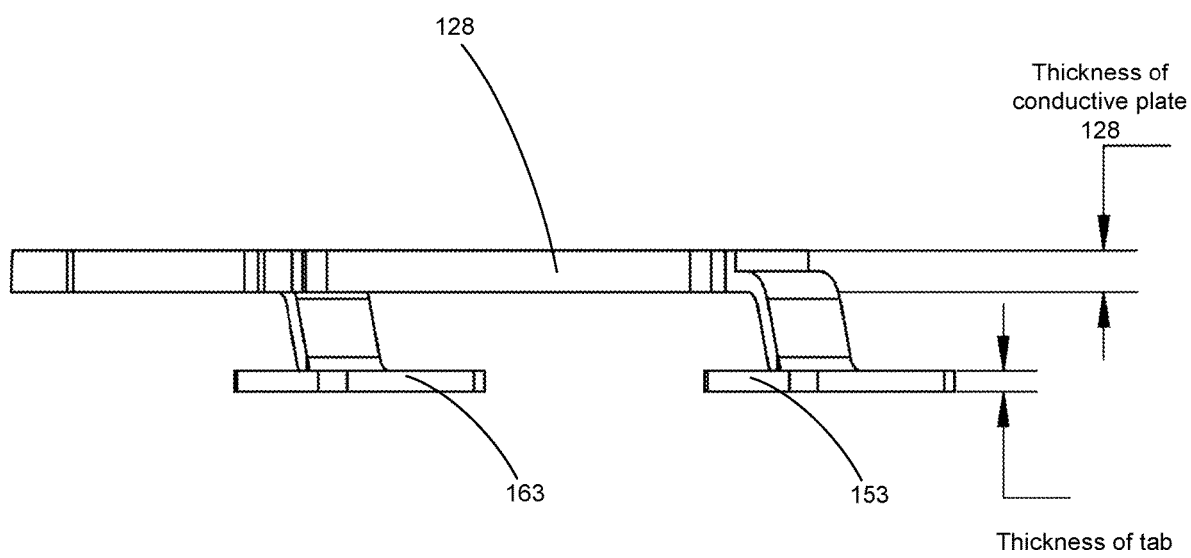
FIG. 10D illustrates a side view of a layer of an interconnect assembly, showing tabs bent out of the plane of the layer to facilitate coupling to a battery cell in accordance with various exemplary embodiments.
Figure 10E:
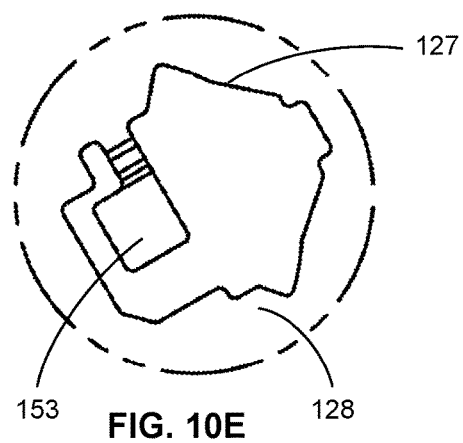
FIG. 10E illustrates a window disposed in a conductive plate of an interconnect assembly, with a tab for connection to a positive terminal of a battery cell extending into the window in accordance with various exemplary embodiments.
Figure 10F:
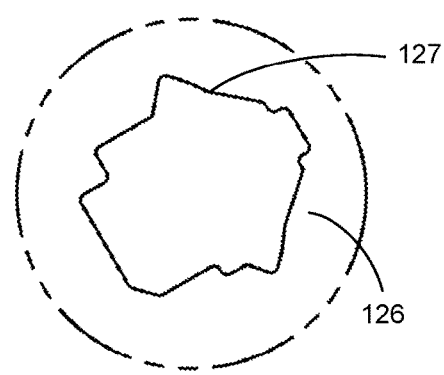
FIG. 10F illustrates a window disposed in an insulating layer of an interconnect assembly, the window corresponding in shape to the window of FIG. 10E, in accordance with various exemplary embodiments.
Figure 10G:
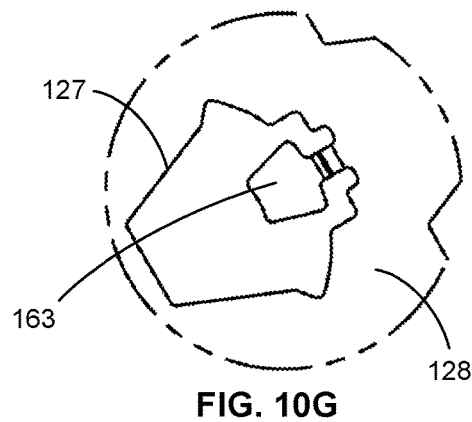
FIG. 10G illustrates a window disposed in a conductive plate of an interconnect assembly, with a tab for connection to a negative terminal of a battery cell extending into the window in accordance with various exemplary embodiments.
Figure 10H:
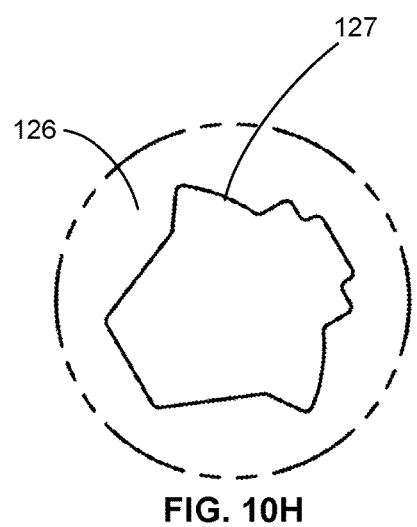
FIG. 10H illustrates a window disposed in an insulating layer of an interconnect assembly, the window corresponding in shape to the window of FIG. 10G, in accordance with various exemplary embodiments.
Figure 11A:
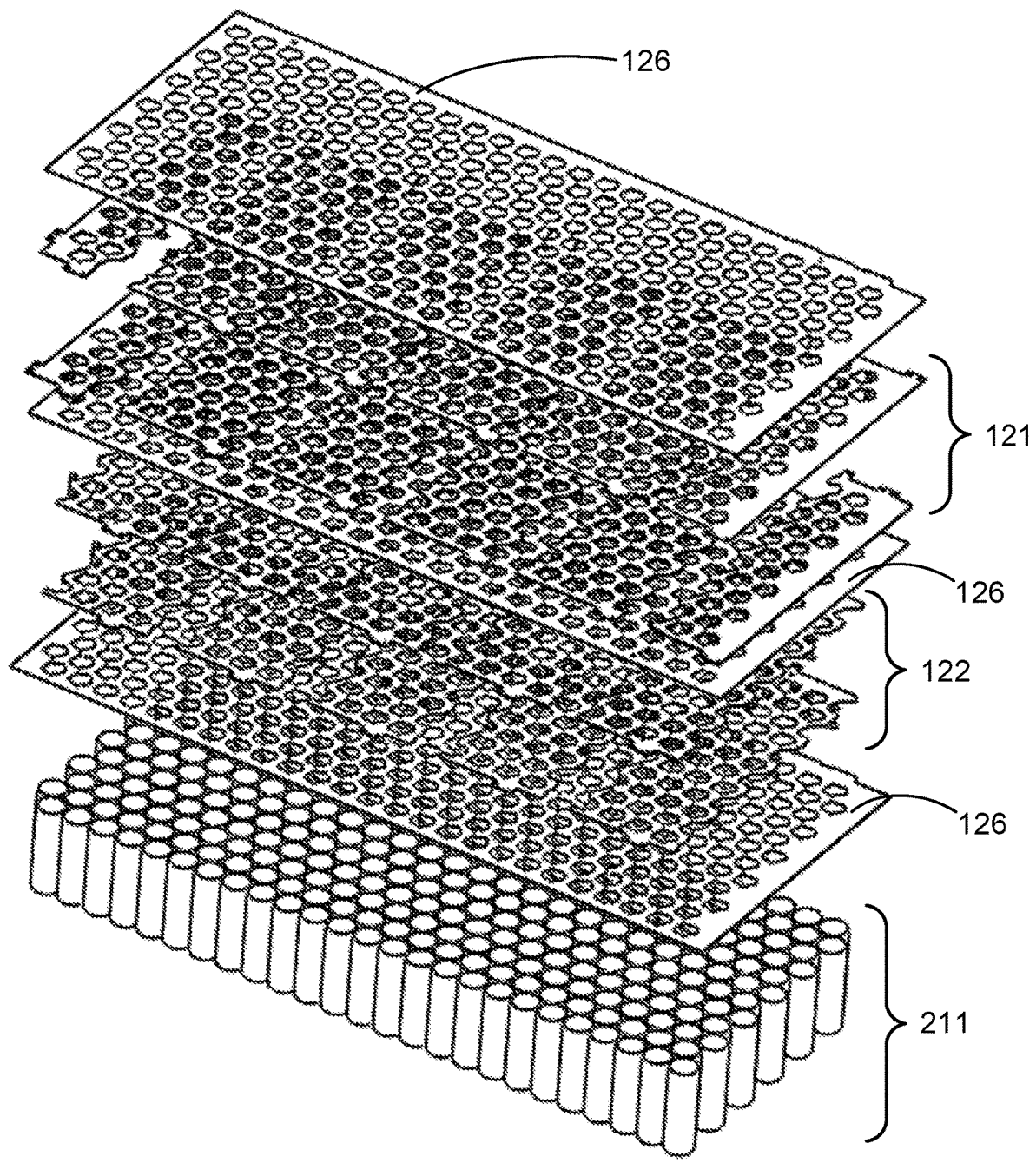
FIG. 11A illustrates an isometric exploded view of components of an interconnect assembly, in accordance with an exemplary embodiment.
Figure 11B:
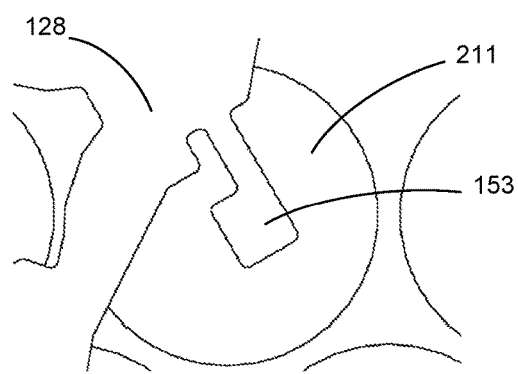
FIG. 11B illustrates a tab of an interconnect assembly, prior to further processing of the tab in preparation for connection to a cathode of a battery cell, in accordance with an exemplary embodiment.

Turning to FIGS. 10C and 10D, in various exemplary embodiments interconnect assembly 120 is configured with tabs 153, 163 for coupling to cells 211. A particular tab 163 is positioned and shaped to be coupled to the cathode of a cell 211 (i.e., the positive terminal); another tab 153 is positioned and shaped to be coupled to the anode of that cell 211 (i.e., the negative terminal).

Figure 11C:
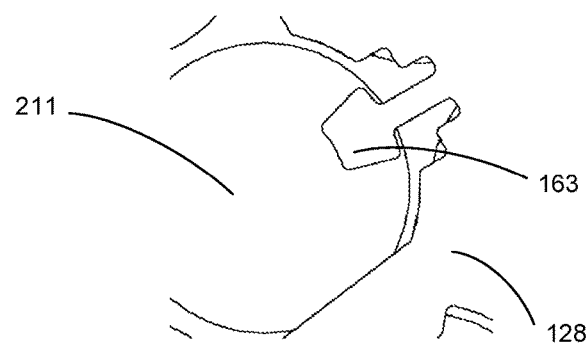
FIG. 11C illustrates a tab of an interconnect assembly, prior to further processing of the tab for coupling to an anode of a battery cell, in accordance with an exemplary embodiment.
Figure 11D:
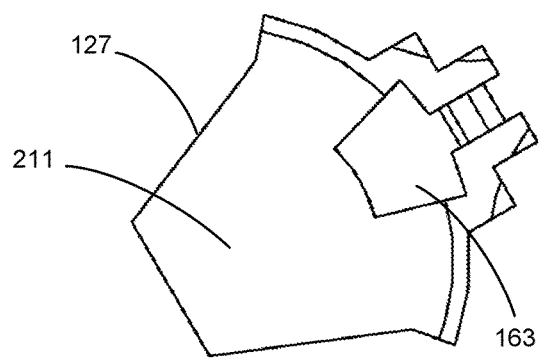
FIG. 11D illustrates windows and tabs of an interconnect assembly, each tab having been processed for coupling to a portion of a battery cell, in accordance with an exemplary embodiment.
Figure 11D:
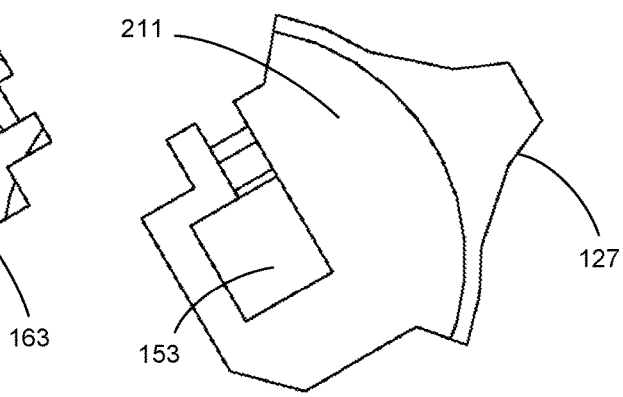
Figure 11E:
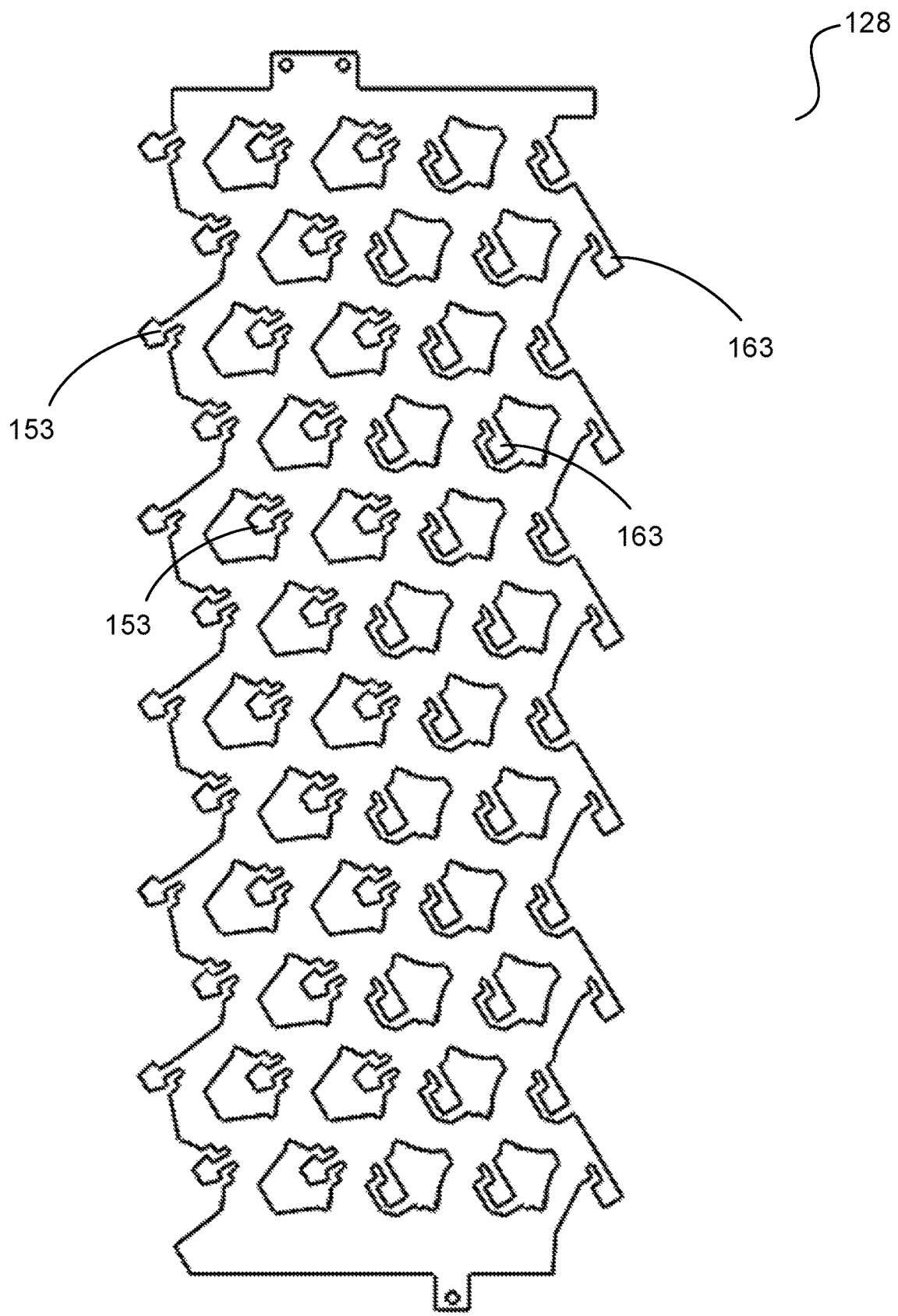
FIG. 11E illustrates a conductive plate of an interconnect assembly in accordance with an exemplary embodiment.
Figure 11F:
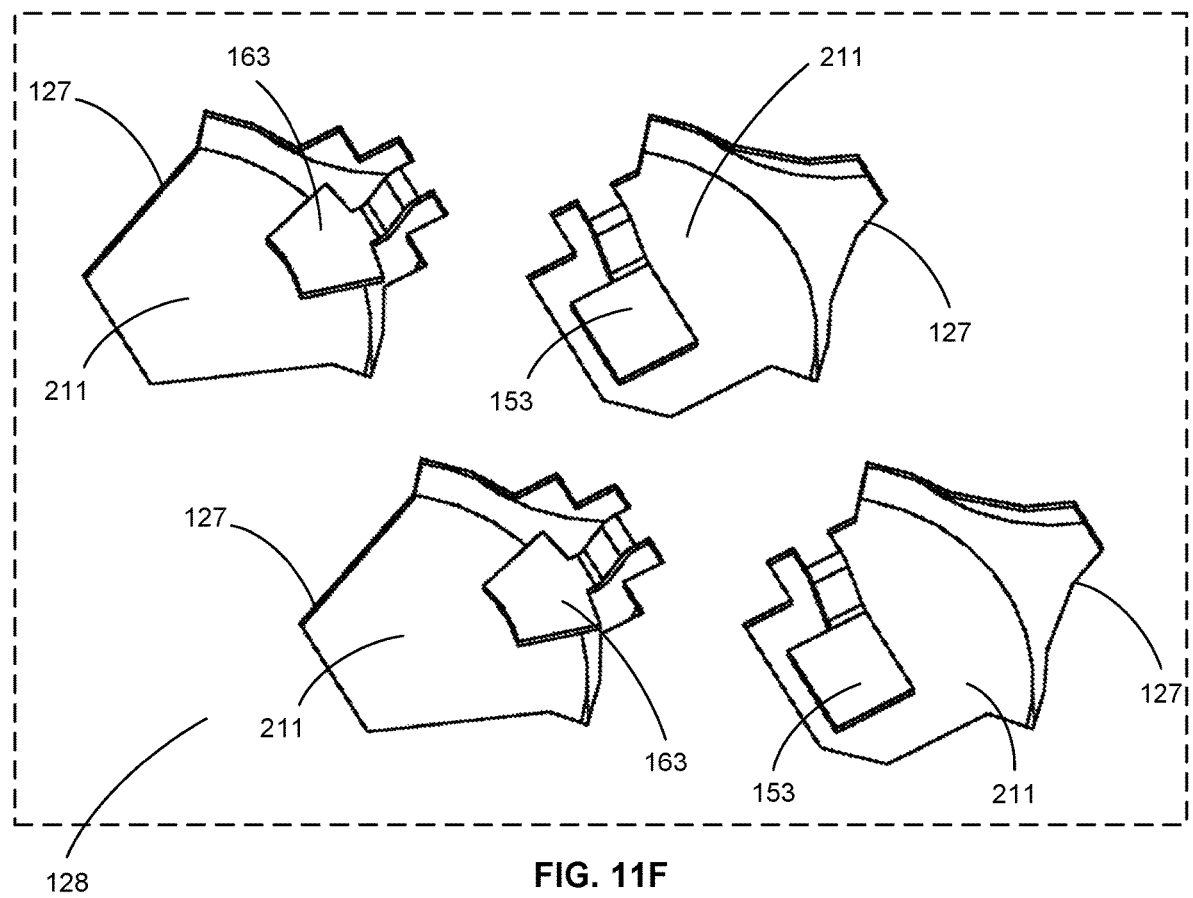
FIG. 11F illustrates a perspective view of a portion of a conductive plate of an interconnect assembly, with tabs processed for coupling to portions of corresponding battery cells, in accordance with an exemplary embodiment.
Figure 11G:
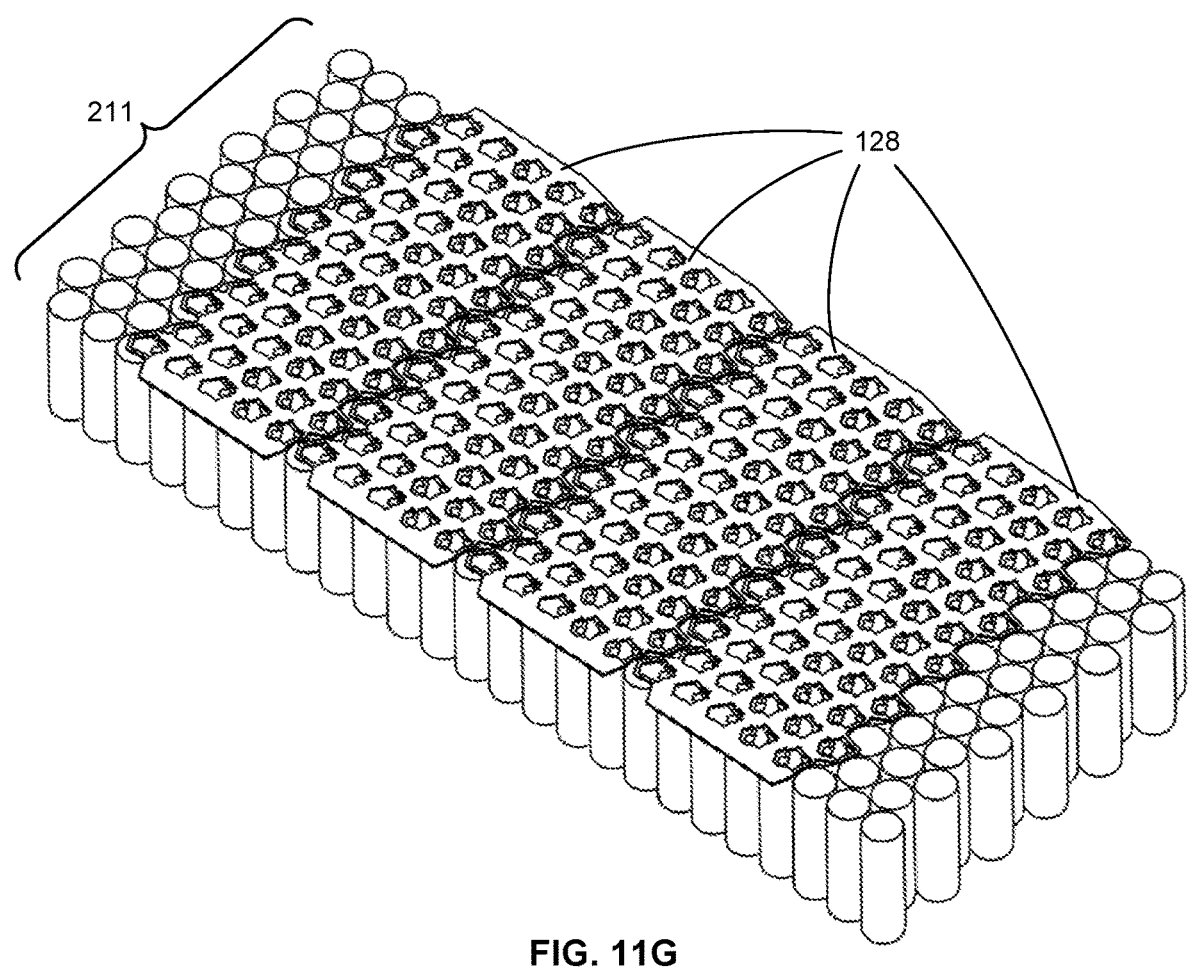
FIG. 11G illustrates a perspective view of conductive plates of an interconnect assembly with tabs coupled to portions of battery cells, in accordance with an exemplary embodiment.

In some exemplary embodiments, with reference to FIGS. 11C, 11D, and 11E, tabs 153, 163 may be initially formed in a conductive plate 128 via the same process utilized to form the bulk of conductive plate 128, for example by die stamping, laser cutting, waterjet cutting, plasma cutting, electrical discharge machining, and/or the like. In various exemplary embodiments, conductive plate 128 comprises a planar material, and thus tabs 153, 163, as initially formed, may be co-planar with the rest of conductive plate 128 (for example, as seen in FIGS. 11C and 11D). Tabs 153, 163 may be bent, stretched, stamped, pressed, and/or otherwise formed or configured to extend at least partially out of, away from, or below the main body of interconnect assembly 120; in this manner, tabs 153, 163 may be extended for easier coupling to cells 211, for example via spot welding or other suitable process. This deformation and/or extension of tabs 153, 163 at least partially out of the plane of the remainder of conductive plate 128 may occur at the same or similar time as the initial formation of conductive plate 128; alternatively, it may occur in a later processing step. It will be appreciated that, by extending tabs 153, 163, space is created between conductive plate 128 and cells 211, allowing electrically insulating, thermally insulating, and/or motion damping materials to be placed therebetween.

In some exemplary embodiments, tabs 153, 163 are stamped, pressed, bent, and/or otherwise processed to extend away from the main body of conductive plate 128. Via this or any other suitable manufacturing process, tabs 153, 163 may be increased in area and/or made somewhat thinner as compared to the thickness of the main body of conductive plate 128 (for example, as illustrated in FIG. 10D). Moreover, tabs 153, 163 may be trimmed, cut, or otherwise further shaped or formed after bending, in order to obtain a desired size and/or shape of tabs 153, 163. A view of tabs 153, 163 after processing can be seen in FIG. 11E and FIG. 10D, showing the post-processing size of tabs 153, 163 as well as deformation at least partially out of the plane occupied by the main body of conductive plate 128. In one example embodiment, the tab is locally formed down to about 0.5 mm while the main body of conductive plate 128 is about 1.0 mm thick. The thin tab can be welded using any suitable method (e.g., laser) while still maintaining the same current carrying thickness required for the application. In various exemplary embodiments, conductive plate 128 comprises one or more of aluminum, nickel, copper, or any other suitable conductive alloy. In an example embodiment, tabs 153, 163, after deformation, have a thickness of about half of the thickness of conductive plate 128. However, any suitable thicknesses of the conductive plate and tabs may be used.

With reference now to FIGS. 10E through 10H, in various exemplary embodiments conductive layer 121 and conductive layer 122 are each comprised of a set of conductive plates 128 having windows 127 therein. Windows 127 are configured with corresponding shapes such that when conductive layer 121 and conductive layer 122 are disposed atop one another, windows 127 partially and/or fully align to form a common path (for example a vertical path, i.e., a path generally perpendicular to the plane of interconnect assembly 120) through interconnect assembly 120. A window 127 may have a tab 153 and/or 163 extending thereinto; moreover, a window 127 may be configured absent any tab 153 or 163 and thus be "empty". In this manner, in interconnect assembly 120 tabs 153, 163 may extend without obstruction to be coupled to corresponding cells 211.

Figure 10I:
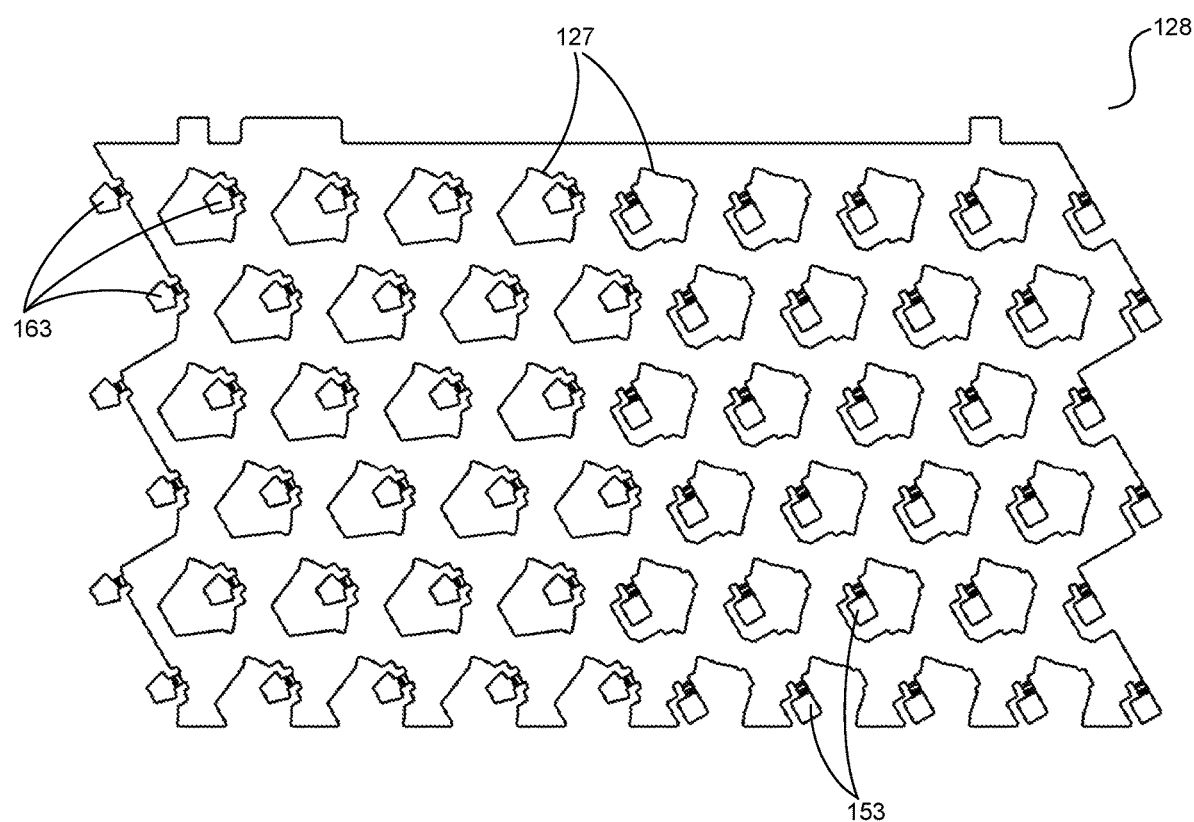
FIG. 10I illustrates a conductive plate of an interconnect assembly, the conductive plate configured with a plurality of windows and corresponding tabs in accordance with an exemplary embodiment.

Turning now to FIG. 10I, in various exemplary embodiments conductive layer 121 and/or conductive layer 122 comprises one or more conductive plates 128. A conductive plate 128 may be configured with a plurality of windows 127 therein, including windows 127 configured with either tab 153 or tab 163. Additionally, conductive plate 128 may be configured with one or more tabs 153 on one end of conductive plate 128, and/or configured with one or more tabs 163 on an opposing end of conductive plate 128; in this manner, multiple conductive plates 128 may be placed adjacent to one another while preserving a desired pattern of windows 127, tabs 153, and tabs 163. In these configurations, it will be appreciated that gaps or spaces between adjacent conductive plates 128 may serve the function of windows 127; stated another way, conductive plates 128 may be shaped such that, when two conductive plates 128 are brought adjacent to one another, voids or spaces similar in size and/or shape to windows 127 are left unobstructed and tabs 153, 163 extend into the window-like spaces.

Figure 10J:
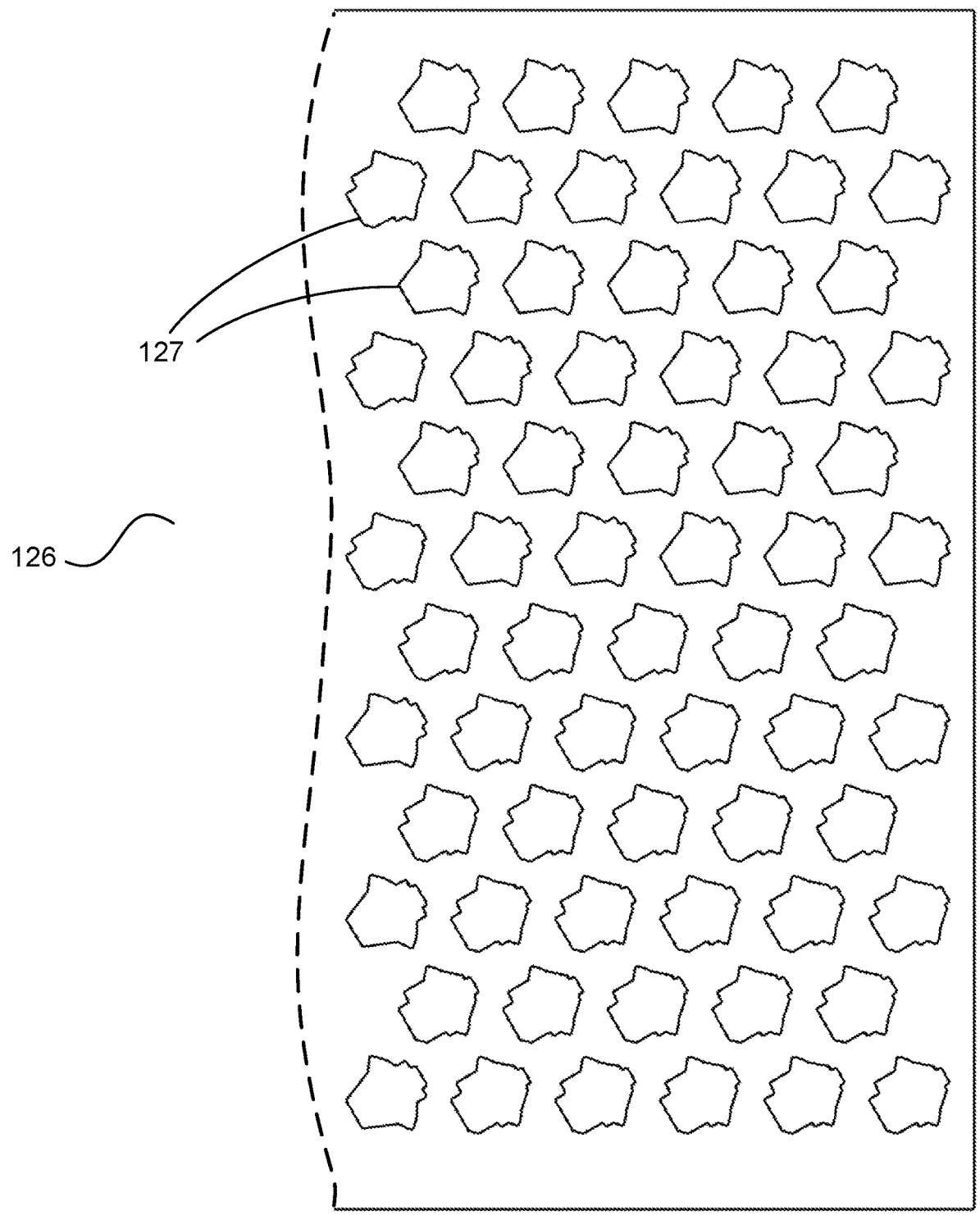
FIG. 10J illustrates a top view of a portion of an insulating layer of an interconnect assembly, the insulating layer having a plurality of windows disposed therein in accordance with various exemplary embodiments.

With reference now to FIG. 10J, in various exemplary embodiments, in interconnect assembly 120, conductive layer 121 and conductive layer 122 may be separated by an insulating layer or layers 126. Insulating layer 126 may extend the length and/or width of interconnect assembly 120. Moreover, multiple insulating layers 126 or sections thereof may be utilized, as desired, in order to electrically isolate conductive layer 121 from conductive layer 122. Additionally, insulating layer 126 may be configured with windows 127 such that when conductive layer 121, insulating layer 126, and conductive layer 122 are stacked atop one another, windows 127 partially and or fully align with one another to form pathways through interconnect assembly 120.

With reference again to FIGS. 10C, 10E through 10H, 11C through 11E, and 11G, in various exemplary embodiments windows 127 are configured as "vision windows" that enable automated handling, coupling, and/or processing of interconnect assembly 120 and/or components thereof, for example in connection with machine vision. In an example embodiment, the vision windows are shaped to maximize the amount of conductive material present in conductive plate 128 and thus minimize resistive heating in the conductive plate 128, while also providing proper vision capabilities for use in connection with an attachment device (e.g., a laser welding device, a wire bonding apparatus, a dispensing apparatus for conductive adhesive, and/or the like). For example, in various exemplary embodiments, in interconnect assembly 120, windows 127 may be configured in two shapes, a first shape for windows 127 associated with positive tabs 163, and a second shape for windows 127 associated with negative tabs 153. In another example embodiment, a single shape for a window 127 may be utilized for both positive and negative tabs. In an example embodiment, when interconnect assembly 120 is aligned with a battery pack 110 comprising cells 211, positive tabs 163 are laser welded to the positive terminals (e.g. the cathodes of cells 211) and negative tabs 153 are laser welded to the negative terminals (e.g., the anodes of cells 211), the anodes and cathodes both located on a common end of each cell 211. In an example embodiment, the positive terminal of each cell 211 is located at the center top portion of the cell 211, and the negative terminal of the cell 211 is located near the top shoulder of the cell 211. Although various embodiments are described herein as utilizing laser welding, it will be appreciated that any suitable coupling technique may be used. In an example embodiment, tabs 153, 163 are spot welded to the respective terminals of the cell.

During integration of interconnect assembly 120 with battery pack 110, a laser welder may, in an example embodiment, be located in a position above the battery pack 110 and the interconnect assembly 120 to provide a vertical or approximately vertical laser to generate the welds. Any suitable laser welder may be used to generate the spot welds, for example gas lasers, solid state lasers, fiber type lasers, or any other suitable laser. In connection with the laser welder or other coupling apparatus, a machine vision system may facilitate alignment of the laser welding beam (or other coupling mechanism) based on the location of tabs 153, 163 and/or cells 211. In an example embodiment, the machine vision system is angled at about 20 degrees, or about 15 degrees, or about 10 degrees, or about 5 degrees from vertical (i.e., between about 5 degrees and about 20 degrees away from perpendicular to the plane of interconnect assembly 120), although any suitable angle can be used. In an example embodiment, the machine vision system comprises a high resolution digital camera configured with a suitable imaging algorithm; however, any suitable machine vision system may be used.

In accordance with an example embodiment, conductive plates 128 and/or insulating layers 126 in interconnect assembly 120 comprise windows 127 configured as vision windows. In an example embodiment, the vision windows 127 are shaped, sized, and/or otherwise configured to permit the machine vision system to view at least a portion of a particular individual cell 211 to improve alignment of the laser welding or other coupling associated therewith. Each vision window 127 may be configured, for example, to provide an opening through which the machine vision system can observe the location of at least a portion of a cell 211 and/or observe the location of a tab 153 and/or 163 to be welded thereto. In an example embodiment, the vision window 127 may be considered or described as a "cutout" in the various insulating and conductive layers comprising interconnect assembly 120. In an example embodiment, each cutout is shaped to provide space around the positive tab 163 and the negative tab 153, and to provide the machine vision system with a view of a portion of the cell 211.

In one example embodiment, window 127 possesses a geometry that is concentric with a cylindrical cell 211 and reveals at least a portion of the negative shoulder of the cell 211 for the machine vision system to "see." In another example embodiment, the shape of window 127 includes "wings" that increase the amount of cell 211 shoulder visible to the machine vision system (for example, as illustrated in FIG. 11E). In an example embodiment, each window 127 exposes or permits to be visible, through the interconnect assembly 120, a portion of the shoulder and/or circumference of a corresponding cell 211.

In various exemplary embodiments, windows 127 may be configured such that the portion of the cell 211 visible to the machine vision system may comprise more than, for a particular cell 211: $\frac{1}{2}$ of the circumference, $\frac{3}{8}^{th}$ of the circumference, $\frac{5}{16}^{th}$ of the circumference, $\frac{1}{4}^{th}$ of the circumference, $\frac{3}{16}^{th}$ of the circumference, $\frac{1}{8}^{th}$ of the circumference, or $\frac{1}{12}^{th}$ of the circumference. In an example embodiment, a window 127 exposes between 7% and 40% of the circumference of a cell 211. Moreover, in another exemplary embodiment a window 127 exposes a distance along the circumference of cell 211 of at least one inch, or at least $\frac{1}{2}$ inch. The portion of cell 211 visible through window 127 may comprise a first portion of the cell 211 circumference on a first side of a tab, for example tab 163, and a second portion of the cell 211 circumference on a second side of the tab. In one example embodiment, at least 60 degrees of the outside diameter of the cell may be exposed. Moreover, the more of a cell 211 that is exposed through a vision window 127, the more accurate and fast the machine vision system may be, but the more of cell 211 that is exposed, correspondingly, a reduced amount of material in conductive plate 128 is available for conducting current to and from cells 211.

In an example embodiment, windows 127 are configured with a first shape for windows 127 containing or associated with a positive tab 163, and a second shape for windows 127 containing or associated with a negative tab 153, as illustrated in FIGS. 10E through 10H and FIG. 11E. In another example embodiment, not shown, the same shape may be used for a window 127 that contains or is associated with a positive tab 163 as for a window 127 that contains or is associated with a negative tab 153. Moreover, shapes of windows 127 can vary from plate to plate and/or layer to layer in interconnect assembly 120; alternatively, shapes of windows 127 can remain constant throughout interconnect assembly 120. In an example embodiment, the shape, orientation, layout and dimensions of the windows 127 are configured to provide sufficient vision for proper coupling and to provide sufficient cross sectional area for current flow in the conductive material without excessive heating. In particular, in applications where windows 127 cannot be made smaller but the power loads arising in connection with operation of cells 211 are still generating too much heat, conductive plates 128 can be split into multiple layers.

It will be appreciated that, although cells 211 are described herein primarily as cylindrical cells, the machine vision system, in connection with windows 127, can expose a portion of any type of cell 211 to enable a machine vision assisted alignment of the laser welding of the positive and/or negative tabs to that cell 211.

Figure 12A:
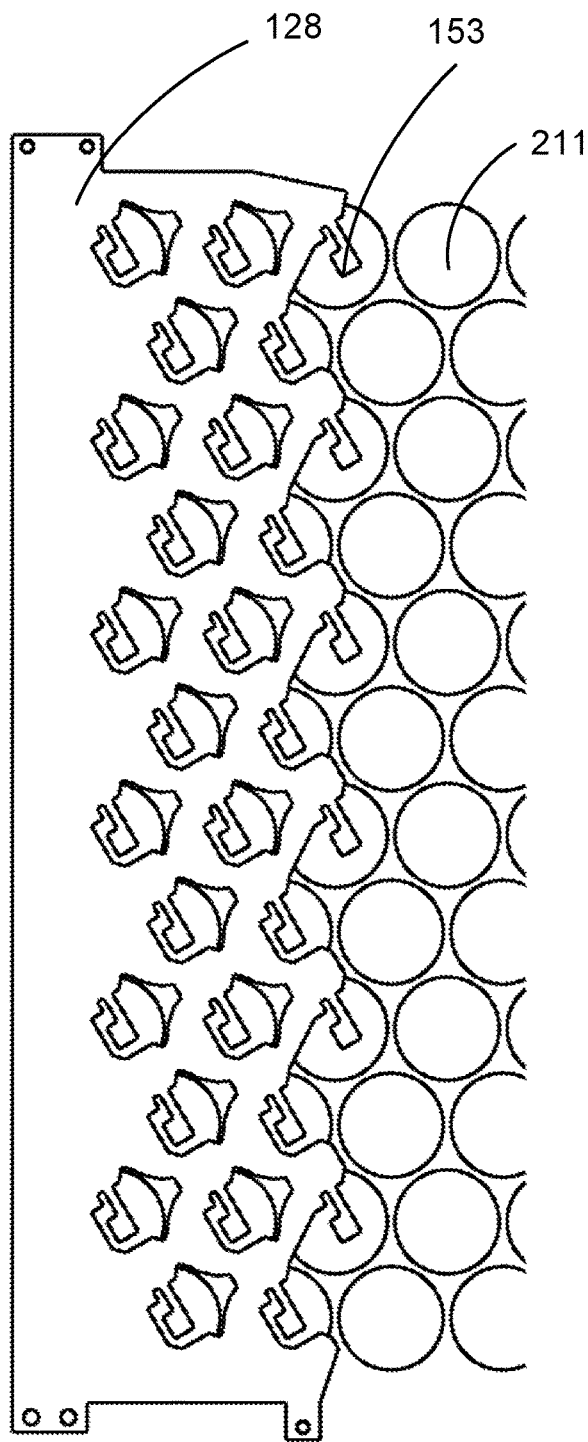
FIG. 12A illustrates a conductive plate of an interconnect assembly making contact with anodes of a parallel group of battery cells, in accordance with an exemplary embodiment.
Figure 12B:
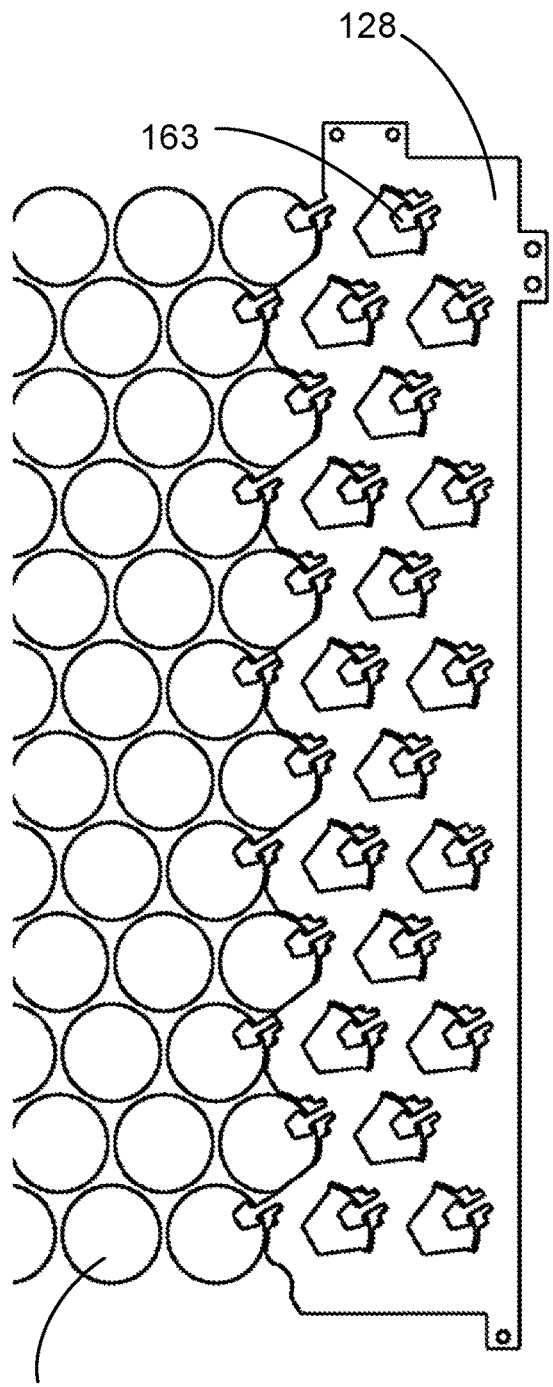
FIG. 12B illustrates a conductive plate of an interconnect assembly making contact with cathodes of a parallel group of battery cells, in accordance with an exemplary embodiment.
Figure 12C:
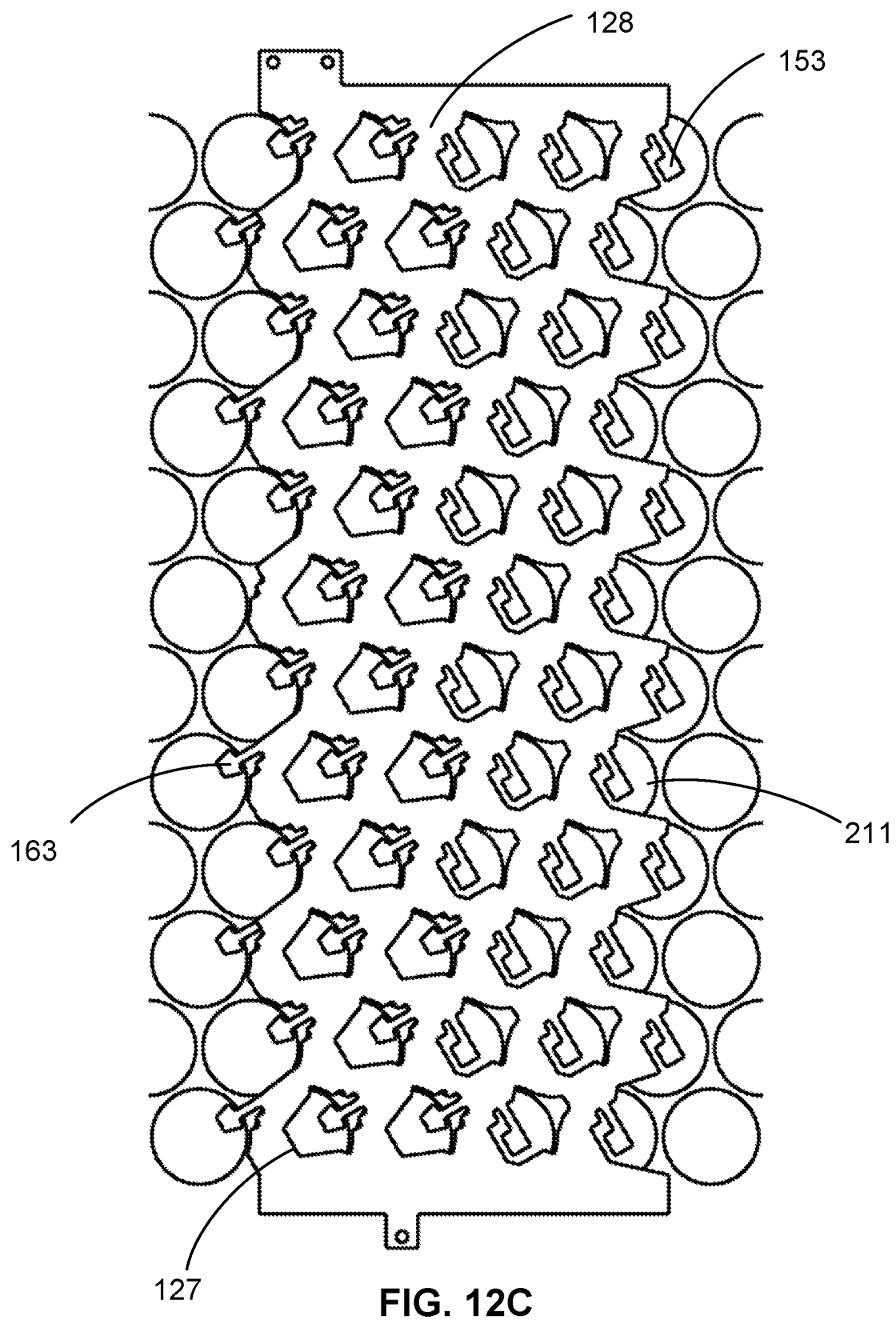
FIG. 12C illustrates a conductive plate of an interconnect assembly making contact with anodes of a first parallel group of battery cells, and making contact with cathodes of a second parallel group of battery cells, in order to make a series connection therebetween, in accordance with an exemplary embodiment.

With reference now to FIGS. 12A, 12B, and 12C, in various exemplary embodiments a conductive plate 128 is configured to make contact with the anodes and/or cathodes of a particular parallel group of cells 211 in battery pack 110. Moreover, a conductive plate 128 can also form a series connection by making contact with the opposite terminals on another (for example, adjacent) group of parallel cells 211 in battery pack 110. Moreover, conductive plates 128 may be configured such that multiple conductive plates 128 may be stacked atop one another, allowing the connections associated with a particular parallel group of cells 211 to be split among the conductive plates 128 comprising the stack. Stated another way, in some exemplary embodiments a conductive plate 128 may be considered to be formed of multiple sub-plates in a stacked arrangement.

In interconnect assembly 120, in various exemplary embodiments, a conductive plate 128 may be configured for coupling to a group or groups of cells 211. With reference now to FIG. 12A, a particular conductive plate 128 is configured with tabs 153 for connecting to the positive terminals of a parallel group of cells 211. As seen in FIG. 12B, another conductive plate 128 is configured with tabs 163 for connecting to the negative terminals of a parallel group of cells 211. Additionally, as seen in FIG. 12C, yet another conductive plate 128 is configured with tabs 163 for connecting to the negative terminals of a first parallel group of cells 211 and with tabs 153 for connecting to the positive terminals of a second parallel group of cells 211, thus making a series connection therebetween.

In various exemplary embodiments, in interconnect assembly 120, multiple conductive plates 128 may be utilized to link (i.e., make a series connection between) a first parallel group of cells 211 and a second parallel group of cells 211. In this manner, current between the first parallel group of cells 211 and the second parallel group of cells 211 may be divided among the multiple conductive plates 128. This arrangement can result in reduced resistive losses and consequent heat generation in conductive plates 128.

With reference now to FIG. 13A, a particular conductive plate 128-A is configured with tabs 153 and 163 present, collectively, in half of the windows 127 of conductive plate 128-A, with the remaining windows 127 being empty. Tabs 153 and 163 may be arranged, for example, in stripes, bands, or other groupings within conductive plate 128-A, separated by stripes or bands of empty windows 127. In addition to stripes or bands, any suitable arrangements of tabs 153 and 163 may be utilized, for example a checkerboard or other interleaved pattern. Due to the presence of tabs 153 and 163, conductive plate 128-A makes a series connection between a first subset of a first parallel group of cells 211 and a first subset of a second parallel group of cells 211. It will be appreciated that, while the number of tabs 163 and the number of tabs 153 is often equal, that is not required; a particular conductive plate 128 may have all tabs 163, or all tabs 153, or both tabs 153 and 163 but an unequal number thereof.

Turning now to FIG. 13B, a particular conductive plate 128-B is configured with tabs 153 and 163 present, collectively, in half of the windows 127 of conductive plate 128-B; however, where conductive plate 128-A had empty windows 127, conductive plate 128-B has tabs 153 and/or 163, and vice versa. Thus, conductive plate 128-B makes a series connection between a second subset of the first parallel group of cells 211 and a second subset of the second parallel group of cells 211. It will be appreciated that the first subset and the second subset are non-overlapping; stated another way, a particular battery cell 211 is a member of only one subset.

In interconnect assembly 120, conductive plate 128-A and conductive plate 128-B may be stacked atop one another, and the resulting double-layer stack provides a series connection between the entire first parallel group of cells 211 and the entire second parallel group of cells 211 (for example, similar to the single conductive plate illustrated in FIG. 12C). In this configuration, conductive plate 128-A and conductive plate 128-B each carry approximately half of the electrical current passing in series between the first parallel group of cells 211 and the second parallel group of cells 211.

Figure 13E:
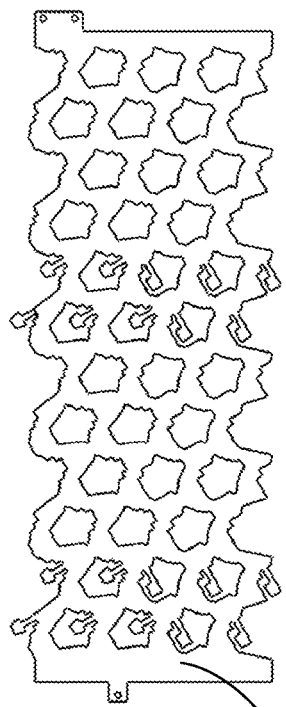
FIG. 13E illustrates a conductive plate of an interconnect assembly making contact with cathodes of a third portion of the first parallel group of battery cells seen in FIG. 13C, and making contact with anodes of a third portion of the second parallel group of battery cells seen in FIG. 13C, in order to make a series connection therebetween, in accordance with an exemplary embodiment.
Figure 13E:
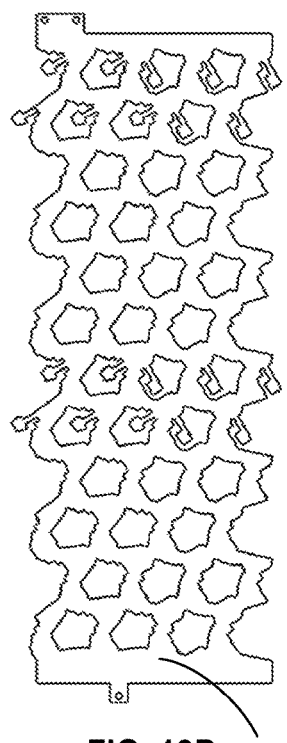
Figure 13E:
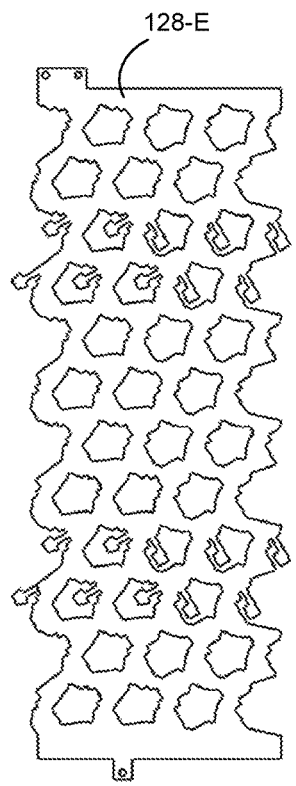

With reference now to FIGS. 13C, 13D, and 13E, in some exemplary embodiments a triple-layer stack may be utilized; conductive plates 128-C, 128-D, and 128-E each are configured with tabs 153 and 163 present in one-third of their windows 127, and with the remaining windows 127 empty. When conductive plates 128-C, 128-D, and 128-E are stacked atop one another, the resulting triple-layer stack provides a series connection between the entire first parallel group of cells 211 and the entire second parallel group of cells 211 (again, similar to the single conductive plate illustrated in FIG. 12C). In this configuration, conductive plates 128-C, 128-D, and 128-E each carry approximately one-third of the electrical current passing in series between the first parallel group of cells 211 and the second parallel group of cells 211.

By stacking conductive plates 128, each plate conductive plate 128 may be made thinner and/or lighter due to the reduced current carrying capacity required. Additionally, each conductive plate 128 may be made of lower cost and/or higher resistivity materials. In one exemplary embodiment, a conductive plate 128 comprises copper, aluminum, nickel, any alloy variants, and/or the like. The ability to split layers, thereby reducing current through each layer, facilitates reducing the thickness of each layer and thus opens more manufacturing methods for interconnect assembly 120 (for example, traditional multi layered PCB automated processing methods).

In an example embodiment, an interconnect assembly 120 is configured to form a 10s 30p (10 series and 30 parallel) combination of cells 211. In one example embodiment, each conductive plate 128 that makes a series connection between parallel groups of cells 211 is configured with a size of about 570 mm×230 mm. Each parallel group may comprise 30 cells, which can be split across 2, 3, 4, 5 or 6 subgroups (i.e., layers in conductive plate 128), depending on power loads. In this example embodiment, there are 300 windows 127 corresponding to 300 battery cells 211, where the windows are counted as 1 window per cell 211 and not 1 window 127 per cell 211 per layer). In this example embodiment, there are 600 total tabs, one for each positive and negative terminal for each cell 211. Thus, each conductive plate 128 may have 60 tabs, corresponding to 30 parallel cells. That conductive plate 128 may then be split into any suitable number of layers to split the current and reduce resistive heating due to the current running through those layers. In this example, if 3 layers are used, each layer within a group of parallel cells will have 10 cells connected in parallel, and 20 tabs connected to that plate (corresponding to 10 cells). This is just one example embodiment, and the number of layers, number of cells, dimensions, and parallel series combinations will vary significantly depending on cell layout, module size, series and parallel requirements, and so forth.

Figure 14A:
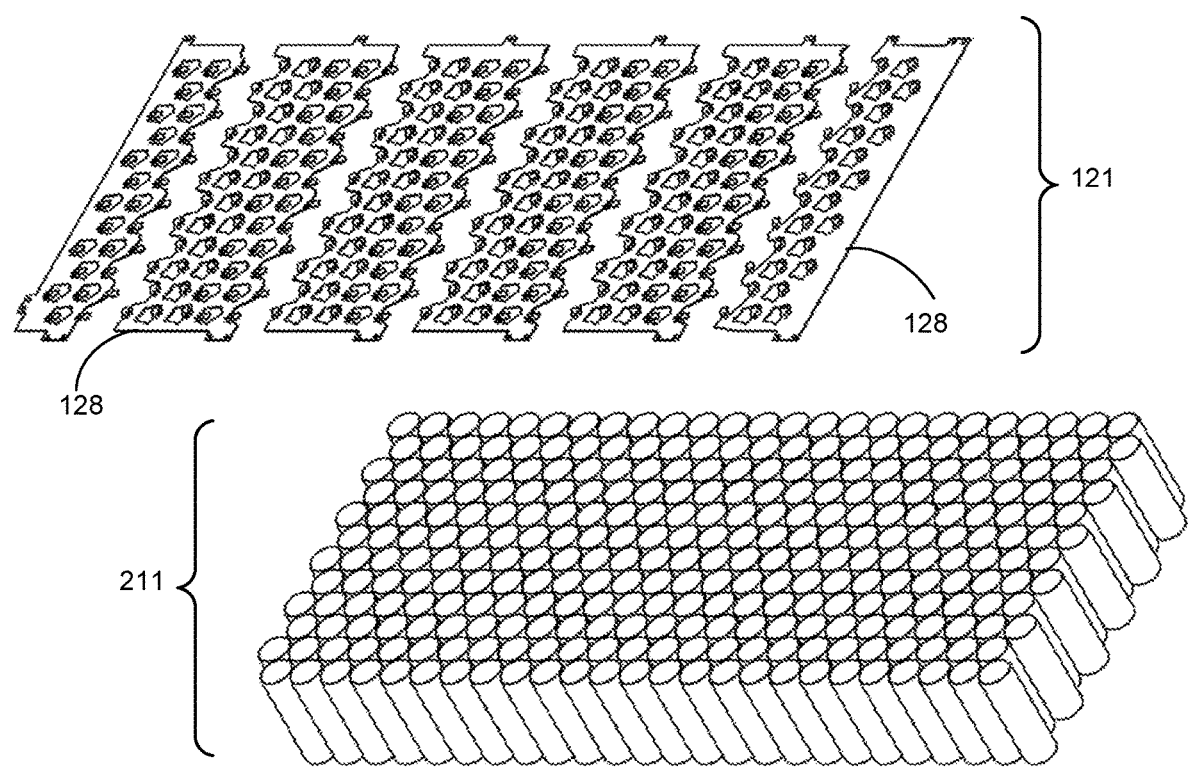
FIG. 14A illustrates a conductive layer in an interconnect assembly formed by a set of a single layer of conductive plates, in accordance with an exemplary embodiment.
Figure 14B:
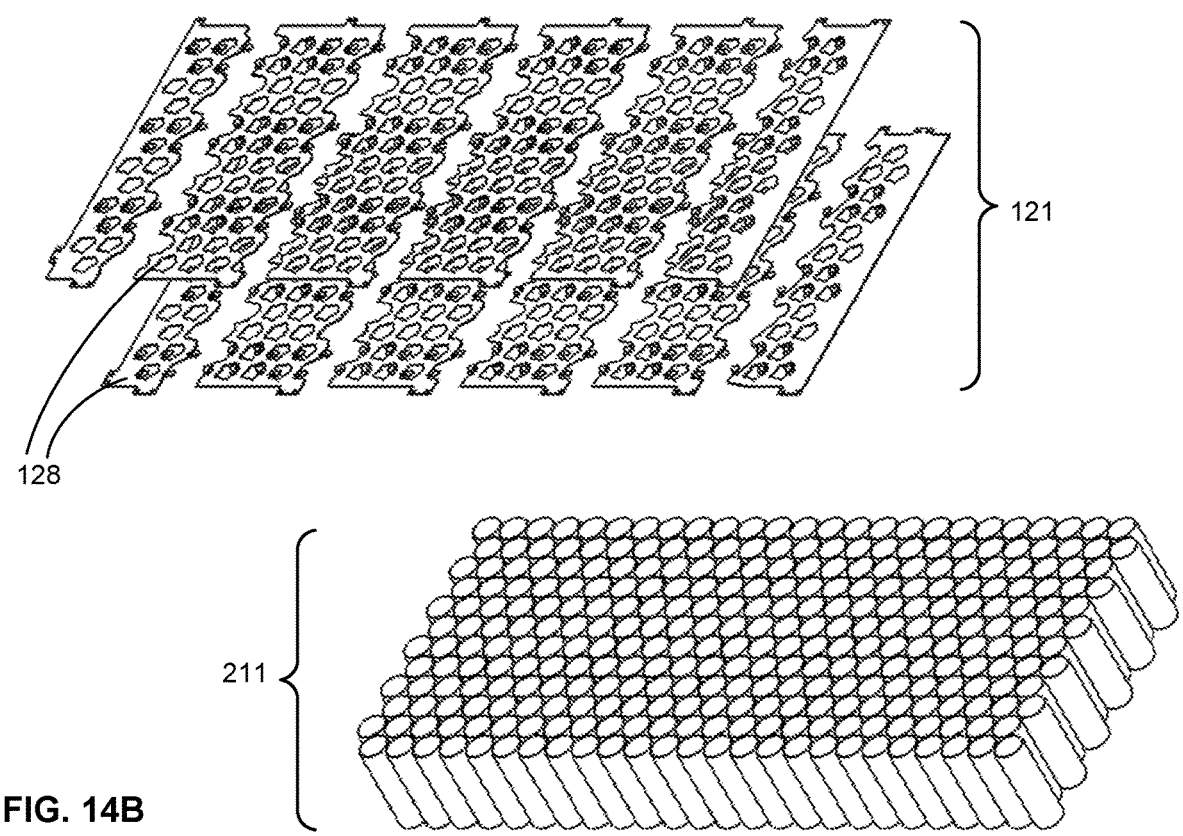
FIG. 14B illustrates a conductive layer in an interconnect assembly formed by a set of two layers of conductive plates, in accordance with an exemplary embodiment.
Figure 14C:
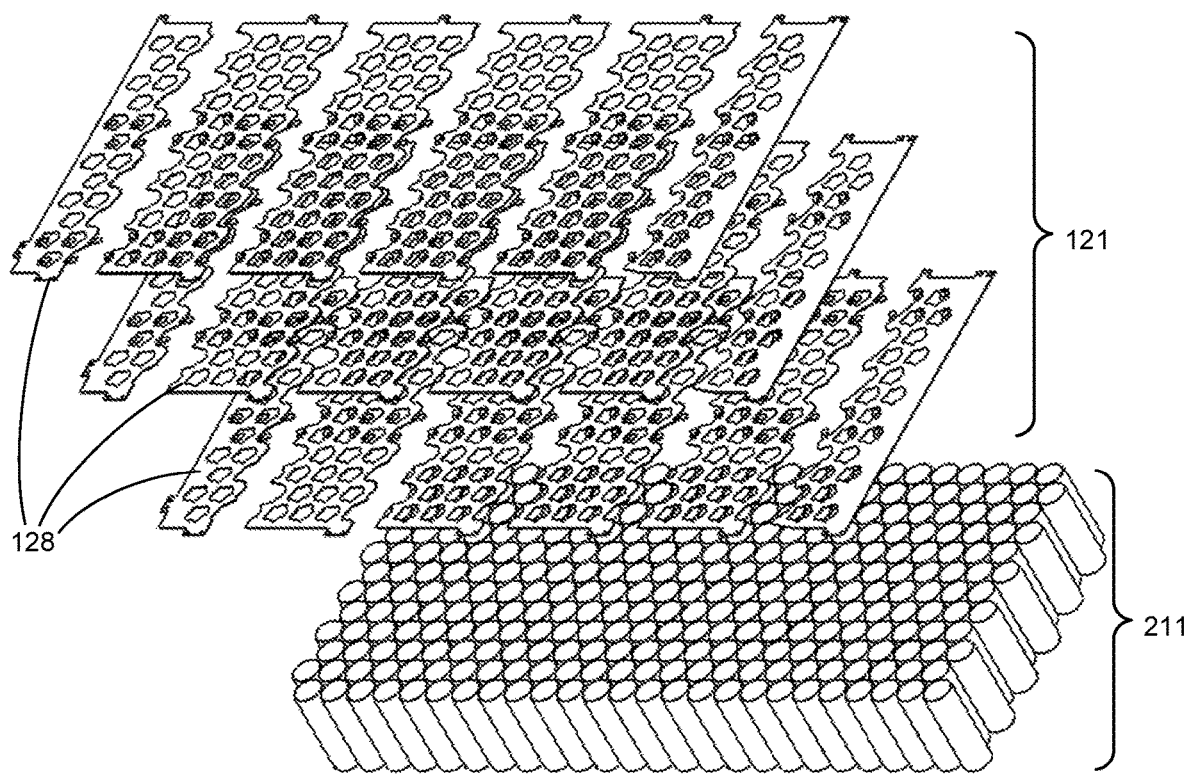
FIG. 14C illustrates a conductive layer in an interconnect assembly formed by a set of three layers of conductive plates, in accordance with an exemplary embodiment.

With reference now to FIGS. 14A, 14B, and 14C, it will be appreciated that in various exemplary embodiments, interconnect assembly 120 may be configured with connections between groups of parallel cells 211 via any suitable number of, and/or stack thicknesses of, conductive plates 128. As seen in FIG. 14A, a single-layer arrangement of conductive plates 128 may be utilized; in this arrangement, all the current between a first group of parallel cells 211 and a second group of parallel cells 211 flows through a single conductive plate 128 having a first thickness. As seen in FIG. 14B, a double-layer arrangement of conductive plates 128 may be utilized; in this arrangement, each conductive plate 128 in the stack has half as many tabs 153, 163 as the single-layer conductive plate depicted in FIG. 14A, and each conductive plate 128 carries approximately half the current between a first group of parallel cells 211 and a second group of parallel cells 211. In these exemplary embodiments, each conductive plate 128 is typically thinner than the conductive plate 128 of FIG. 14A. Moreover, as seen in FIG. 14C, a triple-layer arrangement of conductive plates 128 may be utilized; in this arrangement, each conductive plate 128 in the stack has one-third as many tabs 153, 163 as the single-layer conductive plate depicted in FIG. 14A, and each conductive plate 128 carries approximately one-third the current between a first group of parallel cells 211 and a second group of parallel cells 211. In these exemplary embodiments, each conductive plate 128 is typically thinner than the conductive plates 128 of FIG. 14B. Any suitable stack thickness and consequent division of tabs 153, 163 may be utilized, as desired. Moreover, conductive plates 128 in a stack may have a common thickness; alternatively, conductive plates 128 in a stack may differ in thickness from one another.

Figure 15A:
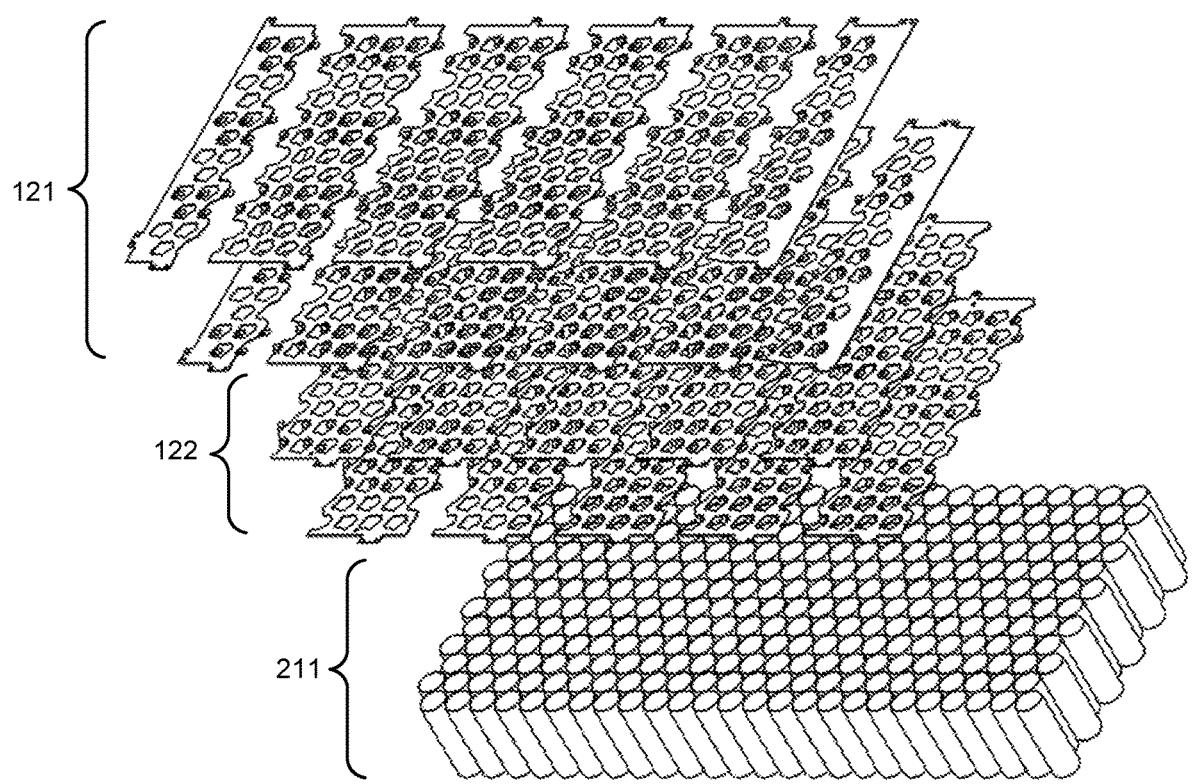
FIG. 15A illustrates two conductive layers in an interconnect assembly, each conductive layer formed by a set of two layers of conductive plates, in accordance with an exemplary embodiment.
Figure 15B:
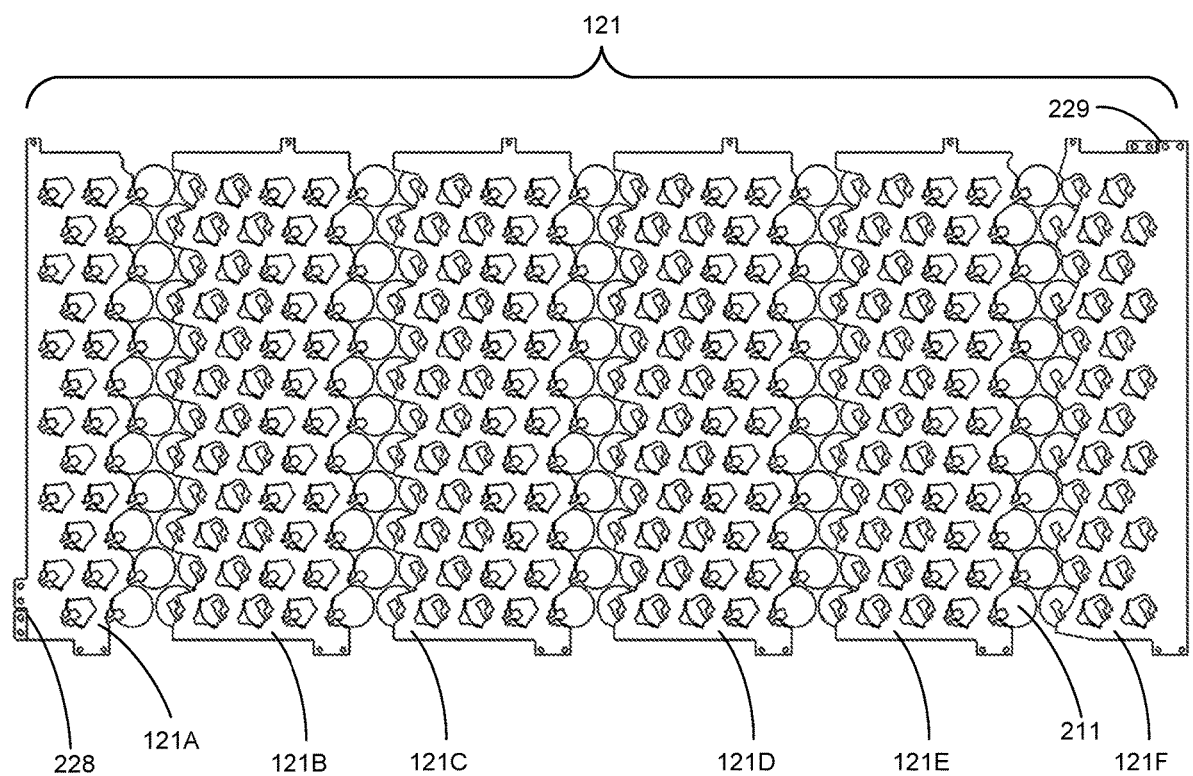
FIG. 15B illustrates one of the conductive layers in an interconnect assembly shown in FIG. 15A, the conductive layer disposed atop a group of battery cells, in accordance with an exemplary embodiment.
Figure 15C:
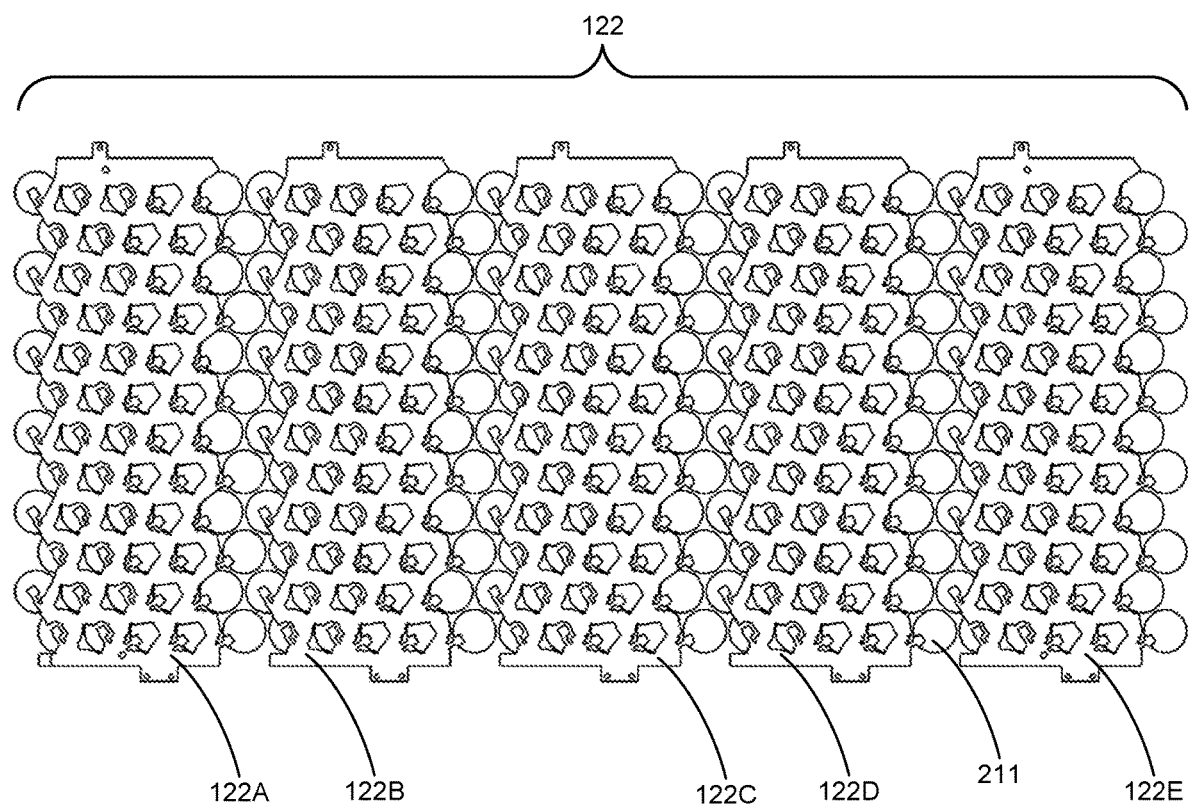
FIG. 15C illustrates the other conductive layer in an interconnect assembly shown in FIG. 15A, the conductive layer disposed atop a group of battery cells, in accordance with an exemplary embodiment.
Figure 15D:
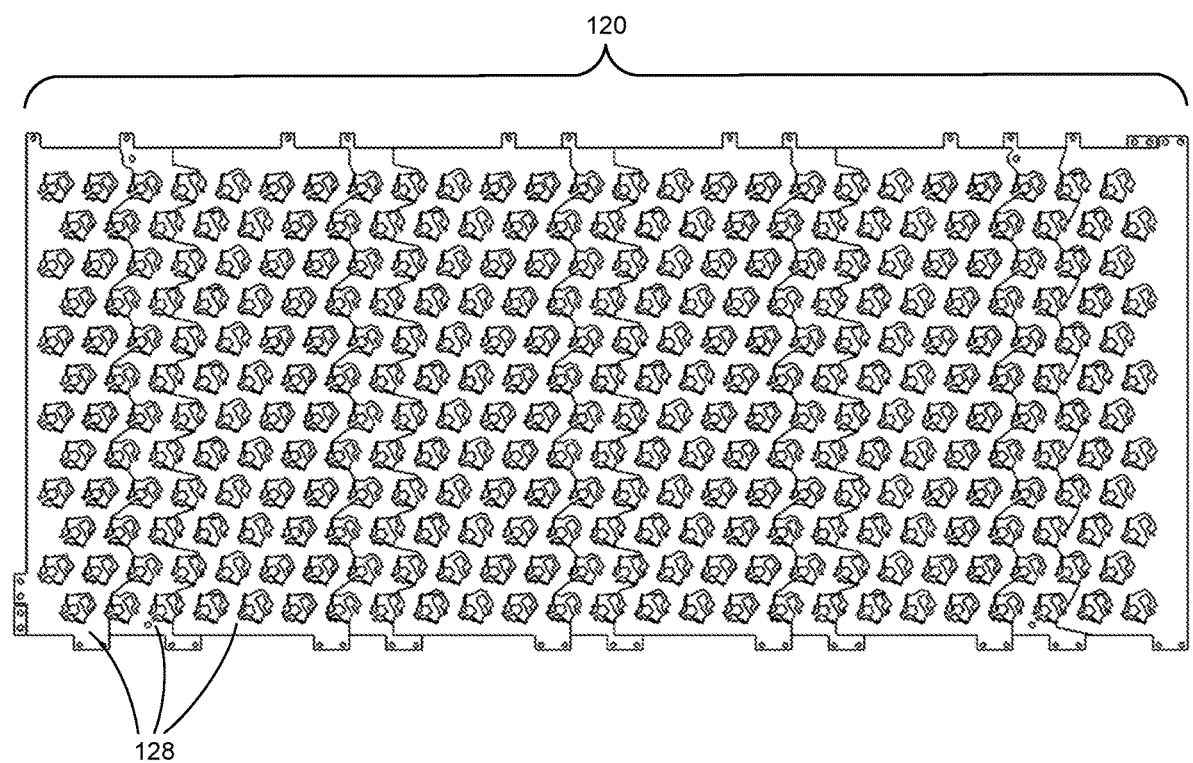
FIG. 15D illustrates a top view of the two conductive layers of the interconnect assembly shown in FIG. 15A coupled to a group of battery cells to create parallel and serial connections therebetween, in accordance with an exemplary embodiment.

Turning now to FIGS. 15A through 15D, in various exemplary embodiments interconnect assembly 120 is configured with multiple current carrying layers, for example a first conductive layer 121 and a second conductive layer 122. Each of conductive layers 121, 122 may be formed from stacks of conductive plates 128. For example, as seen in the exploded view of FIG. 15A, first conductive layer 121 is formed from a double stack of conductive plates 128, and second conductive layer 122 is likewise formed from a double stack of conductive plates 128. FIG. 15B illustrates first conductive layer 121 disposed atop cells 211 in battery pack 110; FIG. 15C illustrates second conductive layer 122 disposed atop cells 211 in battery pack 110; and FIG. 15D illustrates both first conductive layer 121 and second conductive layer 122 disposed atop cells 211 in battery pack 110. First conductive layer 121 and second conductive layer 122 are complementary in regards to having either a tab 153 or a tab 163 for each cell 211.

When configured as seen in FIG. 15D, first conductive layer 121 and second conductive layer 122 form connections resulting in a desired configuration of parallel and series groupings of cells 211, for example in a manner similar to that discussed above with respect to FIG. 4A. In the embodiment illustrated in FIGS. 15A through 15D, moving from left to right an electrical path traverses the following components in order: positive terminal 228→121A→122A→121B→122B→121C→122C→121D→122D→121E→122E→121F→negative terminal 229, in order to form a "10s, 30p" arrangement of cells 211.

Figure 16A:
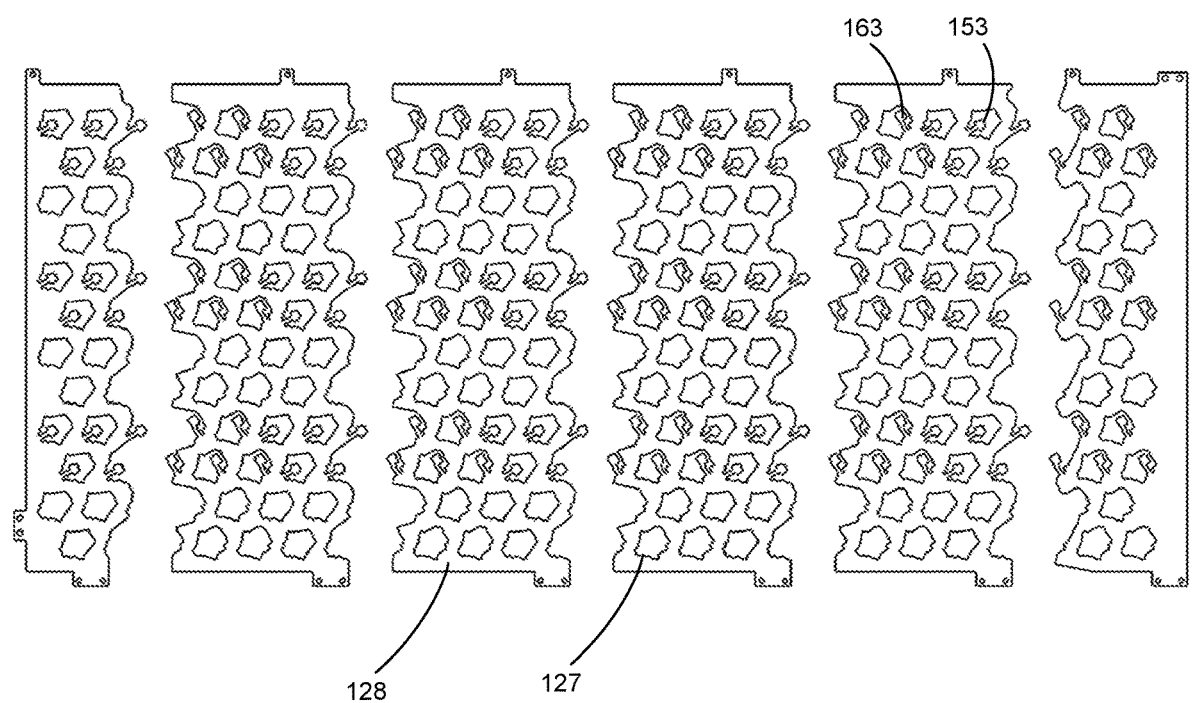
FIG. 16A illustrates a first set of conductive plates for forming a conductive layer in an interconnect assembly, the conductive plates having certain windows with tabs therein and certain other windows without tabs therein, in accordance with an exemplary embodiment.
Figure 16B:
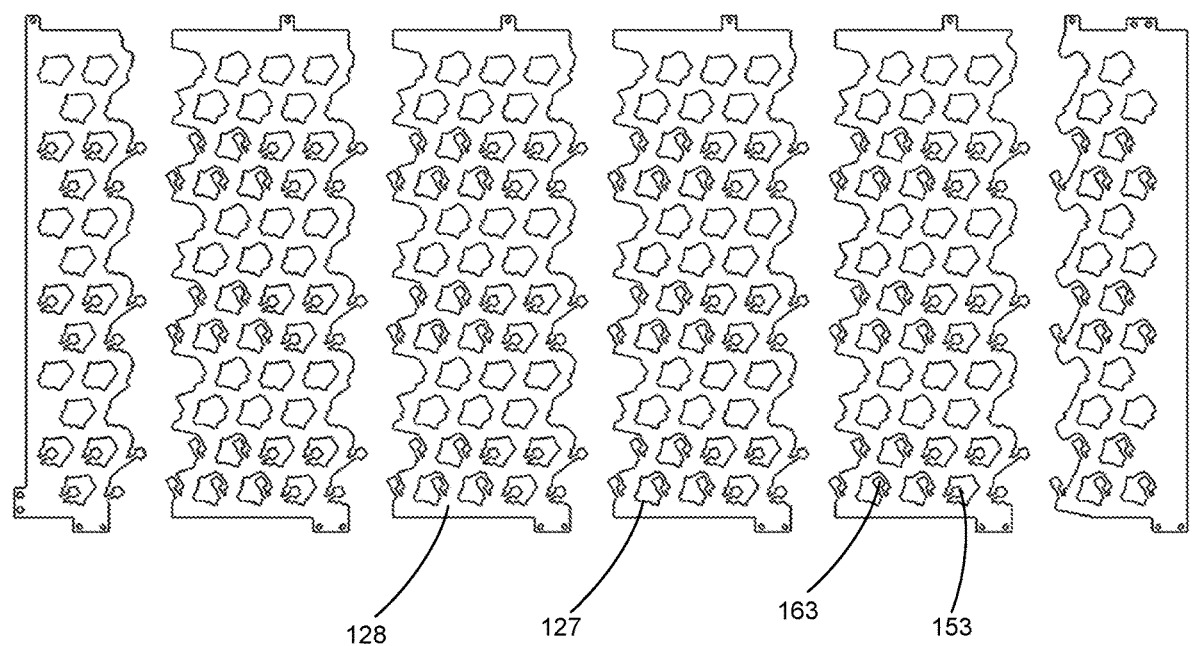
FIG. 16B illustrates a second set of conductive plates for forming a conductive layer in an interconnect assembly, the second set of conductive plates having windows with and without connective tabs in a complementary arrangement to the first set of conductive plates in FIG. 16A, in accordance with an exemplary embodiment.
Figure 16C:
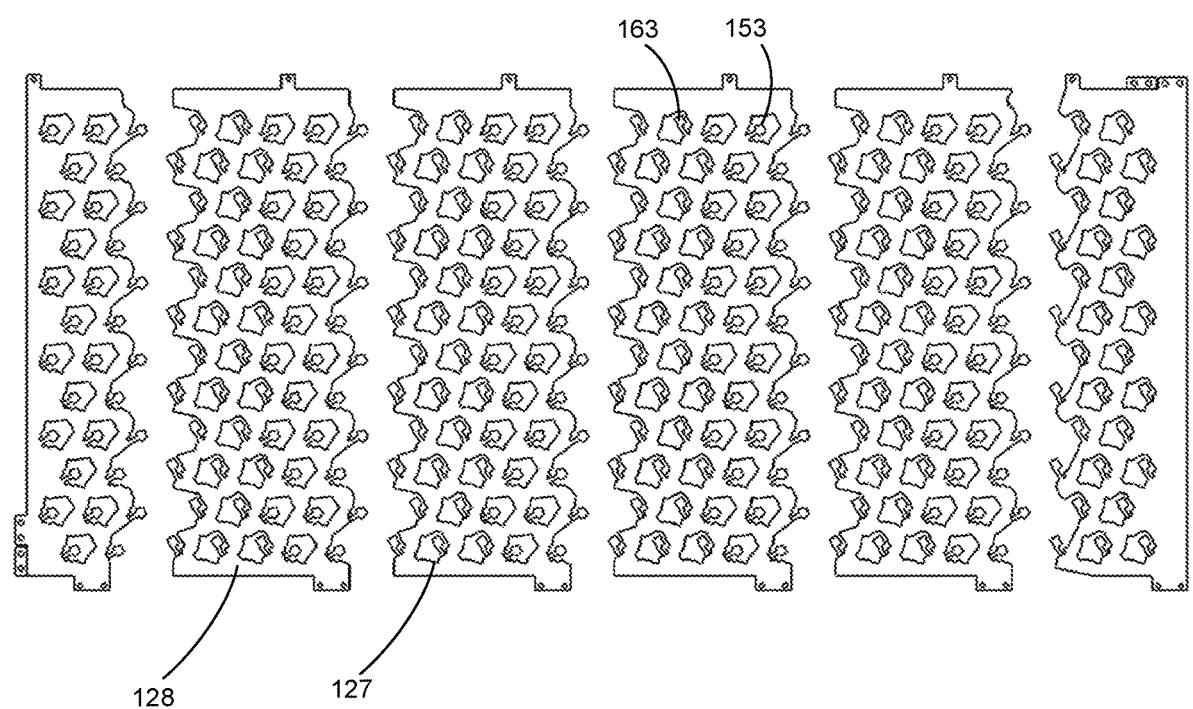
FIG. 16C illustrates the first set of conductive plates of FIG. 16A and the second set of conductive plates of FIG. 16B coupled atop one another, thus forming a conductive layer in an interconnect assembly, in accordance with an exemplary embodiment.

FIGS. 16A through 16C further illustrate exemplary complementary arrangements of windows 127, tabs 153, and tabs 163 for conductive plates 128 utilized in a double-layer stack to form a conductive layer in interconnect assembly 120, for example conductive layer 121.

Figure 17A:
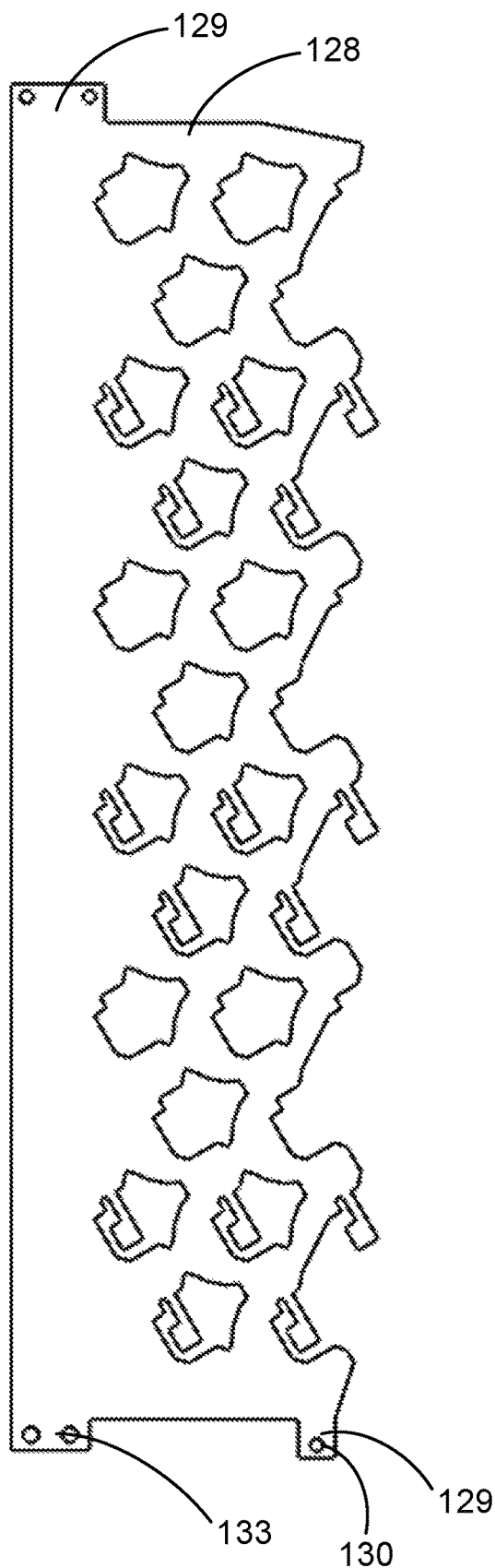
FIG. 17A illustrates a conductive plate in an interconnect assembly configured for use as a positive end of the interconnect assembly, in accordance with an exemplary embodiment.
Figure 17B:
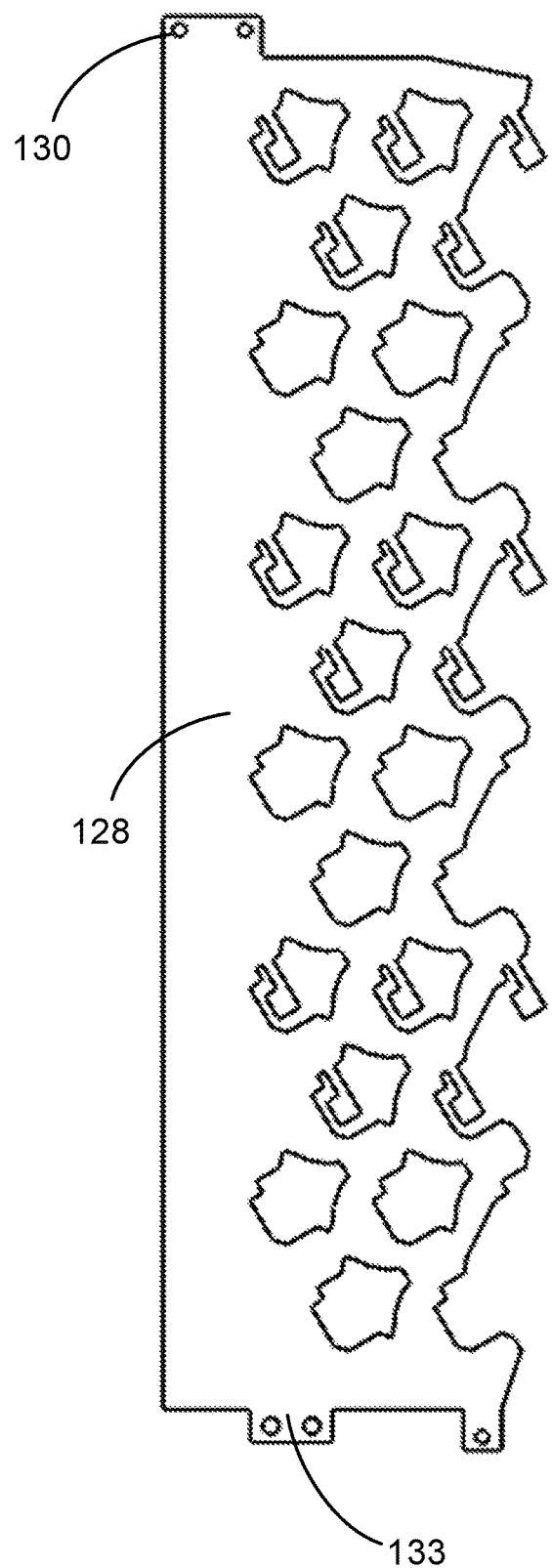
FIG. 17B illustrates a conductive plate in an interconnect assembly configured for use as a positive end of the interconnect assembly and configured to be coupled atop or beneath the conductive plate of FIG. 17A, in accordance with an exemplary embodiment.
Figure 17C:
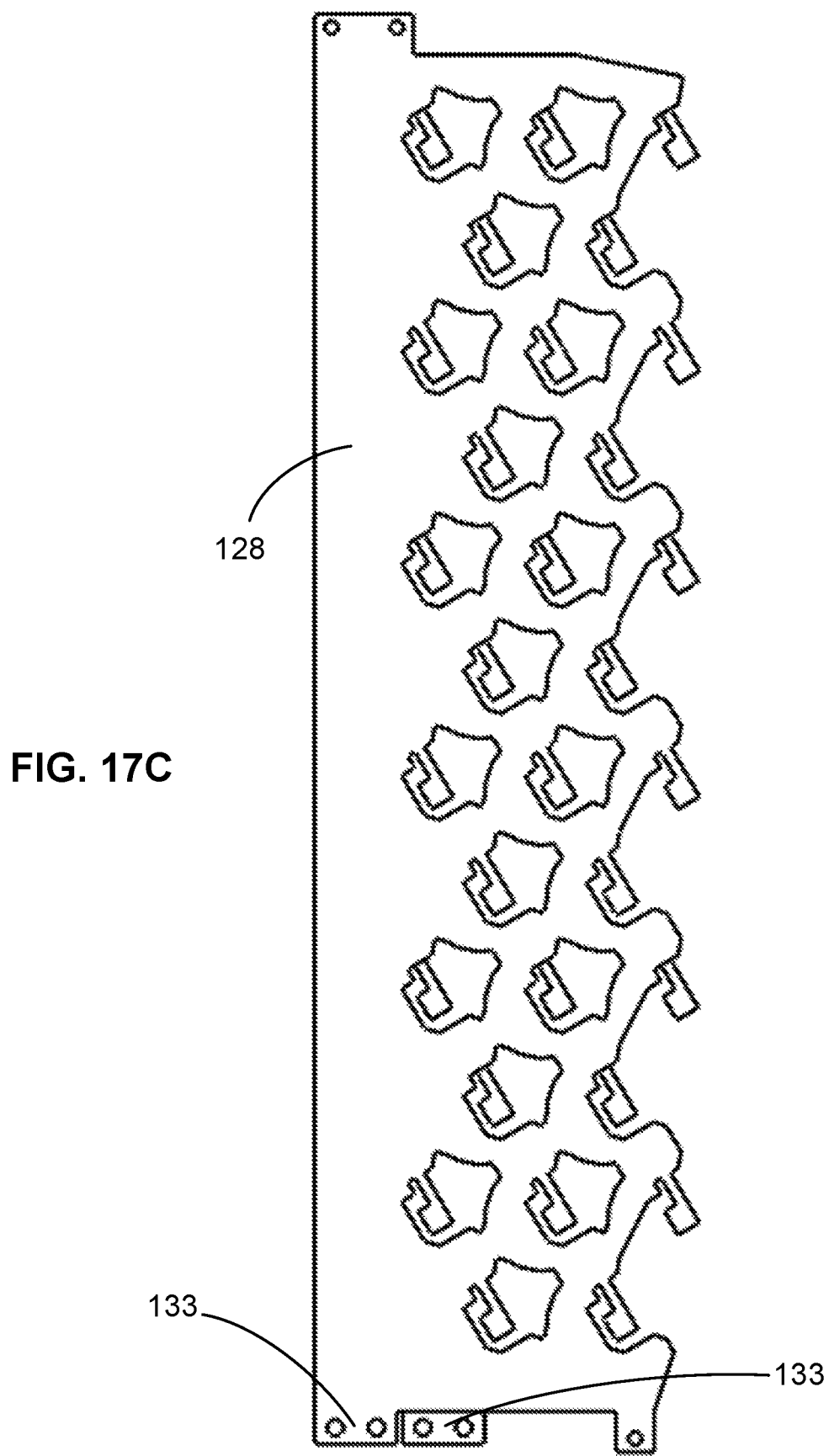
FIG. 17C illustrates the conductive plate of FIG. 17A and the conductive plate of FIG. 17B coupled atop one another to form a positive end of an interconnect assembly, in accordance with an exemplary embodiment.

With reference to FIGS. 17A through 17C, each conductive plate 128 disposed at the most positive end of interconnect assembly 120 is configured with a connective feature 133 for electrically connecting that conductive plate 128 to a load (or a bus bar or other current collecting component). When multiple stacked conductive plates 128 are utilized, the connective feature 133 may be offset from plate to plate, allowing for multiple connection points to the stack as seen in FIG. 17C and thus preventing excessive current from accumulating at any particular connection point.

Figure 17D:
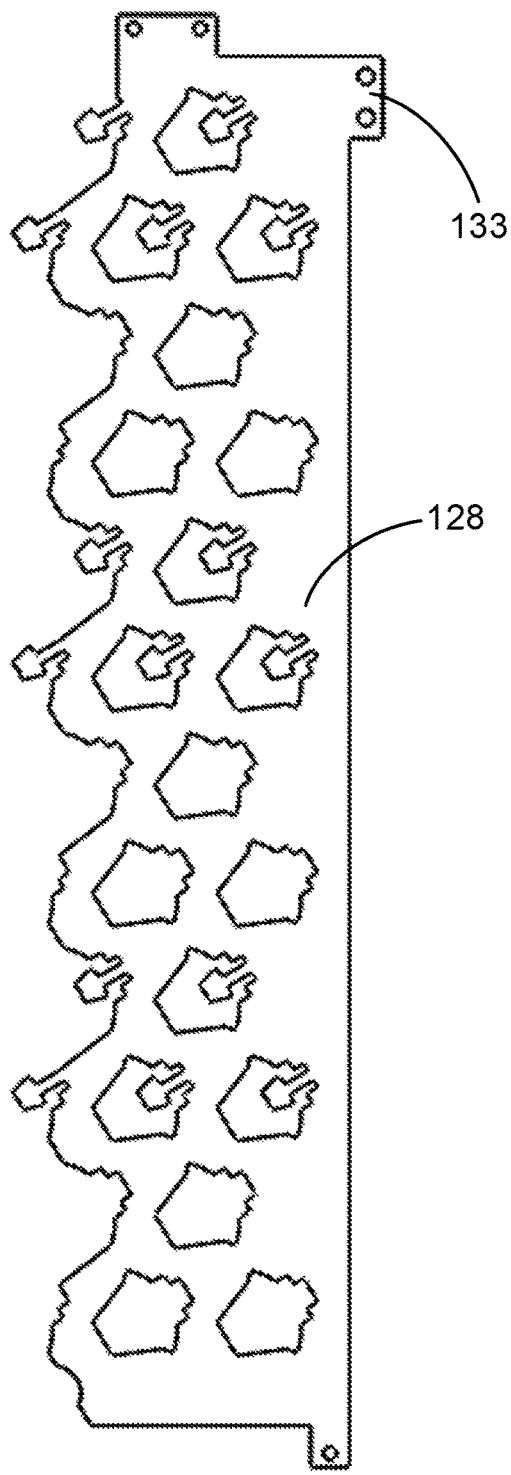
FIG. 17D illustrates a conductive plate in an interconnect assembly configured for use as a negative end of the interconnect assembly, in accordance with an exemplary embodiment.
Figure 17E:
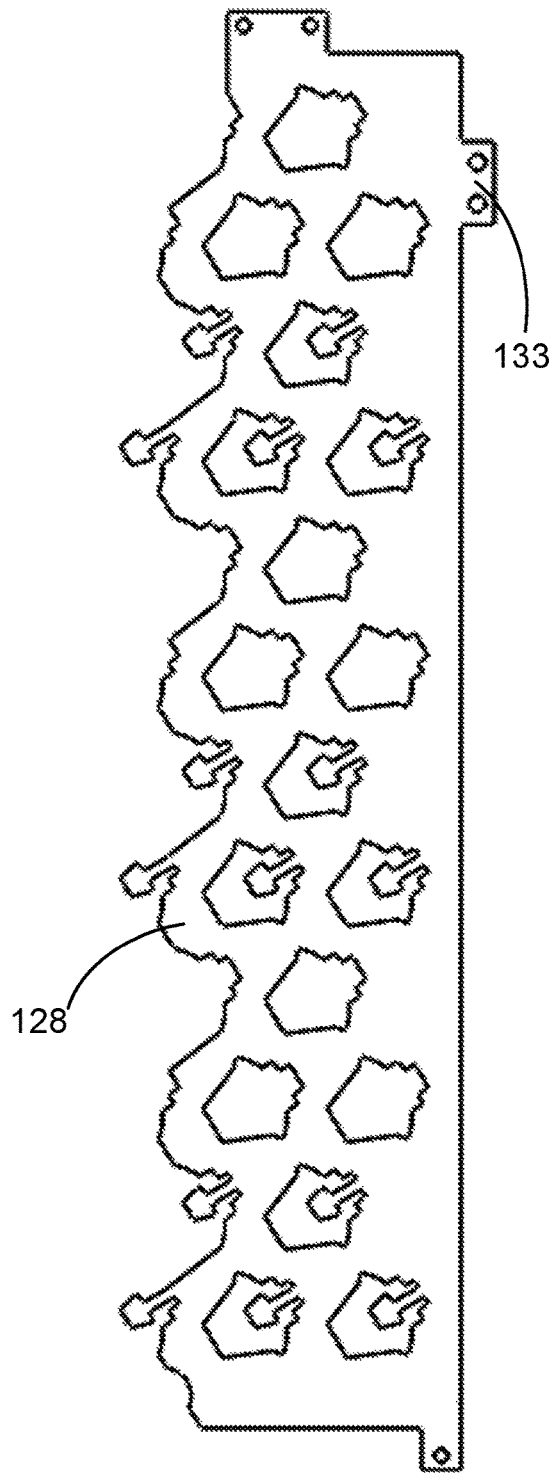
FIG. 17E illustrates a conductive plate in an interconnect assembly configured for use as a negative end of the interconnect assembly and configured to be coupled atop or beneath the conductive plate of FIG. 17D, in accordance with an exemplary embodiment.
Figure 17F:
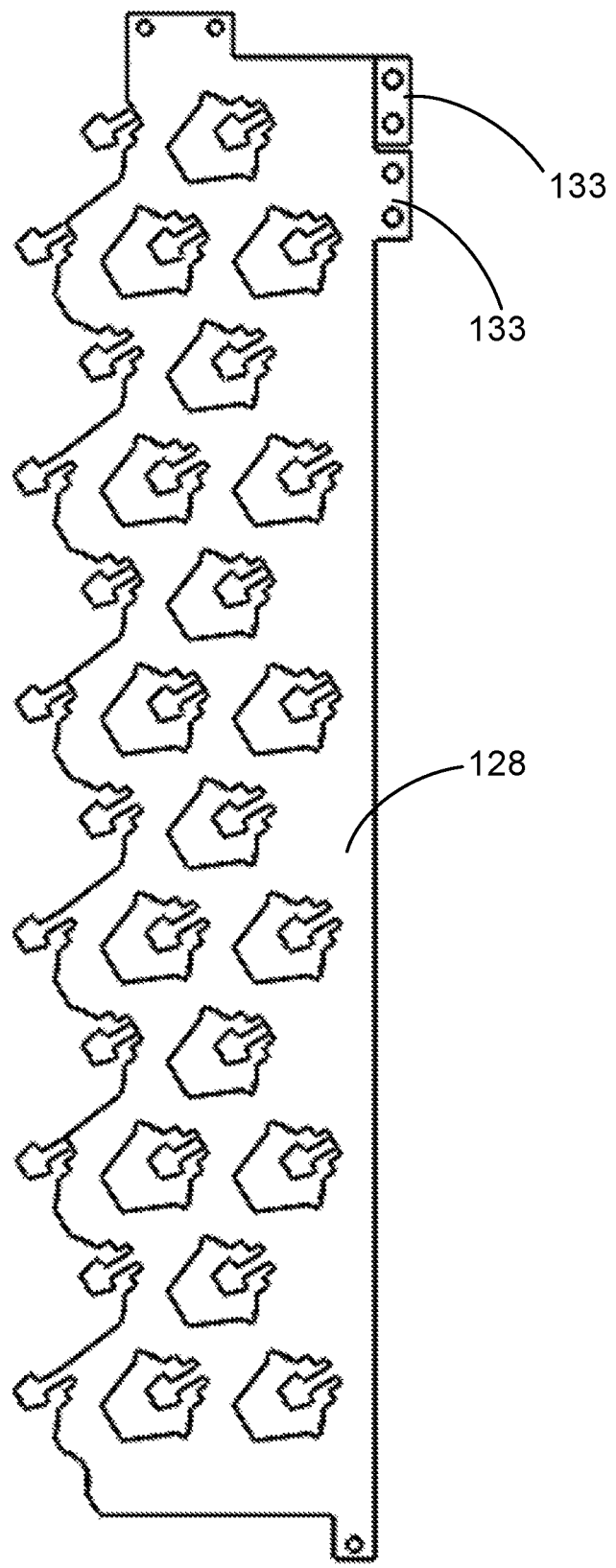
FIG. 17F illustrates the conductive plate of FIG. 17D and the conductive plate of FIG. 17E coupled atop one another to form a negative end of an interconnect assembly, in accordance with an exemplary embodiment.

Likewise, with reference now to FIGS. 17D through 17F, each conductive plate 128 disposed at the most negative end of interconnect assembly 120 is configured with a connective feature 133 for electrically connecting that conductive plate 128 to a load (or a bus bar or other current collecting component). When multiple stacked conductive plates 128 are utilized, the connective feature 133 may be offset from plate to plate, allowing for multiple connection points to the stack as seen in FIG. 17F and thus preventing excessive current from accumulating at any particular connection point.

Returning to FIGS. 17A through 17B, in various exemplary embodiments conductive plates 128 may be configured with assembly, sensing, and/or management features, for example flanges 129, through holes 130, and/or the like. These features may be utilized as desired, for example for handling of conductive plates 128 during assembly, for linking stacks of conductive plates 128 together, and so forth. Through holes 130 disposed in a common position between conductive plates 128 may be utilized for a rivet or other mechanical connection to retain all conductive plates 128 in a stack. Alternatively, conductive plates 128 may be welded, soldered, brazed, or otherwise coupled together. Additionally, flanges 129 may be utilized as electrical connection points for use in connection with cell 211 balancing and battery management system voltage readings.

In various exemplary embodiments, interconnect assembly 120 may be coupled to and/or utilized with other components for control and/or management of a battery pack 110, for example temperature sensors, current sensors, voltage sensors, battery management systems, and/or the like. In this manner, interconnect assembly 120 can facilitate improved performance, operational lifetime, and/or reliability of battery pack 110.

Figure 18A:
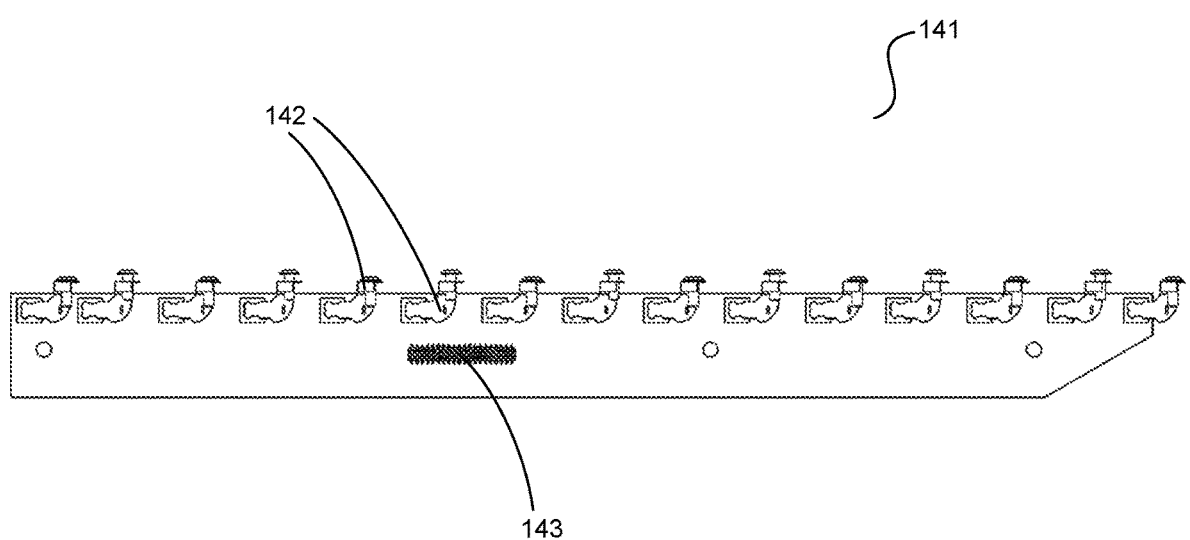
FIGS. 18A and 18B illustrate a voltage sensing board for use in connection with an interconnect assembly, in accordance with an exemplary embodiment.
Figure 18B:
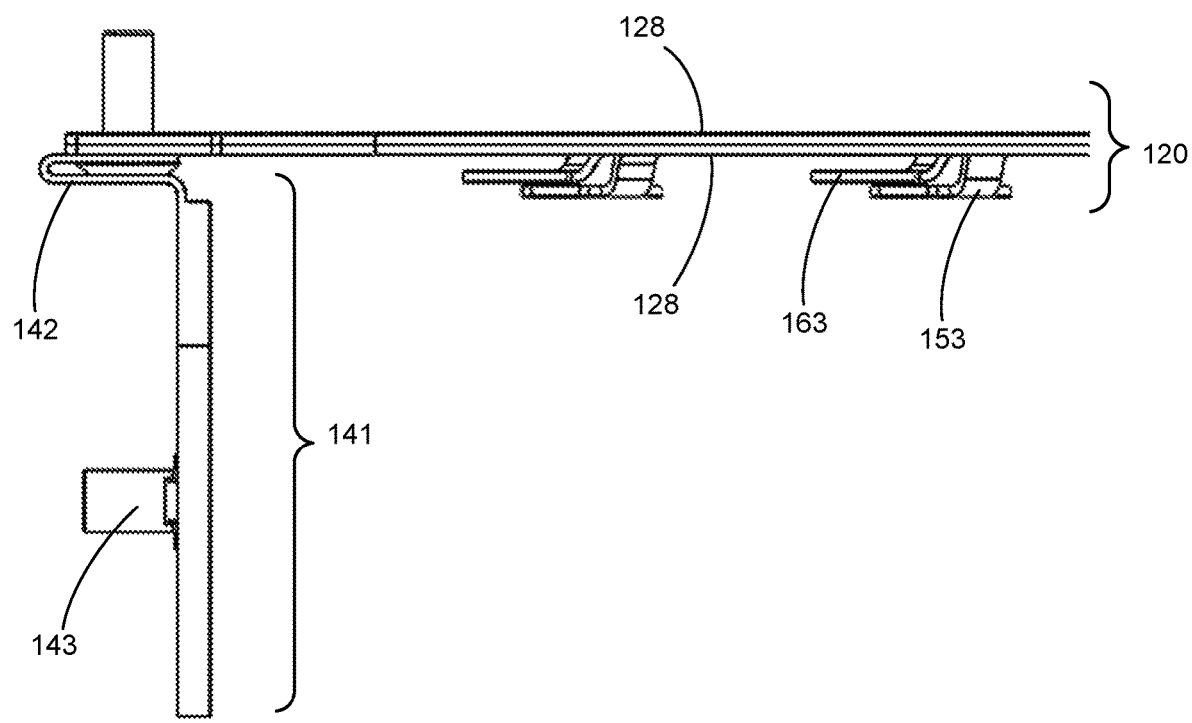

With reference now to FIGS. 18A and 18B, in various exemplary embodiments interconnect assembly 120 may include (and/or be coupled to) a voltage sensing board 141. Voltage sensing board 141 is configured with a number of electrical leads 142, and each lead 142 is intended for coupling to a conductive plate 128 in interconnect assembly 121. Leads 142 may be routed and/or aggregated together in voltage sending board 141, for example into a male/female socket connector 143, in order to facilitate single-cable coupling of voltage sensing board 141 to other control electronics associated with system 100. Voltage sensing board 141 is thus configured to facilitate monitoring (for example, in connection with operation of BMS 140) the voltage of each trace/group of parallel cells 211. In accordance with various example aspects, this approach eliminates use of wiring harnesses. The voltage sensing board 141 may comprise, for example, a printed circuit board with leads 142 for connecting to the conductive plates 128 comprising first and second layers 121, 122. In an example embodiment, voltage sensing board 141 connects (for example, via rivet or nut/bolt) to 4-12 separate conductive plates 128 in the first layer 121. Similarly, voltage sensing board 141 may connect to 4-12 separate conductive plates in the second layer 122. Moreover, any suitable number of connections may be made between locations in interconnect assembly 120 and voltage sensing board 141.

Figure 19A:
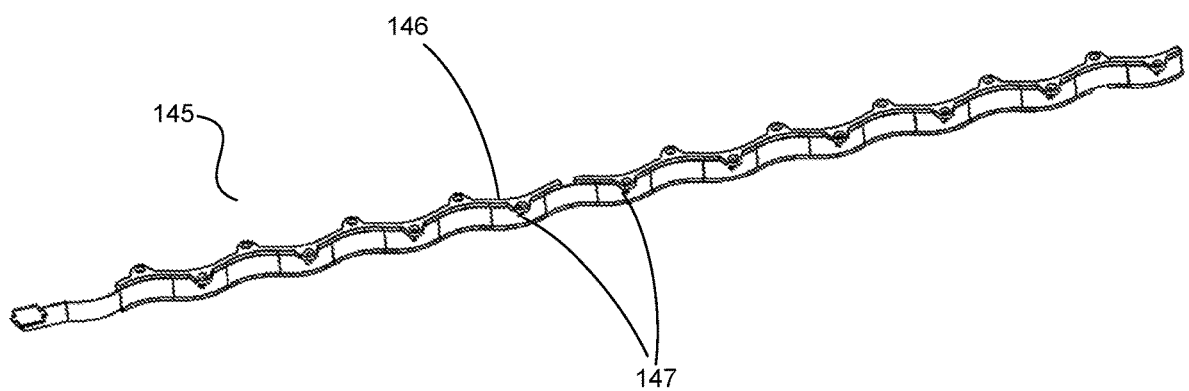
FIGS. 19A and 19B illustrate a temperature sense ribbon for use in connection with battery cells in a battery pack, in accordance with various exemplary embodiments.
Figure 19B:
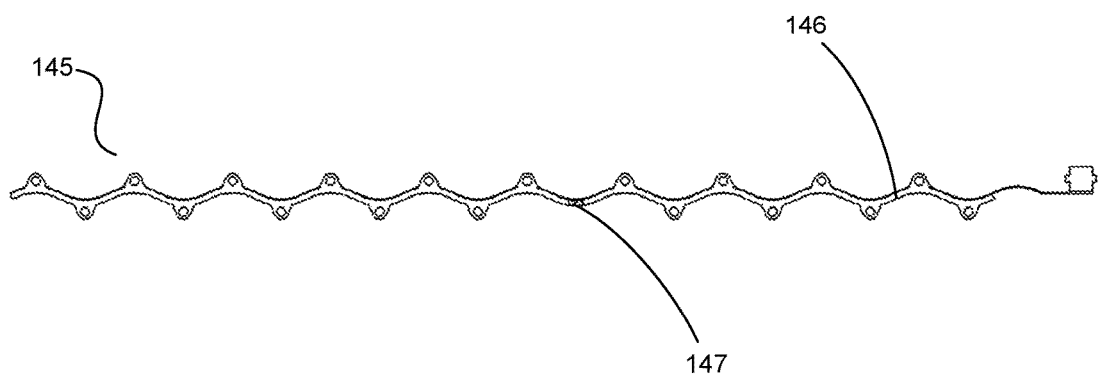

Turning now to FIGS. 19A and 19B, in various exemplary embodiments, interconnect assembly 120 may be coupled to (and/or work in tandem with) a temperature sense ribbon 145 for monitoring the temperature of one or more cells 211 in a battery pack 110. The temperature sense ribbon 145, in an example embodiment, comprises a flexible PCB ribbon having a surface mount thermistor or thermistors 147 thereon. Temperature sense ribbon 145 may further comprise a nonconductive housing 146, for example to facilitate coupling to other components of a battery pack 110. In various exemplary embodiments, temperature sense ribbon 145 extends through and between cells 211, for example in a serpentine manner. Temperature sense ribbon 145 may be configured such that thermistors 147 make contact with associated cells 211 at a level between the top and the bottom of the cells 211 (for example, at a location within +/−20% of the halfway point of the cell 211 height). By locating thermistors 147 in these positions, temperature sense ribbon 145 is able to provide an improved measurement of the temperature of cells 211, particularly in instances where cells 211 are cooled primarily from one end and thus experience a temperature gradient along the height of the cells 211.

Use of temperature sense ribbon 145 provides the capability to measure the temperature of cells 211 throughout the cell 211 structure comprising battery pack 110. In particular, temperature sense ribbon 145 provides the capability to sense the temperature of middle/interior cells 211 in battery pack 110. Moreover, temperature sense ribbon 145 facilitates measuring the temperature of individual cells 211, or at least a small number of cells 211 in a particular location of battery pack 110, as opposed to measuring the average temperature of all of the cells 211 comprising battery pack 110.

In various exemplary embodiments, when constructing battery pack 110, temperature sense ribbons 145 may first be placed a and/or positioned, and thereafter cells 211 may be placed into battery pack 110. In this manner, automated assembly of battery pack 110 is facilitated, as thermistors 147 are thus pre-placed with respect to corresponding cells 211 rather than needing to be separately placed and/or coupled thereto. Alternatively, temperature sense ribbons 145 may be inserted after cells 211 are positioned in battery pack 110.

In accordance with principles of the present disclosure, an exemplary electrical system 100 (and/or battery pack 110 and/or interconnect assembly 120) may desirably be utilized in connection with an electric vehicle or item of mobile industrial equipment, for example an automobile, tractor, truck, trolley, train, van, quad, golf cart, scooter, boat, airplane, drone, forklift, telehandler, backhoe, and/or the like. In an example embodiment, interconnect assembly 120 replaces wire harnesses, and increases the reliability and speed of assembly for connecting a battery pack with hundreds of cells into an electrical system 100.

Principles of the present disclosure may be combined with principles of thermal management of battery systems, for example as disclosed in U.S. patent application Ser. No. 15/815,975 entitled "SYSTEMS AND METHODS FOR BATTERY THERMAL MANAGEMENT UTILIZING A VAPOR CHAMBER" and filed on Nov. 17, 2017, the entire contents of which are hereby incorporated by reference for all purposes.

In an exemplary embodiment, an electrical system comprises: an interconnect assembly comprising a first plate and a second plate, wherein the first plate comprises a first plate segment and a second plate segment, and wherein the second plate comprises a third plate segment and a fourth plate segment; and a battery pack comprising a plurality of cells comprising a first group of cells, a second group of cells, and a third group of cells, wherein the interconnect assembly is connected to a top portion of the plurality of cells, wherein each cell of the plurality of cells comprises a first terminal of a first polarity and a second terminal of a second polarity.

In an exemplary embodiment, a battery interconnect assembly for electrically connecting a plurality of cells of a battery pack comprises: a first plate comprising: a first window; a first tab associated with the first window, the first tab configured to connect the first plate to a first terminal of a cell of the plurality of cells of the battery pack; and a second plate parallel to and at least partially overlapping the first plate, the second plate comprising: a second window aligned with the first window, wherein the first tab extends through the second window; a second tab associated with the second window, the second tab configured to connect the second plate to a second terminal of the cell; wherein the first plate is physically separated from the second plate, wherein the first plate is electrically connected to the second plate through the cell, wherein the first terminal has a first polarity, and wherein the second terminal has a second polarity. the first plate may comprise: a first current carrying plate; and a first interconnect plate electrically connected to the first current carrying plate along a first side of the first current carrying plate, wherein the first tab is a portion of the first interconnect plate; and the second plate comprises: a second current carrying plate; and a second interconnect plate electrically connected to the second current carrying plate along a first side of the second current carrying plate, wherein the second tab is a portion of the second interconnect plate. The first current carrying plate may be thicker than the first interconnect plate; and the second current carrying plate may be thicker than the second interconnect plate. The first current carrying plate may comprise a first conductive material, the first interconnect plate may comprise a second conductive material the second current carrying plate may comprise a third conductive material, and the second interconnect plate may comprises a fourth conductive material.

The interconnect assembly may further comprise an overmold material, wherein the overmold material forms a package assembly holding the first plate and the second plate in fixed location relative to each other, wherein the overmold material is electrically non-conductive, and wherein the overmold material forms an overall shape of the interconnect assembly, including the first window, the second window, the third window, and the fourth window. The overmold material may comprise an opening that is shaped to conform to a shape of a top portion of the cell for receiving and holding the cell in a fixed position relative to the first plate and the second plate. The cell may be a cylindrical cell, and the overmold material may comprise a circular opening for receiving a top portion of the cylindrical cell, and the circular opening may be aligned with the first and second tabs. The battery interconnect assembly may further comprise a retaining structure formed of the overmold material and comprising a plurality of post structures for holding the cell in a fixed position relative to the battery interconnect assembly. The battery interconnect assembly may further comprise a sensing layer overmolded in the battery interconnect assembly, the sensing layer comprising a trace for communicating sensed signals to a communications connector, wherein the sensed signals represent at least one of a sensed voltage associated with the battery pack attached to the battery interconnect assembly, and a temperature associated with a thermistor sensing the temperature at a location in the battery pack.

An exemplary embodiment comprises an electronic system comprising a battery interconnect assembly as disclosed above, the electronic system further comprising: a first group of cells and a second group of cells, each having each having a first polarity terminal and a second polarity terminal; wherein the first plate comprises a first segment and a second segment; wherein the second plate comprises a third segment and a fourth segment; wherein the first segment is electrically connected to the third segment through the first group of cells; wherein the first segment is connected to the first polarity terminals of the first group of cells; wherein the third segment is connected to the second polarity terminals of the first group of cells; wherein the third segment is electrically connected to the second segment through the second group of cells; wherein the third segment is connected to the first polarity terminals of the second group of cells; and wherein the second segment is connected to the second polarity terminals of the second group of cells.

In the battery interconnect assembly, the first plate may comprise a first segment and a second segment, and the second plate may comprise a third segment and a fourth segment; the third segment aligns with the first segment and a portion of the second segment, and the second segment aligns with a portion of the third segment and a portion of the fourth segment. In the battery interconnect assembly, the first plate comprises a first segment and a second segment, and the second plate comprises a third segment and a fourth segment; the third segment aligns with the first segment and a portion of the second segment, and the second segment aligns with a portion of the third segment and a portion of the fourth segment; the first segment and a portion of the third segment, when connected to the battery pack, are configured to align with a first group of cells, the first segment is configured to connect to terminals of the first polarity of the first group of cells, and a portion of the third segment is configured to connect to terminals of a second polarity of the first group of cells; and a portion of the second segment and a portion of the third segment, when connected to the battery pack, are configured to align with a second group of cells, a portion of the second segment is configured to connect to terminals of the second polarity of the first group of cells, and a portion of the third segment is configured to connect to terminals of the first polarity of the first group of cells. In the battery interconnect assembly, the first plate comprises a first segment and a second segment, the second plate comprises a third segment and a fourth segment, and an electrical flow path from the most negative to most positive proceeds from first segment to third segment, from third segment to second segment, and from second segment to fourth segment through various attached cells. The first tab may comprise a fuse structure isolating the cell, from the rest of the plurality of cells, in the event that current through the first tab exceeds a threshold for a predetermined amount of time. The battery interconnect assembly may further comprise a negative power connection point and a positive power connection point that are located on the same end of the battery interconnect assembly. The battery interconnect assembly may further comprise a negative power connection point and a positive power connection point that are located on the battery interconnect assembly.

In an exemplary embodiment, an interconnect assembly for electrically connecting a plurality of cells of a battery pack comprises: a first plate comprising: a first window; a first tab associated with the first window, the first tab configured to connect the first plate to a first terminal of a cell of the plurality of cells of the battery pack; a second window; and a second plate parallel to and at least partially overlapping the first plate, the second plate comprising: a third window aligned with the first window, wherein the first tab extends through the third window; a fourth window aligned with the second window; and a second tab associated with the fourth window, the second tab configured to connect the second plate to a second terminal of the cell. The overmold material comprises an opening that is shaped to conform to the shape of a top portion of the cell for receiving and holding the cell in a fixed position relative to the first plate and the second plate.

In another exemplary embodiment, an electrical system comprises: an interconnect assembly comprising a first plate and a second plate that is stacked on the first plate, wherein the first plate and the second plate comprise weld tabs; and a battery pack comprising a plurality of cells comprising a first group of cells, a second group of cells, and a third group of cells, wherein the interconnect assembly is connected to a top portion of the plurality of cells, wherein each cell of the plurality of cells comprises a first terminal of a first polarity and a second terminal of a second polarity; and wherein the weld tabs on the interconnect assembly serve as the only mechanical connection from the interconnect assembly to the battery pack; and wherein the interconnect assembly is a floating interconnect assembly.

Another exemplary embodiment comprises an interconnect assembly for electrically connecting a plurality of cells of a battery pack, the plurality of cells comprising a first group of cells, a second group of cells, and a third group of cells, the interconnect assembly comprising: a first plate; and a second plate; wherein the first plate forms a series connection between the first group of cells and the second group of cells; wherein the second plate forms a series connection between the second group of cells and the third group of cells; and wherein the first plate and the second plate are electrically connected to the plurality of cells via tabs extending into windows in the respective plates. The first plate may further comprise a first tab, and further comprise a vision window, wherein the vision window is shaped to include a positive terminal tab and a negative terminal tab, in addition to exposing a portion of the shoulder of a cell of one of the first group of cells. The first plate may be formed from a stack of plates, and wherein each plate in the stack is configured to individually carry a portion of the total current flowing through the first plate. Each plate of the stacked plates may comprise positive tabs and/or negative tabs; wherein the tabs from each plate extend out of the plane of the first plate towards respective cells of the first group of cells or the second group of cells. The interconnect assembly may only be supported or connected to components (other than via the weld tabs) via sensor wires, power connections, and other data communication connections. The interconnect assembly may be a floating interconnect assembly. The battery pack may comprise a temperature sense ribbon comprising a ribbon with surface mount thermistors, wherein the temperature sense ribbon extends through and between cells, of at least one of the first group of cells, the second group of cells, and the third group of cells, at a level between the top and the bottom of the cells, and passes alongside more than two cells, of at least one of the first group of cells, the second group of cells, and the third group of cells; and wherein the temperature sense ribbon is configured to sense the temperature of middle cells in the battery pack.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, a thermal connection, and/or any other connection. When language similar to "at least one of A, B, or C" or "at least one of A, B, and C" is used in the specification or claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A battery interconnect assembly for electrically connecting a plurality of cells of a battery pack, the battery interconnect assembly comprising:
    a first layer comprising:
        a first current carrying plate having a first thickness,
        a first window, and
        a first interconnect plate having a second thickness, the first interconnect plate electrically connected to the first current carrying plate, the first interconnect plate comprising a first tab configured to couple to a cell in the plurality of cells, the first thickness being greater than the second thickness; and
    a second layer comprising:
        a second current carrying plate having a third thickness,
        a second window, and
        a second interconnect plate having a fourth thickness, the second interconnect plate electrically connected to the second current carrying plate, the second interconnect plate comprising a second tab configured to couple to the cell in the plurality of cells, the third thickness being greater than the fourth thickness,
        wherein the first window is aligned with the second window, and
        wherein a first shape of the first window and a second shape of the second window are different.

2. The battery interconnect assembly of claim 1, wherein: the first thickness is between 0.3 mm and 2 mm, and the second thickness is between 0.05 mm and 0.3 mm.

3. The battery interconnect assembly of claim 1, wherein: the first current carrying plate comprises a first conductive material,
the first interconnect plate comprises a second conductive material, and
the second conductive material is different than the first conductive material.

4. The battery interconnect assembly of claim 1, wherein: the first current carrying plate is configured for bulk transmission of electrical current, and
the first interconnect plate is configured to be electrically coupled to the plurality of cells.

5. The battery interconnect assembly of claim 1, wherein: the first thickness and the third thickness are each between 0.3 mm and 2 mm, and
the second thickness and the fourth thickness are each between 0.05 mm and 0.3 mm.

6. The battery interconnect assembly of claim 1, wherein: the first tab is configured to connect the first interconnect plate to a first terminal of the cell, and
the second tab is configured to connect the second interconnect plate to a second terminal of the cell.

7. The battery interconnect assembly of claim 1, wherein a first hole disposed in the first tab causes the first tab to operate as a fuse structure isolating the cell, from a remainder of the plurality of cells, in response to current through the first tab exceeding a threshold for a predetermined amount of time.

8. The battery interconnect assembly of claim 1, wherein the first tab comprises a first narrow neck having a lower cross-sectional area than any other portion of the first tab.

9. The battery pack including the plurality of cells and the battery interconnect assembly of claim 1.

10. A method of manufacturing a battery interconnect assembly, the method comprising:
    forming a first current carrying plate having a first thickness;
    forming a first interconnect plate having a second thickness, the first interconnect plate comprising a first tab, the second thickness being less than the first thickness;
    coupling the first current carrying plate to the first interconnect plate;
    coupling the first tab to a first terminal of a first cell in a plurality of cells in a battery pack;
    forming a second current carrying plate having a third thickness;
    forming a second interconnect plate having a fourth thickness, the second interconnect plate comprising a second tab, the fourth thickness being less than the third thickness;
    coupling the second current carrying plate to the second interconnect plate;
    coupling the second tab to a second terminal of the first cell in the plurality of cells in the battery pack; and
    disposing the second tab through a first window of the first current carrying plate prior to coupling the second tab to the second terminal.

11. The method of claim 10, wherein:
the first thickness is between 0.3 mm and 2 mm, and
the second thickness is between 0.05 mm and 0.3 mm.

12. The method of claim 10, wherein:
the first current carrying plate comprises a first conductive material,
the first interconnect plate comprises a second conductive material, and
the second conductive material is different than the first conductive material.

13. The method of claim 10, wherein coupling the first current carrying plate to the first interconnect plate further comprises physically and electrically coupling the first current carrying plate to the first interconnect plate.

14. The method of claim 10, wherein the second current carrying plate comprises a second window having a different shape relative to the first window of the first current carrying plate.

\* \* \* \* \*